US011128276B2

(12) United States Patent
Tsukamoto et al.

(10) Patent No.: US 11,128,276 B2
(45) Date of Patent: Sep. 21, 2021

(54) NOISE FILTER AND WIRE HARNESS

(71) Applicant: Yazaki Corporation, Tokyo (JP)

(72) Inventors: Masashi Tsukamoto, Shizuoka (JP); Kunihiko Yamada, Shizuoka (JP); Ryoma Toyoda, Shizuoka (JP); Keigo Tsubo, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 97 days.

(21) Appl. No.: 16/460,390

(22) Filed: Jul. 2, 2019

(65) Prior Publication Data
US 2020/0014356 A1 Jan. 9, 2020

(30) Foreign Application Priority Data

Jul. 4, 2018 (JP) .............................. JP2018-127817
Sep. 19, 2018 (JP) .............................. JP2018-175136

(51) Int. Cl.
  *H03H 1/00* (2006.01)
  *H03H 7/00* (2006.01)
  *B60R 16/02* (2006.01)
  *H01F 27/33* (2006.01)
  *H03H 7/09* (2006.01)
  *H03H 7/01* (2006.01)

(52) U.S. Cl.
  CPC ....... *H03H 1/0007* (2013.01); *B60R 16/0207* (2013.01); *H01F 27/33* (2013.01); *H03H 7/0115* (2013.01); *H03H 7/09* (2013.01)

(58) Field of Classification Search
  CPC ......................... H03H 1/0007; H03H 7/0115

USPC .................................................. 333/181, 185
See application file for complete search history.

(56) References Cited

U.S. PATENT DOCUMENTS

2002/0151214 A1  10/2002  Hayashi
2016/0126919 A1*  5/2016  Tsubaki .............. H03H 7/0115
                                                     333/181
2019/0089322 A1*  3/2019  Aizawa ................... H01F 27/28

FOREIGN PATENT DOCUMENTS

JP  2001-088629 A  4/2001
JP  2006-100061 A  4/2006
JP  2012-039201 A  2/2012
JP  2016-208487 A  12/2016

* cited by examiner

Primary Examiner — Rakesh B Patel
(74) Attorney, Agent, or Firm — Sughrue Mion, PLLC

(57) ABSTRACT

A noise filter includes a filter circuit including a noise reduction element that reduces a noise component, a conductive first circuit connection member to which a first connection portion of the noise reduction element is electrically connected, and a conductive second circuit connection member to which a second connection portion of the noise reduction element is electrically connected, a first electric connection structure that electrically connects an intermediate connection portion of a core wire of a first electric wire to the first circuit connection member, and a second electric connection structure that electrically connects an intermediate connection portion of a core wire of a second electric wire whose one end is grounded, to the second circuit connection member.

7 Claims, 36 Drawing Sheets

FIG.8
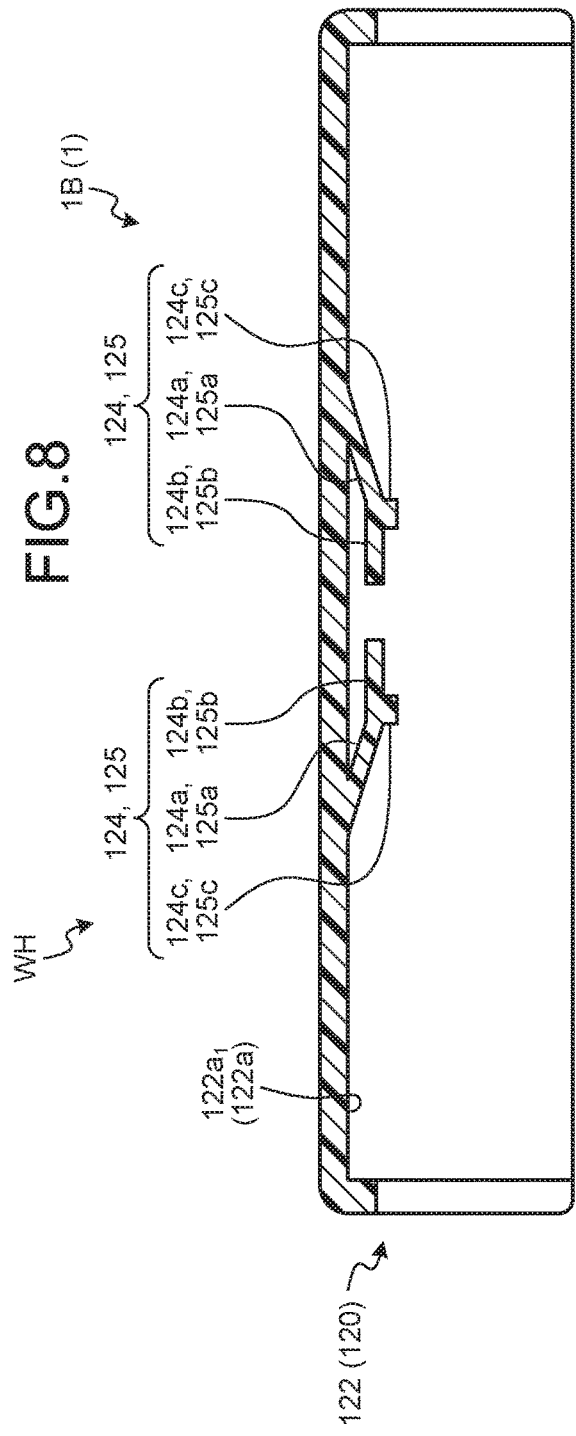
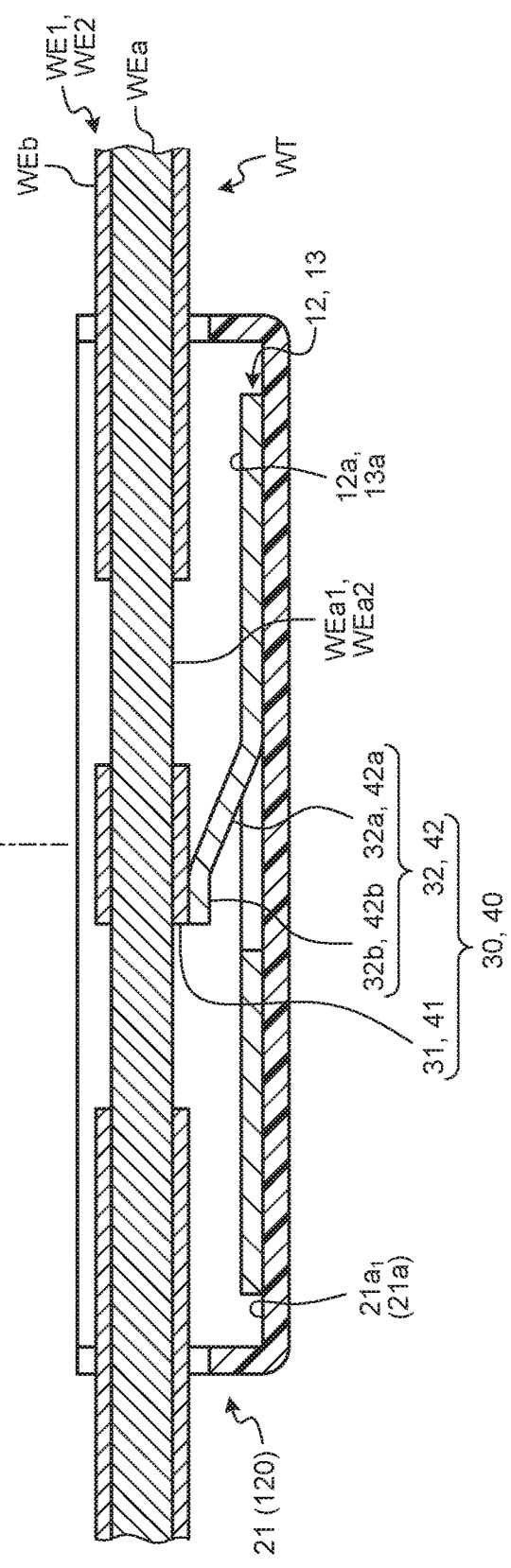

FIG.14
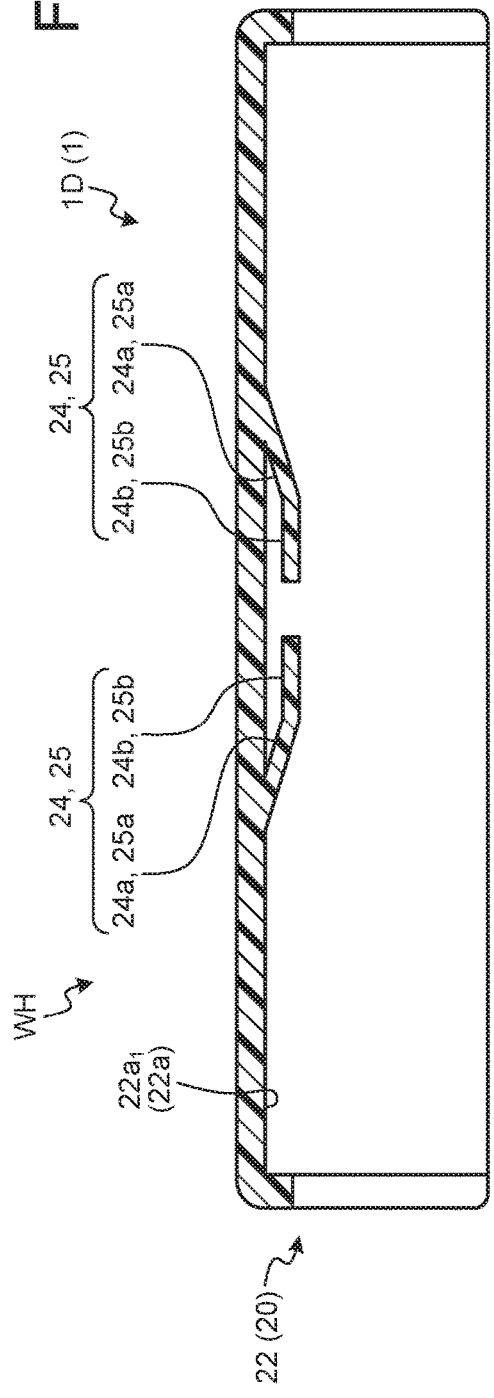
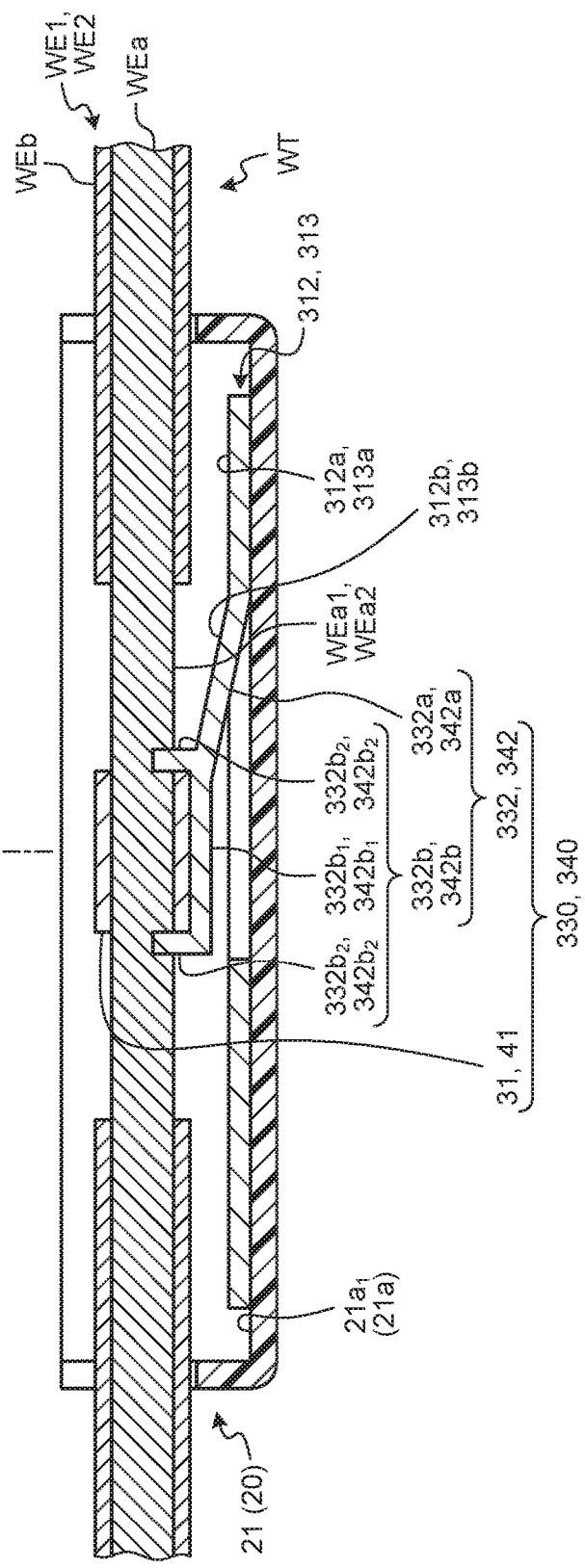

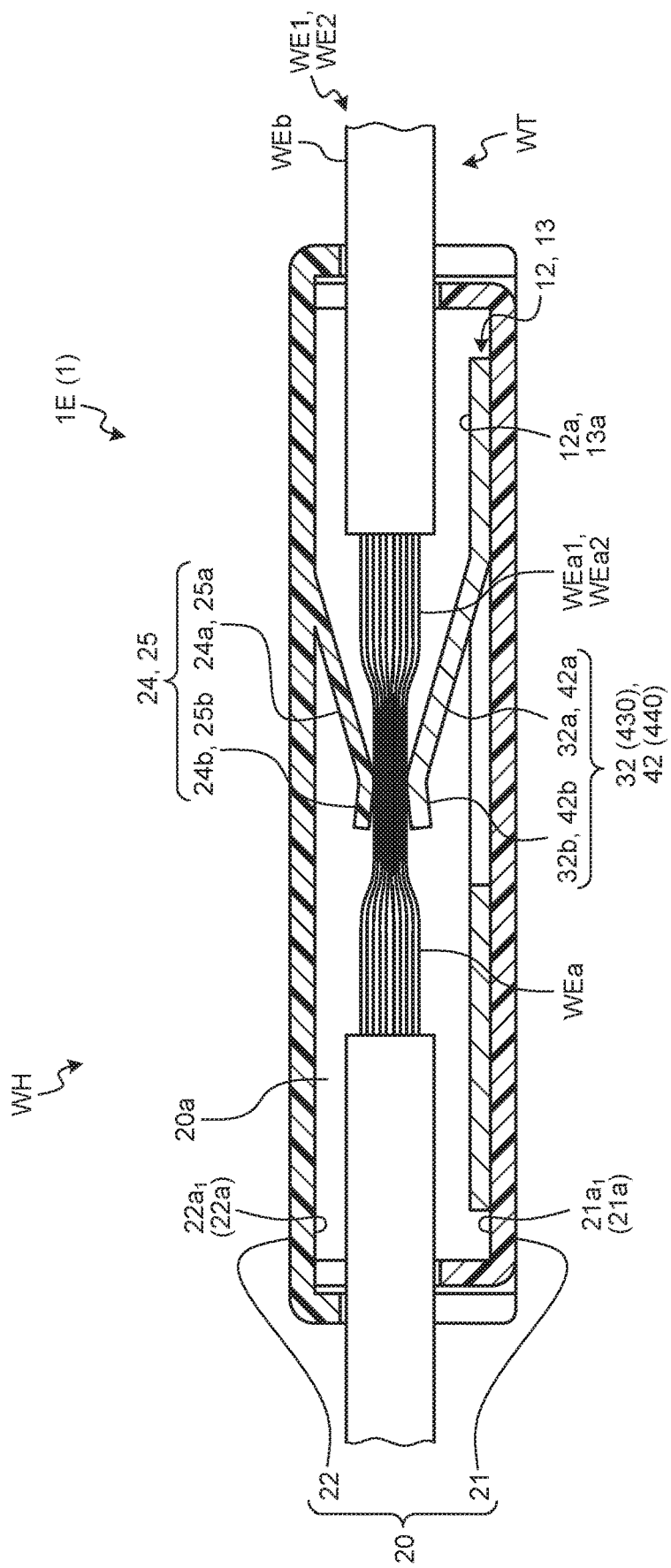

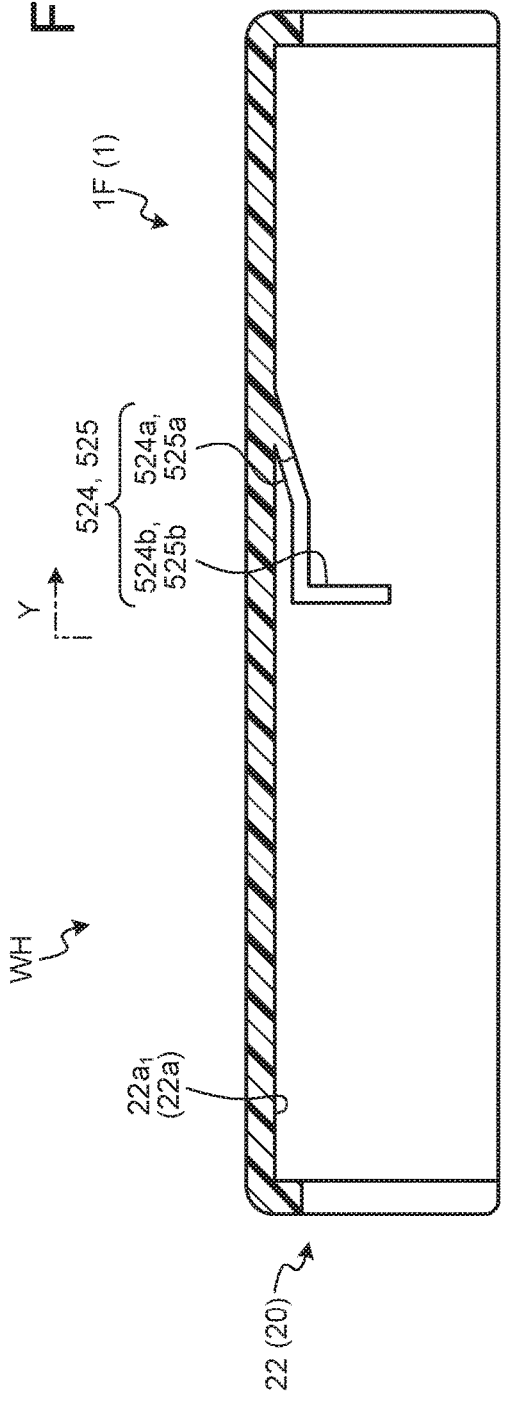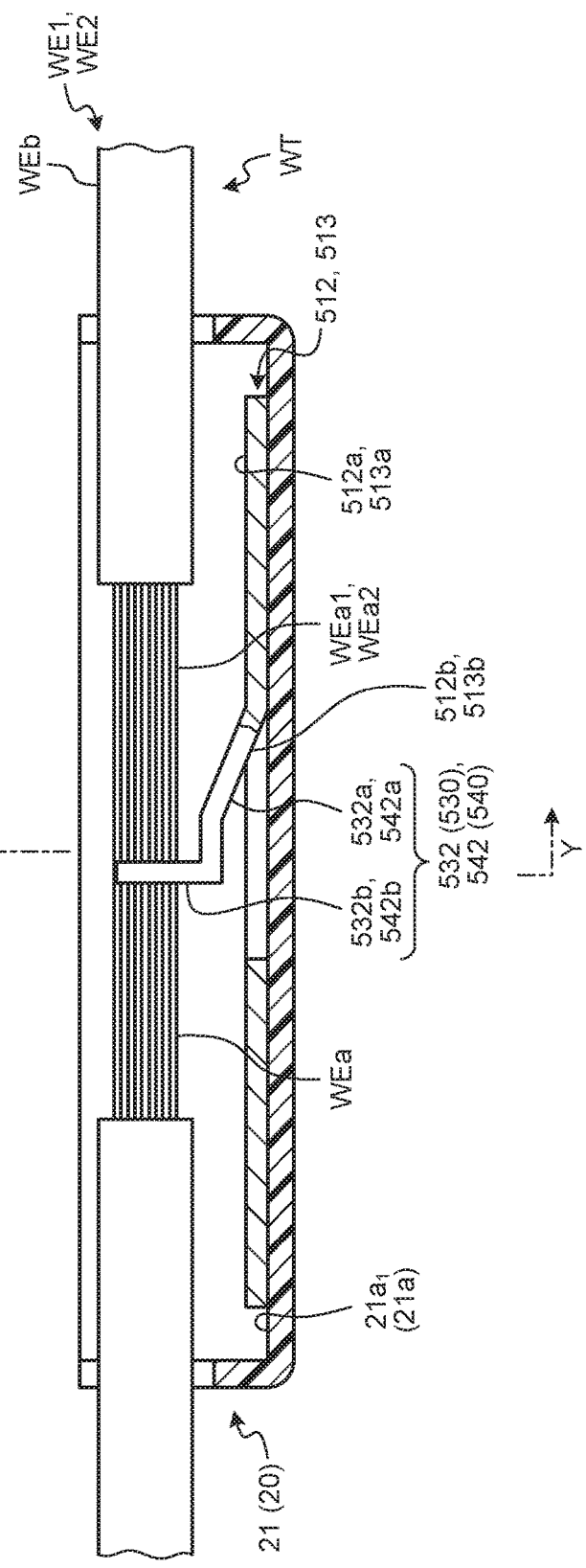

NOISE FILTER AND WIRE HARNESS

CROSS-REFERENCE TO RELATED APPLICATION(S)

The present application claims priority to and incorporates by reference the entire contents of Japanese Patent Application No. 2018-127817 filed in Japan on Jul. 4, 2018 and Japanese Patent Application No. 2018-175136 filed in Japan on Sep. 19, 2018.

BACKGROUND OF THE INVENTION

1. Field of the Invention

The present invention relates to a noise filter and a wire harness.

2. Description of the Related Art

Conventionally, there has been a known technology for placing a noise filter on a noise reduction target electric wire to reduce electric noise on the electric wire. The noise filter includes a filter circuit provided with a noise reduction element such as a capacitor, and the filter circuit is interposed between the noise reduction target electric wire and a ground terminal. This type of noise filter is disclosed in, for example, Japanese Patent Application Laid-open No. 2006-100061 and Japanese Patent Application Laid-open No. 2012-039201.

Incidentally, the conventional noise filter connects the noise reduction target electric wire and the filter circuit using another intermediate electric wire. For example, in the noise filter of Japanese Patent Application Laid-open No. 2006-100061 described above, the filter circuit is electrically connected to two branched electric wires branched from the noise reduction target electric wire corresponding to a trunk line to reduce a noise component on the noise reduction target electric wire. For this reason, the conventional noise filter needs to adjust a filter circuit characteristics (resonance point, noise reduction performance, etc.) taking the noise component on the intermediate electric wire such as the branched electric wires into consideration.

SUMMARY OF THE INVENTION

An object of the invention is to provide a noise filter and a wire harness which are not affected by an intermediate electric wire.

In order to achieve the above mentioned object, a noise filter according to one aspect of the present invention includes a filter circuit including a noise reduction element that reduces a noise component, a conductive first circuit connection member to which a first connection portion of the noise reduction element is electrically connected, and a conductive second circuit connection member to which a second connection portion of the noise reduction element is electrically connected; a first electric connection structure that electrically connects an intermediate connection portion of a core wire of a first electric wire to the first circuit connection member; and a second electric connection structure that electrically connects an intermediate connection portion of a core wire of a second electric wire whose one end is grounded, to the second circuit connection member.

According to another aspect of the present invention, in the noise filter, it is desirable that the first electric connection structure includes a first electric wire side connection body physically and electrically connected to the intermediate connection portion of the core wire of the first electric wire, and a first circuit side connection body physically and electrically connected to the first electric wire side connection body and the first circuit connection member, and the second electric connection structure includes a second electric wire side connection body physically and electrically connected to the intermediate connection portion of the core wire of the second electric wire, and a second circuit side connection body physically and electrically connected to the second electric wire side connection body and the second circuit connection member.

According to still another aspect of the present invention, in the noise filter, it is desirable that the first electric connection structure includes a first circuit side connection body provided in the first circuit connection member and indirectly or directly electrically connected to the intermediate connection portion of the core wire of the first electric wire, and the second electric connection structure includes a second circuit side connection body provided in the second circuit connection member and indirectly or directly electrically connected to the intermediate connection portion of the core wire of the second electric wire.

According to still another aspect of the present invention, in the noise filter, it is desirable that the first electric connection structure is a first electric connection member including a first electric wire side connection portion physically and electrically connected to the intermediate connection portion of the core wire of the first electric wire, and a first circuit side connection portion physically and electrically connected to the first circuit connection member, and the second electric connection structure is a second electric connection member including a second electric wire side connection portion physically and electrically connected to the intermediate connection portion of the core wire of the second electric wire, and a second circuit side connection portion physically and electrically connected to the second circuit connection member.

According to still another aspect of the present invention, in the noise filter, it is desirable that the first electric connection structure includes a first electric wire side connection body and a first circuit side connection body electrically connected to each other by being inserted and fit along an axial direction of the first electric wire and the second electric wire run parallel to each other, the first electric wire side connection body is physically and electrically connected to the intermediate connection portion of the core wire of the first electric wire, the first circuit side connection body is provided in the first circuit connection member, the second electric connection structure includes a second electric wire side connection body and a second circuit side connection body electrically connected to each other by being inserted and fit along the axial direction of the first electric wire and the second electric wire run parallel to each other, the second electric wire side connection body is physically and electrically connected to the intermediate connection portion of the core wire of the second electric wire, and the second circuit side connection body is provided in the second circuit connection member.

According to still another aspect of the present invention, in the noise filter, it is desirable to further include a housing in which the filter circuit, the first electric connection structure, the second electric connection structure, the intermediate connection portion of the core wire of the first electric wire, and the intermediate connection portion of the core wire of the second electric wire are accommodated in an inner accommodation chamber, and an end side of each of the first electric wire and the second electric wire run parallel to each other in the accommodation chamber is drawn out to an outside of the accommodation chamber, wherein the housing includes a first protruding holding body that is a protruding body protruding in a first protruding direction corresponding to one direction in the axial direction of the first electric wire and the second electric wire outside the accommodation chamber and is used to hold the housing on a trunk line including the first electric wire and the second electric wire by collectively winding a first tape around the trunk line, and a second protruding holding body that is a protruding body protruding in a second protruding direction corresponding to the other direction in the axial direction of the first electric wire and the second electric wire outside the accommodation chamber and is used to hold the housing on the trunk line by collectively winding a second tape around the trunk line, the first protruding holding body includes a facing portion disposed to face a first branch portion of each of the first electric wire and the second electric wire branching from the trunk line at one end side of each of the first electric wire and the second electric wire drawn out to the outside of the accommodation chamber in the first protruding direction, and a tape sticking portion on which the first tape is stuck on an opposite side from each first branch portion, and the second protruding holding body includes a facing portion disposed to face a second branch portion of each of the first electric wire and the second electric wire branching from the trunk line at the other end side of each of the first electric wire and the second electric wire drawn out to the outside of the accommodation chamber in the second protruding direction, and a tape sticking portion on which the second tape is stuck on an opposite side from each second branch portion.

According to still another aspect of the present invention, in the noise filter, it is desirable to further include a housing in which the filter circuit, the first electric connection structure, the second electric connection structure, the intermediate connection portion of the core wire of the first electric wire, and the intermediate connection portion of the core wire of the second electric wire are accommodated in an inner accommodation chamber, and an end side of each of the first electric wire and the second electric wire run parallel to each other in the accommodation chamber is drawn out to an outside of the accommodation chamber, wherein the housing has a band clamp structure that holds the housing by winding the housing around a trunk line including the first electric wire and the second electric wire.

In order to achieve the above mentioned object, a wire harness according to still another aspect of the present invention includes a trunk line including a first electric wire and a second electric wire; and a noise filter that reduces a noise component, wherein the noise filter includes a filter circuit including a noise reduction element that reduces a noise component, a conductive first circuit connection member to which a first connection portion of the noise reduction element is electrically connected, and a conductive second circuit connection member to which a second connection portion of the noise reduction element is electrically connected, a first electric connection structure that electrically connects an intermediate connection portion of a core wire of the first electric wire to the first circuit connection member, and a second electric connection structure that electrically connects an intermediate connection portion of a core wire of the second electric wire whose one end is grounded, to the second circuit connection member.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 8 is an exploded perspective view illustrating a first modification of the noise filter and the wire harness of the embodiment;

FIG. 14 is a perspective view illustrating a fourth modification of the noise filter and the wire harness of the embodiment;

FIG. 16 is a perspective view illustrating a fifth modification of the noise filter and the wire harness of the embodiment;

FIG. 17 is an exploded perspective view illustrating a sixth modification of the noise filter and the wire harness of the embodiment;

DETAILED DESCRIPTION OF THE PREFERRED EMBODIMENTS

Hereinafter, an embodiment of a noise filter and a wire harness according to the invention will be described in detail based on drawings. The invention is not limited by this embodiment.

Embodiment

One embodiment of the noise filter and the wire harness according to the invention will be described based on FIG. 1 to FIG. 20.

Figure 1:
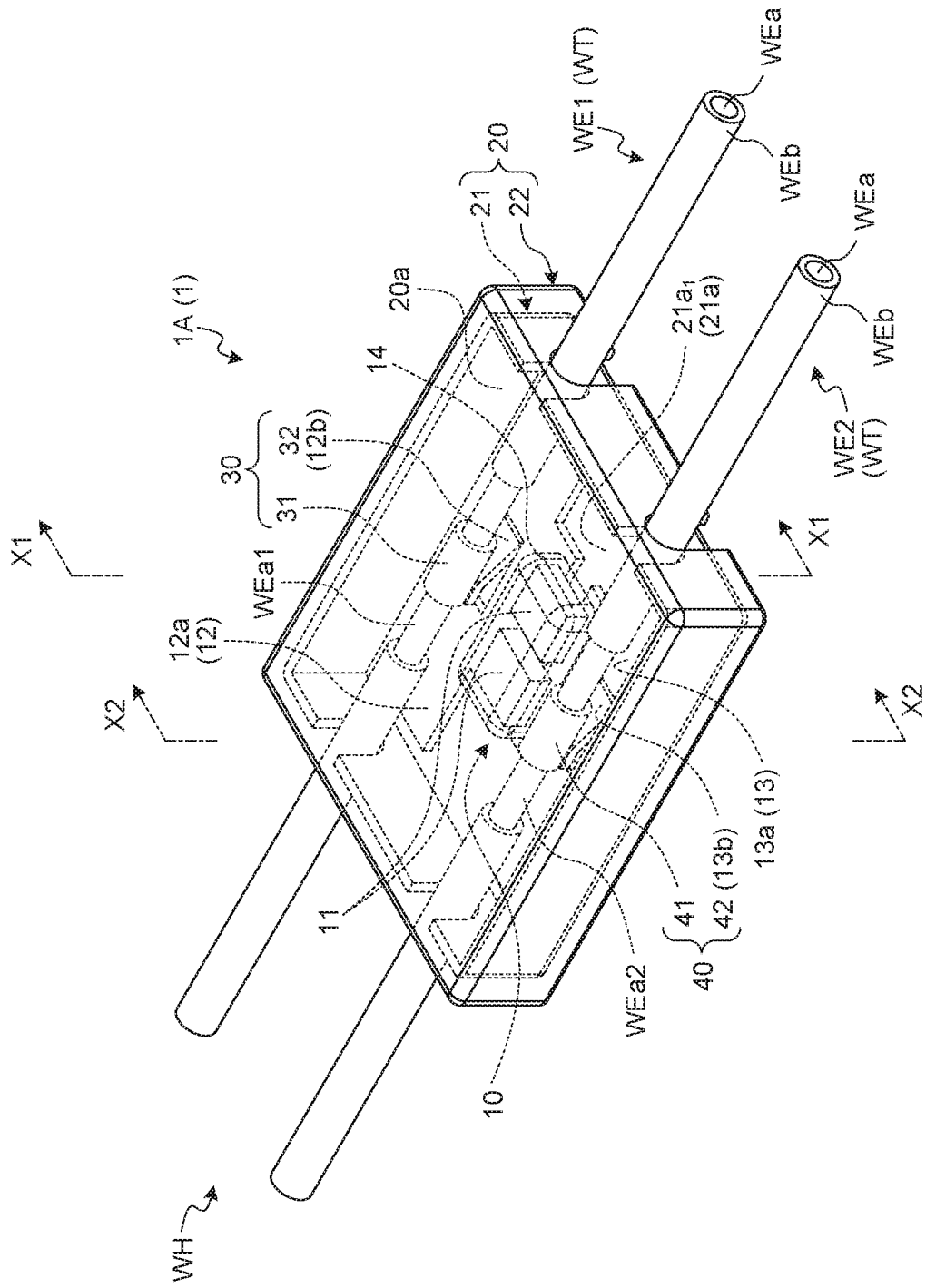
FIG. 1 is a perspective view illustrating a noise filter and a wire harness of an embodiment.
Figure 2:
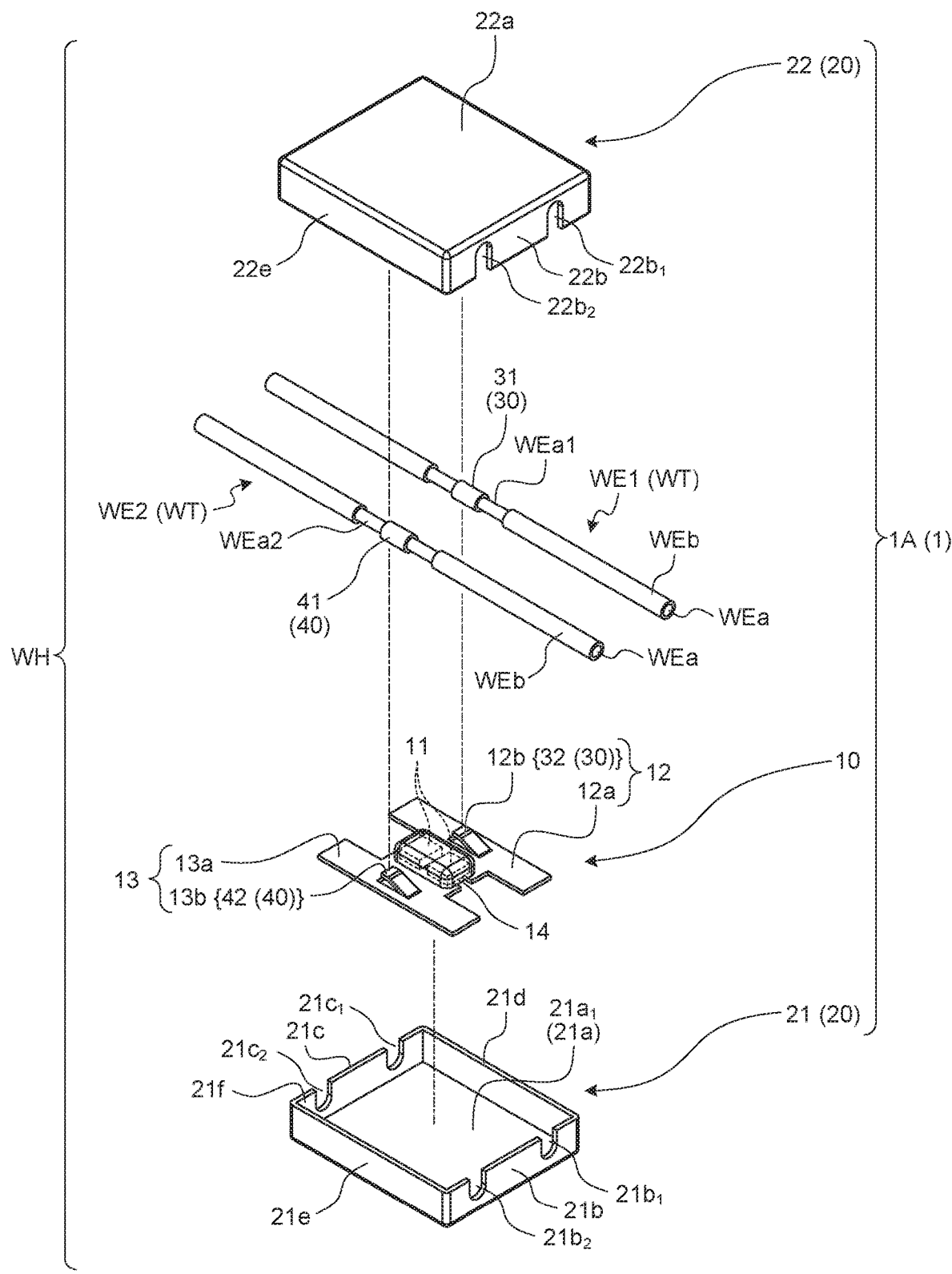
FIG. 2 is an exploded perspective view illustrating the noise filter and the wire harness of the embodiment.
Figure 3:
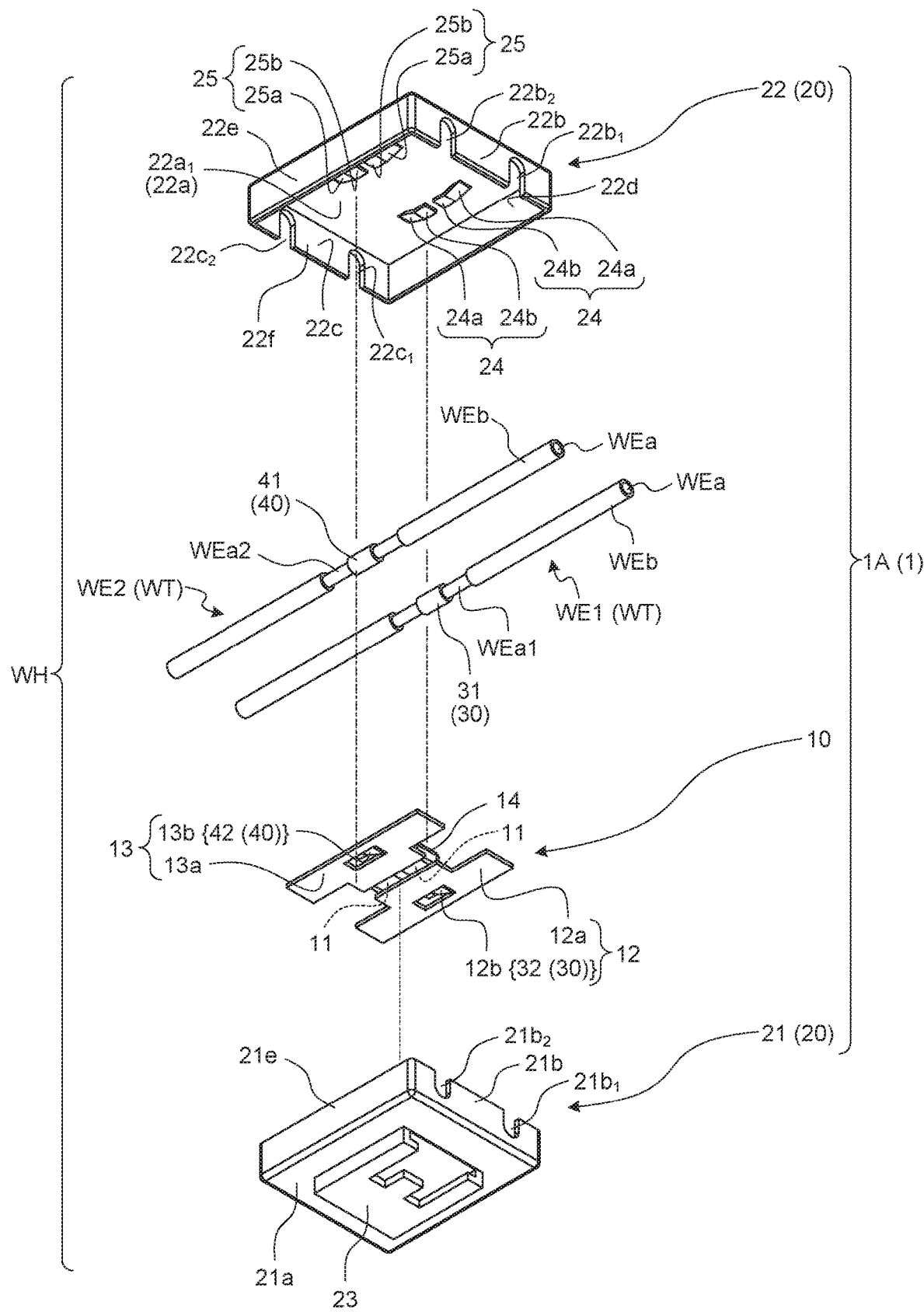
FIG. 3 is an exploded perspective view of the noise filter and the wire harness of the embodiment as viewed from a different angle.

Reference symbol 1 of FIG. 1 to FIG. 3 denotes the noise filter of the present embodiment. The noise filter 1 is a noise reduction device in which intermediate portions of two electric wires (first electric wire WE1 and second electric wire WE2) are connected by a filter circuit. One of the two electric wires is grounded, and an electric noise component on the other electric wire is reduced by the filter circuit. For example, the two electric wires correspond to two of a plurality of electric wires included in a trunk line WT of a wire harness WH of a vehicle. One electric wire is grounded as an earth wire, and the other electric wire is used as a power supply wire. For example, a load such as a defogger or a high mount stop lamp is electrically connected to the power supply line. The noise filter 1 becomes one component of the wire harness WH by being connected to the two electric wires. In the wire harness WH illustrated below, a first electric wire WE1 is used as a power supply wire, and a second electric wire WE2 is used as an earth wire. One end of the first electric wire WE1 is electrically connected to a power supply (for example, a secondary battery of the vehicle), and the other end thereof is electrically connected to the load. Further, one end of the second electric wire WE2 is grounded. Each of the first electric wire WE1 and the second electric wire WE2 includes a conductive core wire WEa and an insulating coating WEb covering an outer peripheral surface of the core wire WEa.

Noise Filter 1A

In the following, a noise filter 1A as an example of the noise filter 1 will be described (FIG. 1 to FIG. 3).

The noise filter 1A is a noise reduction device including a filter circuit 10 that reduces a noise component (FIG. 1 to FIG. 3). For example, the filter circuit 10 reduces an electrical noise component on the first electric wire WE1.

The filter circuit 10 is interposed between a portion of the core wire WEa located in an intermediate portion of the first electric wire WE1 and a portion of the core wire WEa located in an intermediate portion of the second electric wire WE2, and is electrically connected to each core wire WEa. Hereinafter, the portion of the core wire WEa located in the intermediate portion of the first electric wire WE1 will be referred to as an "intermediate connection portion WEa1", and the portion of the core wire WEa located in the intermediate portion of the second electric wire WE2 will be referred to as an "intermediate connection portion WEa2". In addition, in the following, the intermediate connection portion WEa1 of the core wire WEa of the first electric wire WE1 will be simplified as the "intermediate connection portion WEa1 of the first electric wire WE1", and the intermediate connection portion WEa2 of the core wire WEa of the second electric wire WE2 will be simplified as the "intermediate connection portion WEa2 of the second electric wire WE2".

The filter circuit 10 is interposed between the intermediate connection portion WEa1 of the first electric wire WE1 and the intermediate connection portion WEa2 of the second electric wire WE2 and is electrically connected to the respective intermediate connection portions WEa1 and WEa2 (FIG. 1).

The filter circuit 10 includes at least one noise reduction element 11 for reducing a noise component, a conductive first connection member (hereinafter referred to as a "first circuit connection member") 12 to which a first connection portion (hereinafter referred to as a "first element connection portion") of the noise reduction element 11 is electrically connected, and a conductive second connection member (hereinafter referred to as a "second circuit connection member") 13 to which a second connection portion (hereinafter referred to as a "second element connection portion") of the noise reduction element 11 is electrically connected (FIG. 1 to FIG. 3). Illustration of the first element connection portion and the second element connection portion is omitted.

Any noise reduction element 11 may be used as long as noise reduction can be achieved by this circuit configuration of the noise filter 1A. For example, as the noise reduction element 11, a capacitor, a coil, etc. can be considered. In this filter circuit 10, two capacitors are provided as the noise reduction element 11, and these two capacitors are configured to be able to reduce noise (FIG. 1 to FIG. 3).

The first circuit connection member 12 and the second circuit connection member 13 are conductive members that electrically connect each other through the noise reduction element 11. Each of the first circuit connection member 12 and second circuit connection member 13 in this example is molded as a plate-shaped bus bar using a conductive material such as metal.

The first circuit connection member 12 and the second circuit connection member 13 have flat plate-shaped main bodies 12a and 13a, respectively (FIG. 1 to FIG. 3). In the filter circuit 10, the first circuit connection member 12 and the second circuit connection member 13 are arranged side by side so that the main bodies 12a and 13a are disposed on the same plane. Further, in the filter circuit 10, the first element connection portion of the noise reduction element 11 is physically and electrically connected to the main body 12a of the first circuit connection member 12, and the second element connection portion of the noise reduction element 11 is physically and electrically connected to the main body 13a of the second circuit connection member 13. As a connection form, for example, welding, soldering, etc. is applied in accordance with a form of the first element connection portion or the second element connection portion of the noise reduction element 11.

The first circuit connection member 12 has a first circuit side connection body 12b which is indirectly electrically connected to the intermediate connection portion WEa1 of the first electric wire WE1 (FIG. 1 to FIG. 3). The first circuit side connection body 12b is a component of a first electric connection structure 30 as described later. In addition, the second circuit connection member 13 has a second circuit side connection body 13b which is indirectly electrically connected to the intermediate connection portion WEa2 of the second electric wire WE2 (FIG. 1 to FIG. 3). The second circuit side connection body 13b is a component of a second electric connection structure 40 as described later.

In the filter circuit 10 of this example, the two noise reduction elements 11 are covered with an insulating mold body 14 (FIG. 1 to FIG. 3). The insulating mold body 14 is a solidified material of a molding agent injected between the two noise reduction elements 11 and the main body 12a of the first circuit connection member 12 and the main body 13a of the second circuit connection member 13, and covers a connection part between the two noise reduction elements 11 and main body 12a and a connection part between the two noise reduction elements 11 and the main body 13a.

Further, the noise filter 1A accommodates the filter circuit 10, the intermediate connection portion WEa1 of the first electric wire WE1, and the intermediate connection portion WEa2 of the second electric wire WE2 in an inner accommodation chamber 20a (FIG. 1), and includes a housing 20 that draws the respective end sides of the first electric wire WE1 outward from the inner accommodation chamber 20a and draws the respective end sides of the second electric wire WE2 outward from the inner accommodation chamber 20a (FIG. 1 to FIG. 3). The housing 20 is molded using an insulating material such as a synthetic resin. The housing 20 forms the accommodation chamber 20a by fitting the first housing member 21 and the second housing member 22 to each other.

The first housing member 21 has a main wall body 21a on which the filter circuit 10 is installed on an inner wall surface $21a_1$, and peripheral wall bodies 21b to 21e erected from a peripheral edge portion of the main wall body 21a (FIG. 2). The first housing member 21 in this example has the rectangular flat plate-shaped main wall body 21a and the flat plate-shaped first to fourth peripheral wall bodies 21b to 21e suspended from four sides of the main wall body 21a. The first housing member 21 has an opening 21f including edges of the first to fourth peripheral wall bodies 21b to 21e.

The first circuit connection member 12 and the second circuit connection member 13 are installed on the inner wall surface $21a_1$ side of the main wall body 21a of the first housing member 21 (FIG. 1 and FIG. 2).

For example, the first circuit connection member 12 and the second circuit connection member 13 place wall surfaces of the main bodies 12a and 13a, respectively, on the inner wall surface $21a_1$ of the main wall body 21a, and fix the wall surfaces onto the inner wall surface $21a_1$ using engaging mechanisms (not illustrated). For example, the engaging mechanism refers to a lock mechanism that holds the main body using a locking portion such as a claw provided at a plurality of positions on the inner wall surface $21a_1$ of the main wall body 21a. In addition, here, the first circuit connection member 12 and the second circuit connection member 13 may be installed on the inner wall surface $21a_1$ side of the main wall body 21a of the first housing member 21 by integrally molding the first housing member 21 with respect to the first circuit connection member 12 and the second circuit connection member 13. In this case, in the main bodies 12a and 13a of the first circuit connection member 12 and the second circuit connection member 13, the wall surfaces are exposed on the inner wall surface $21a_1$ side of the main wall body 21a of the first housing member 21.

The second housing member 22 has a main wall body 22a disposed to face the inner wall surface $21a_1$ of the main wall body 21a of the first housing member 21 at an interval, and blocks the opening of the first housing member 21. The second housing member 22 in this example further has peripheral wall bodies 22b to 22e erected from a peripheral edge portion of the main wall body 22a (FIG. 3). Here, the second housing member 22 has the rectangular flat plate-shaped main wall body 22a and the flat plate-shaped first to fourth peripheral wall bodies 22b to 22e suspended from four sides of the main wall body 22a, respectively. The second housing member 22 has an opening 22f including edges of the first to fourth peripheral wall bodies 22b to 22e.

In the housing 20 in this example, the first peripheral wall bodies 21b and 22b of the first housing member 21 and the second housing member 22 are disposed to face each other, the second peripheral wall bodies 21c and 22c thereof are disposed to face each other, the third peripheral wall bodies 21d and 22d thereof are disposed to face each other, and the fourth peripheral wall bodies 21e and 22e thereof are disposed to face each other.

The housing 20 in this example accommodates the first electric wire WE1 and the second electric wire WE2 in the accommodation chamber 20a in a parallel arrangement state, and causes the first electric wire WE1 and the second electric wire WE2 to run in parallel in the accommodation chamber 20a. In the housing 20, the first electric wire WE1 and the second electric wire WE2 are drawn outward from the first peripheral wall body 21b and the second peripheral wall body 21c in a facing arrangement state in the first housing member 21 and the first peripheral wall body 22b and the second peripheral wall body 22c in a facing arrangement state in the second housing member 22.

The first peripheral wall bodies 21b and 22b of the first housing member 21 and the second housing member 22 have first outlets $21b_1$ and $22b_1$ for drawing out one end side of the first electric wire WE1 to the outside and second outlets $21b_2$ and $22b_2$ for drawing out one end side of the second electric wire WE2 to the outside, respectively (FIG.

2 and FIG. 3). In the respective first peripheral wall bodies $21b$ and $22b$, the first outlets $21b_1$ and $22b_1$ are disposed to face each other, and the second outlets $21b_2$ and $22b_2$ are disposed to face each other.

The second peripheral wall bodies $21c$ and $22c$ of the first housing member 21 and the second housing member 22 have third outlets $21c_1$ and $22c_1$ for drawing out the other end side of the first electric wire WE1 to the outside and fourth outlets $21c_2$ and $22c_2$ for drawing out the other end side of the second electric wire WE2 to the outside, respectively (FIG. 2 and FIG. 3). In the respective second peripheral wall bodies $21c$ and $22c$, the third outlets $21c_1$ and $22c_1$ are disposed to face each other, and the fourth outlets $21c_2$ and $22c_2$ are disposed to face each other.

The housing 20 in this example has a holding body 23 for holding with respect to an installation object of the noise filter 1A (FIG. 3). The holding body 23 causes the installation object to hold the housing 20 by engaging with a counterpart holding body (not illustrated) of the installation object. Here, the holding body 23 is provided on an outer wall surface of the main wall body $21a$ of the first housing member 21.

Furthermore, the noise filter 1A includes a first electric connection structure 30 for electrically connecting the intermediate connection portion WEa1 of the first electric wire WE1 to the first circuit connection member 12 of the filter circuit 10, and a second electric connection structure 40 for electrically connecting the intermediate connection portion WEa2 of the second electric wire WE2 to the second circuit connection member 13 of the filter circuit 10 (FIG. 1 to FIG. 3). The first electric connection structure 30 and the second electric connection structure 40 are stored in the accommodation chamber $20a$ of the housing 20.

The first electric connection structure 30 performs mutual connection such that an axial direction of the first electric wire WE1 extends along a plane of the main body $12a$ of the first circuit connection member 12. In addition, the second electric connection structure 40 performs mutual connection such that an axial direction of the second electric wire WE2 extends along a plane of the main body $13a$ of the second circuit connection member 13. Further, the first electric connection structure 30 and the second electric connection structure 40 connect the first electric wire WE1 and the first circuit connection member 12 to each other and connect the second electric wire WE2 and the second circuit connection member 13 to each other such that the respective axial directions of the first electric wire WE1 and the second electric wire WE2 correspond to the same direction.

The first electric connection structure 30 includes a first electric wire side connection body 31 physically and electrically connected to the intermediate connection portion WEa1 of the first electric wire WE1, and a first circuit side connection body 32 physically and electrically connected to the first electric wire side connection body 31 and the first circuit connection member 12 (FIG. 1 and FIG. 2).

The first electric wire side connection body 31 in this example is molded as one member (first electric wire side connection member) using a conductive material such as metal. For example, the first electric wire side connection body 31 is a tubular member physically and electrically connected to the intermediate connection portion WEa1 by performing caulking while winding a rectangular metal plate around the intermediate connection portion WEa1 of the first electric wire WE1. The first electric wire side connection body 31 in this example is molded into a tubular shape (FIG. 1 and FIG. 2).

The first circuit side connection body 32 is formed to be indirectly electrically connected to the intermediate connection portion WEa1 of the first electric wire WE1.

The first circuit side connection body 32 in this example is indirectly electrically connected to the intermediate connection portion WEa1 by an elastic force indirectly applied to the intermediate connection portion WEa1 of the first electric wire WE1. Specifically, an elastic force is directly exerted on the first electric wire side connection body 31, and the first circuit side connection body 32 is indirectly electrically connected to the intermediate connection portion WEa1 of the first electric wire WE1 by the elastic force exerted on the first electric wire side connection body 31. The first circuit side connection body 32 is provided on the first circuit connection member 12. The first circuit side connection body 32 may be molded as one member or included in a certain member as a part.

The former first circuit side connection body 32 is molded as a different member from the first circuit connection member 12. The first circuit side connection body 32 is provided on the first circuit connection member 12 by being physically and electrically connected to the first circuit connection member 12 by welding, etc.

In addition, for example, the latter first circuit side connection body 32 is molded integrally with the main body $12a$ of the first circuit connection member 12, and is provided as a body included in the first circuit connection member 12. This first electric connection structure 30 in this example includes this latter first circuit side connection body 32 (FIG. 1 to FIG. 3). Here, the first circuit side connection body $12b$ of the first circuit connection member 12 is used as the first circuit side connection body 32 of the first electric connection structure 30.

Figure 4:
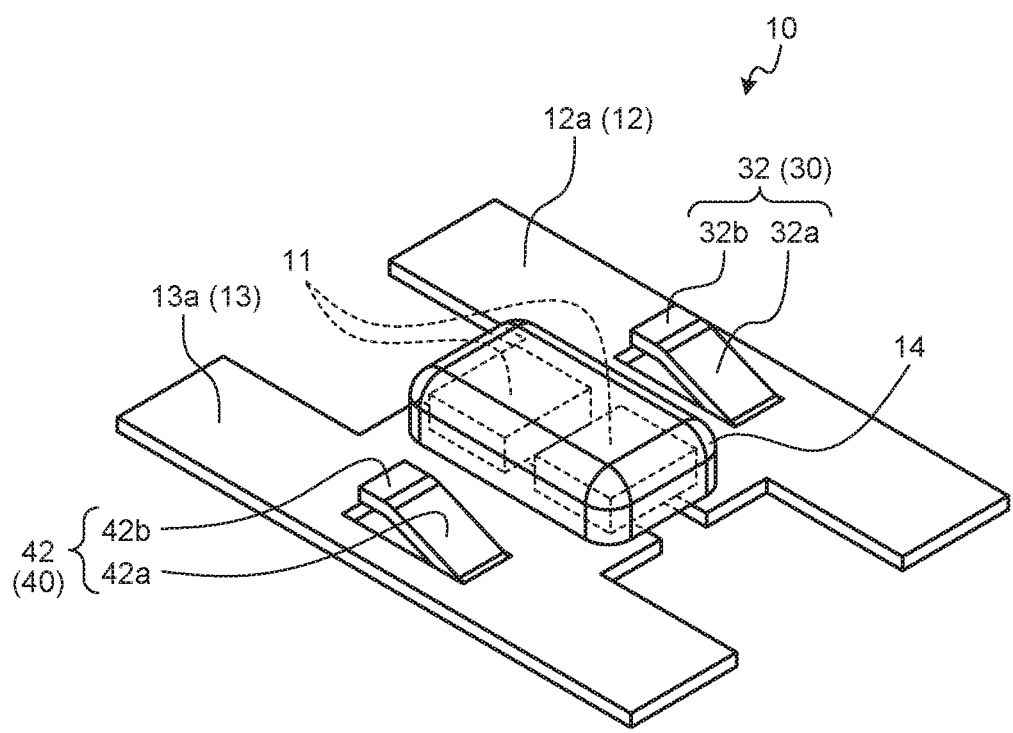
FIG. 4 is a perspective view illustrating a filter circuit of the noise filter of the embodiment.
Figure 5:
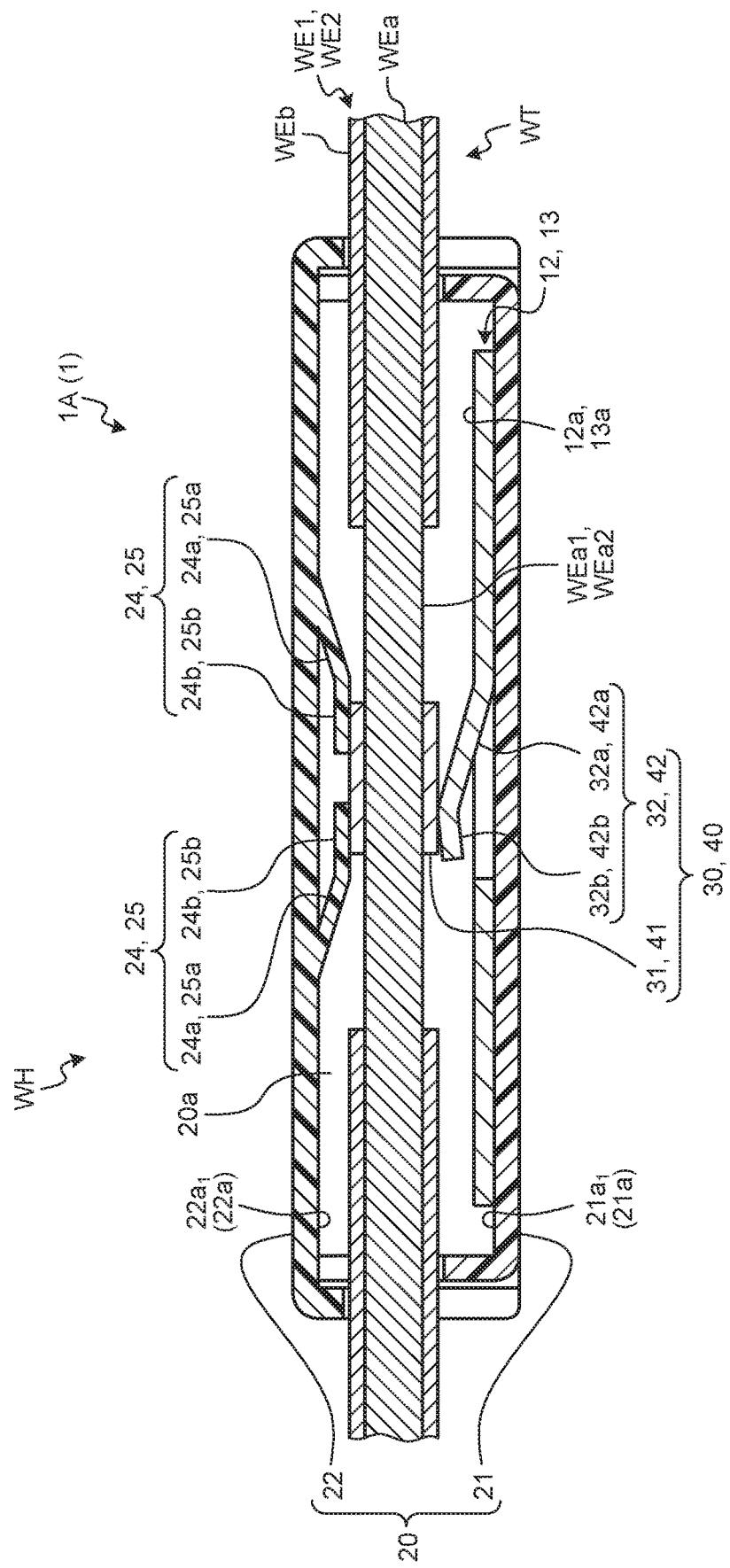
FIG. 5 is a cross-sectional view schematically illustrating a cross section taken along X1-X1 line and a cross section taken along X2-X2 line of FIG. 1.
Figure 6:
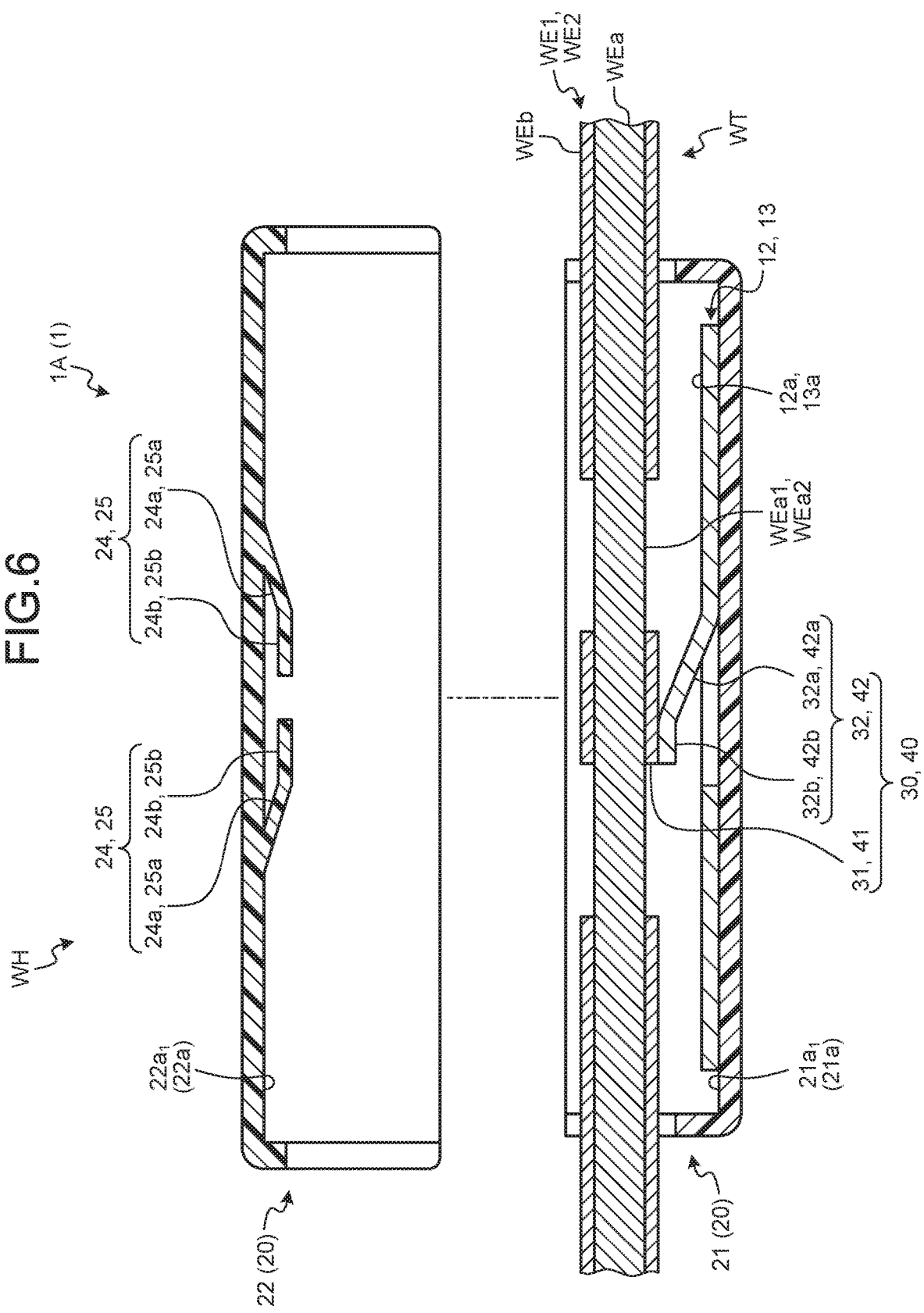
FIG. 6 is a cross-sectional view illustrating a part of an assembling process of the noise filter and the wire harness of the embodiment.

The first circuit side connection body 32 ($12b$) includes a piece (hereinafter referred to as an "elastic piece") $32a$ having elasticity and a single body shape of a cantilever whose free end side is raised from the main body $12a$ of the first circuit connection member 12, and a contact portion $32b$ provided at a free end of the elastic piece $32a$ and directly electrically connected to the first electric wire side connection body 31 (FIG. 4 to FIG. 6). The first circuit side connection body 32 is physically and electrically connected to the first electric wire side connection body 31 by generating an elastic force using the elastic piece $32a$ and causing the elastic force to directly act on the first electric wire side connection body 31 from the contact portion $32b$. Therefore, the first circuit side connection body 32 can be indirectly electrically connected to the intermediate connection portion WEa1 of the first electric wire WE1 via the first electric wire side connection body 31.

The second electric connection structure 40 includes a second electric wire side connection body 41 physically and electrically connected to the intermediate connection portion WEa2 of the second electric wire WE2, and a second circuit side connection body 42 physically and electrically connected to the second electric wire side connection body 41 and the second circuit connection member 13 (FIG. 1 to FIG. 3).

The second electric wire side connection body 41 in this example is a tubular member having the same tubular shape as that of the first electric wire side connection body 31, and is physically and electrically connected to the intermediate connection portion WEa2 by performing caulking while winding a rectangular metal plate around the intermediate connection portion WEa2 of the second electric wire WE2 (FIG. 1 to FIG. 3).

The second circuit side connection body 42 is formed to be indirectly electrically connected to the intermediate connection portion WEa2 of the second electric wire WE2. The second circuit side connection body 42 in this example is indirectly electrically connected to the intermediate connection portion WEa2 by an elastic force indirectly applied to the intermediate connection portion WEa2 of the second electric wire WE2. Specifically, an elastic force is directly exerted on the second electric wire side connection body 41, and the second circuit side connection body 42 is indirectly electrically connected to the intermediate connection portion WEa2 of the second electric wire WE2 by the elastic force exerted on the second electric wire side connection body 41. The second circuit side connection body 42 is provided on the second circuit connection member 13. Similarly to the first circuit side connection body 32, the second circuit side connection body 42 may be molded as one member or included in a certain member as a part. The second circuit side connection body 42 in this example is molded integrally with the main body 13a of the second circuit connection member 13, and is provided as a body included in the second circuit connection member 13. Here, the second circuit side connection body 13b of the second circuit connection member 13 is used as the second circuit side connection body 42 of the second electric connection structure 40.

The second circuit side connection body 42 (13b) is formed in the same shape as that of the first circuit side connection body 32 (12b). Therefore, the second circuit side connection body 42 includes a piece (hereinafter referred to as an "elastic piece") 42a having elasticity and a single body shape of a cantilever whose free end side is raised from the main body 13a of the second circuit connection member 13, and a contact portion 42b provided at a free end of the elastic piece 42a and directly electrically connected to the second electric wire side connection body 41 (FIG. 4 to FIG. 6). The second circuit side connection body 42 is physically and electrically connected to the second electric wire side connection body 41 by generating an elastic force using the elastic piece 42a and causing the elastic force to directly act on the second electric wire side connection body 41 from the contact portion 42b. Therefore, the second circuit side connection body 42 can be indirectly electrically connected to the intermediate connection portion WEa2 of the second electric wire WE2 via the second electric wire side connection body 41.

Here, the elastic force of the first circuit side connection body 32 is generated by clamping the first circuit connection member 12 and the first electric wire side connection body 31 between the inner wall surface $21a_1$ side of the main wall body 21a of the first housing member 21 and the inner wall surface $22a_1$ side of the main wall body 22a of the second housing member 22 when the first housing member 21 and the second housing member 22 are fit to each other (FIG. 5). Therefore, in the first electric connection structure 30, the first electric wire side connection body 31 and the first circuit side connection body 32 (the first circuit side connection body 12b of the first circuit connection member 12) are disposed to face each other in a fitting direction of the first housing member 21 and the second housing member 22.

In addition, the elastic force of the second circuit side connection body 42 is generated by clamping the second circuit connection member 13 and the second electric wire side connection body 41 between the inner wall surface $21a_1$ side of the main wall body 21a of the first housing member 21 and the inner wall surface $22a_1$ side of the main wall body 22a of the second housing member 22 when the first housing member 21 and the second housing member 22 are fit to each other (FIG. 5). Therefore, in the second electric connection structure 40, the second electric wire side connection body 41 and the second circuit side connection body 42 (the second circuit side connection body 13b of the second circuit connection member 13) are disposed to face each other in the fitting direction of the first housing member 21 and the second housing member 22.

In this noise filter 1A, to generate an elastic force in the first circuit side connection body 32 and the second circuit side connection body 42, the first electric wire side connection body 31 is clamped by the contact portion 32b of the first circuit side connection body 32 and the inner wall surface $22a_1$ side of the main wall body 22a of the second housing member 22, and the second electric wire side connection body 41 is clamped by the contact portion 42b of the second circuit side connection body 42 and the inner wall surface $22a_1$ side of the main wall body 22a of the second housing member 22 in the fitting direction of the first housing member 21 and the second housing member 22 (FIG. 5). That is, here, the fitting direction of the first housing member 21 and the second housing member 22 corresponds to a clamping direction (hereinafter referred to as an "electric wire clamping direction") with respect to the first electric wire side connection body 31 and the second electric wire side connection body 41.

At least one first clamping body 24 that indirectly clamps the intermediate connection portion WEa1 of the first electric wire WE1 between the contact portion 32b of the first circuit side connection body 32 and the inner wall surface $22a_1$, and at least one second clamping body 25 that indirectly clamps the intermediate connection portion WEa2 of the second electric wire WE2 between the contact portion 42b of the second circuit side connection body 42 and the inner wall surface $22a_1$ are provided on the inner wall surface $22a_1$ of the main wall body 22a of the second housing member 22 (FIG. 3, FIG. 5, and FIG. 6).

The first clamping body 24 indirectly clamps the intermediate connection portion WEa1 of the first electric wire WE1 between the contact portion 32b and the first clamping body 24 by clamping the first electric wire side connection body 31 between the contact portion 32b of the first circuit side connection body 32 and the first clamping body 24. The first clamping body 24 includes a piece 24a having a single body shape of a cantilever whose free end side is raised from the inner wall surface $22a_1$ of the main wall body 22a of the second housing member 22 and a pressing portion 24b provided at a free end of the piece 24a to come into contact with and press the first electric wire side connection body 31 (FIG. 3, FIG. 5, and FIG. 6). The piece 24a may or may not have elasticity. In addition, the pressing portion 24b is disposed to face the contact portion 32b in the electric wire clamping direction. Here, the pressing portion 24b and the contact portion 32b are formed in rectangular single body shapes, respectively, and the first electric wire side connection body 31 is clamped between planes thereof.

The second clamping body 25 indirectly clamps the intermediate connection portion WEa2 of the second electric wire WE2 between the contact portion 42b and the second clamping body 25 by clamping the second electric wire side connection body 41 between the contact portion 42b of the second circuit side connection body 42 and the second clamping body 25. The second clamping body 25 includes a piece 25a having a single body shape of a cantilever whose free end side is raised from the inner wall surface $22a_1$ of the main wall body 22a of the second housing member 22 and a pressing portion 25b provided at a free end of the piece 25a to come into contact with and press the second electric wire side connection body 41 (FIG. 3, FIG. 5, and FIG. 6). The piece 25a may or may not have elasticity. In addition, the pressing portion 25b is disposed to face the contact portion 42b in the electric wire clamping direction. Here, the pressing portion 25b and the contact portion 42b are formed in rectangular single body shapes, respectively, and the second electric wire side connection body 41 is clamped between planes thereof.

In the noise filter 1A, in an inner space of the first housing member 21, the first electric wire WE1 is disposed in a state in which the first electric wire side connection body 31 is placed on the contact portion 32b, and the second electric wire WE2 is disposed in a state in which the second electric wire side connection body 41 is placed on the contact portion 42b (FIG. 6). In the noise filter 1A, the second housing member 22 is fit to the first housing member 21 (FIG. 6).

When the first housing member 21 and the second housing member 22 are fit to each other, a pressing force from the pressing portion 24b to the contact portion 32b acts on the first electric wire side connection body 31, the first electric wire side connection body 31 pushes and moves the contact portion 32b, and thus an elastic force of the elastic piece 32a against a pushing force acts on the first electric wire side connection body 31 from the contact portion 32b. In addition, when the first housing member 21 and the second housing member 22 are fit to each other, a pressing force from the pressing portion 25b to the contact portion 42b acts on the second electric wire side connection body 41, the second electric wire side connection body 41 pushes and moves the contact portion 42b, and thus an elastic force of the elastic piece 42a against a pushing force acts on the second electric wire side connection body 41 from the contact portion 42b. Therefore, in the noise filter 1A, when the first housing member 21 and the second housing member 22 are fit to each other, the first electric wire side connection body 31 is clamped by the pressing portion 24b and the contact portion 32b so that the first electric wire side connection body 31 and the contact portion 32b are physically and electrically connected to each other, and the second electric wire side connection body 41 is clamped by the pressing portion 25b and the contact portion 42b so that the second electric wire side connection body 41 and the contact portion 42b are physically and electrically connected to each other. Therefore, in the noise filter 1A, the intermediate connection portion WEa1 of the first electric wire WE1 and the first circuit connection member 12 of the filter circuit 10 are indirectly electrically connected via the first electric wire side connection body 31, and the intermediate connection portion WEa2 of the second electric wire WE2 and the second circuit connection member 13 of the filter circuit 10 are indirectly electrically connected via the second electric wire side connection body 41.

Incidentally, as described above, in the conventional noise filter, an intermediate electric wire is interposed between the noise reduction target electric wire and the filter circuit. The intermediate electric wire has a large allowable tolerance regarding a length in consideration of assembling workability with respect to the noise filter, a wiring route to a vehicle, etc. For this reason, the conventional noise filter needs to adjust a filter circuit characteristic (resonance point, noise reduction performance, etc.) taking the noise component of the intermediate electric wire according to the length thereof into consideration. However, in the noise filter 1A, the filter circuit 10 is interposed between the intermediate connection portion WEa1 of the first electric wire WE1 and the intermediate connection portion WEa2 of the second electric wire WE2 bundled in the trunk line WT of the wire harness WH, and the filter circuit 10 is electrically connected to the respective intermediate connection portions WEa1 and WEa2. Therefore, this noise filter 1A may not adjust a filter circuit characteristic taking an influence of a branched electric wire (intermediate electric wire) from the trunk line into consideration unlike the past. That is, the noise filter 1A is not affected by the intermediate electric wire.

Figure 7:
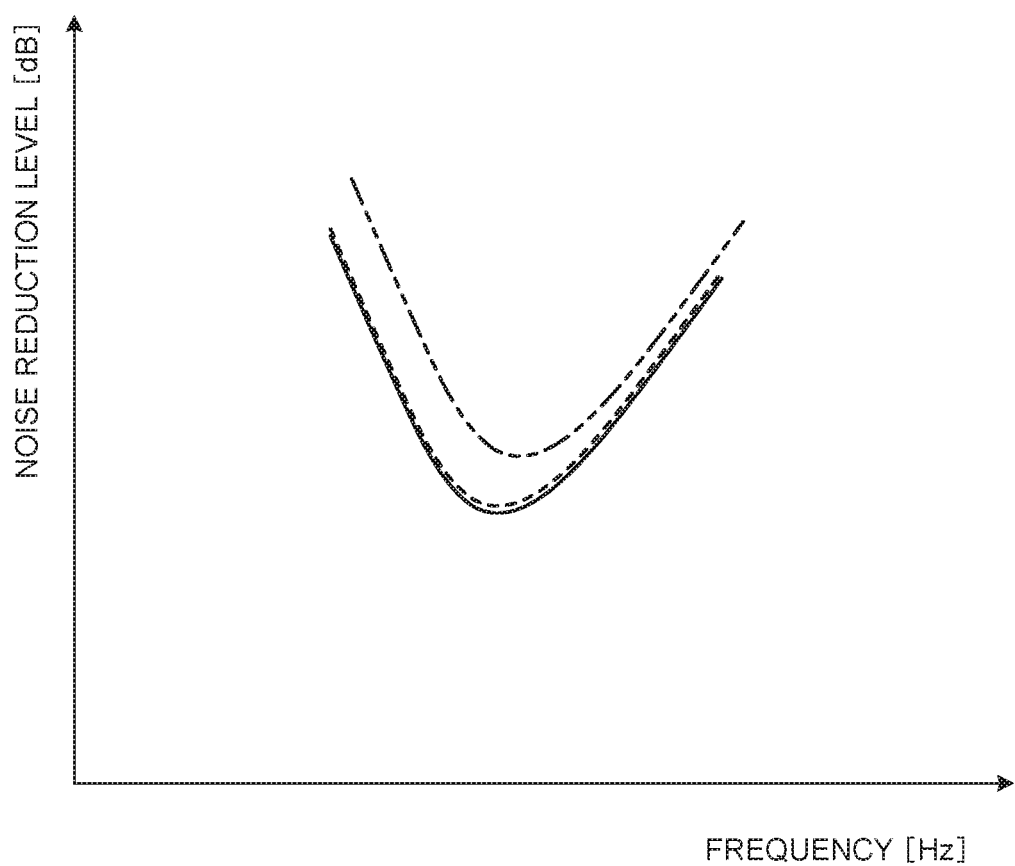
FIG. 7 is a conceptual diagram of a filter circuit characteristic of the noise filter of the embodiment.

FIG. 7 illustrates a conceptual diagram of a filter circuit characteristic in which a horizontal axis depicts a frequency and a vertical axis depicts a noise reduction level. In this figure, a required performance of noise reduction is indicated by a broken line, the filter circuit characteristic of the noise filter 1A of the present embodiment is indicated by a solid line, and the filter circuit characteristic of the conventional noise filter is indicated by an alternate long and two short dashes line.

For example, the noise filter 1A may be wrapped in an adhesive tape, etc. together with the trunk line WT, and held by the trunk line WT.

Furthermore, since the noise filter 1A electrically connects the filter circuit 10 to the intermediate connection portion WEa2 of the second electric wire WE2 whose one end is grounded, for example, even when a conductor that can be grounded is not present around the trunk line WT, and even when an installation object is molded using an insulating material such as a synthetic resin, it is possible to easily perform grounding. That is, when the conventional noise filter is attached to a conductive installation object, the conventional noise filter is grounded through the installation object by connecting a ground terminal to the installation object. Therefore, in the conventional noise filter, the ground terminal is projected from the housing to facilitate a fixing operation of the ground terminal and the installation object. However, this noise filter 1A can be grounded without such a ground terminal. Therefore, the noise filter 1A can achieve reduction in size and weight of a frame.

Furthermore, in the noise filter 1A, an electric connection structure between the intermediate connection portion WEa1 of the first electric wire WE1 and the first circuit side connection body 32 and an electric connection structure between the intermediate connection portion WEa2 of the second electric wire WE2 and the second circuit side connection body 42 utilize an elastic force of each of the first circuit side connection body 32 and the second circuit side connection body 42. Therefore, when compared to a case in which a connection structure corresponds to a fitting structure of male and female terminal portions as in the past, the noise filter 1A can achieve reduction in size of each connection structure. Therefore, the noise filter 1A can achieve reduction in size of the frame. In addition, even though such a conventional connection structure may cause a steep rise in cost depending on the shape, since the noise filter 1A corresponds to a connection structure utilizing an elastic force, it is possible to simplify the structure and suppress the steep rise in cost.

Furthermore, this noise filter 1A can absorb a dimensional variation of each component and exert a stable contact load on the respective intermediate connection portions WEa1 and WEa2 by adopting such a connection structure based on the elastic force. In addition, even when the dimensional variation of each component further increases, the noise filter 1A can absorb the dimensional variation and apply a stable contact load to each intermediate connection portion WEa2 by assigning elasticity to the piece 24a of the first clamping body 24 and the piece 25a of the second clamping body 25 in cooperation with elasticity of the first circuit side connection body 32 and the second circuit side connection body 42. Due to such a characteristic, the noise filter 1A can improve a quality of conduction between the first electric wire WE1 and the second electric wire WE2, and the filter circuit 10.

Furthermore, by adopting a connection structure based on an elastic force, the noise filter 1A can attempt electric connection to electric wires having various outer diameters (the first electric wire WE1 and the second electric wire WE2) within a range of an elastic region of the first circuit side connection body 32 and the second circuit side connection body 42. In addition, when elasticity is assigned to the piece 24a of the first clamping body 24 and the piece 25a of the second clamping body 25, the noise filter 1A can attempt electric connection to electric wires having various outer diameters (the first electric wire WE1 and the second electric wire WE2) within a range of an elastic region including the elasticities thereof. That is, the noise filter 1A can cope with electric wires having various outer diameters (the first electric wire WE1 and the second electric wire WE2), and versatility can be enhanced.

Noise Filter 1B

Here, the noise filter 1 of the present embodiment may be configured as a noise filter 1B in which a first clamping body 124 and a second clamping body 125 described below are provided in a second housing member 122 in place of the second housing member 22 having the first clamping body 24 and the second clamping body 25 described above (FIG. 8 and FIG. 9). This noise filter 1B can obtain a similar effect to that of the above-mentioned noise filter 1A, and can obtain an effect described later by the first clamping body 124 and the second clamping body 125.

The second housing member 122 is a housing member in which the first clamping body 24 is replaced with the first clamping body 124 and the second clamping body 25 is replaced with the second clamping body 125 in the second housing member 22 described above. The second housing member 122 is included in a housing 120 in which an accommodation chamber 120a is formed inward by being fit to the first housing member 21 described above (FIG. 9). Two first clamping bodies 124 and two second clamping bodies 125 are provided on an inner wall surface 122$a_1$ of a main wall body 122a of the second housing member 122 (FIG. 8 and FIG. 9).

Figure 9:
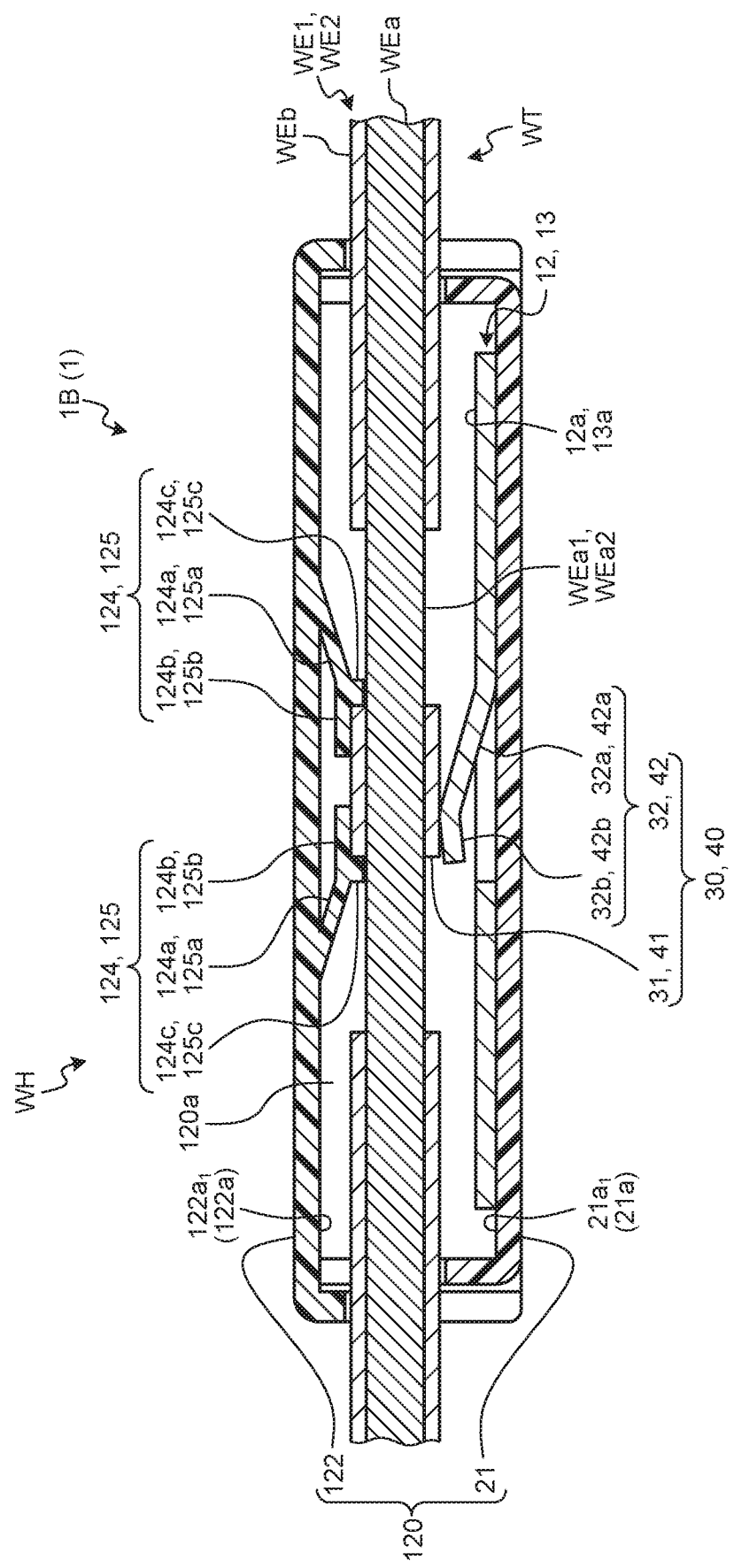
FIG. 9 is a perspective view illustrating the first modification of the noise filter and the wire harness of the embodiment.
Figure 10:
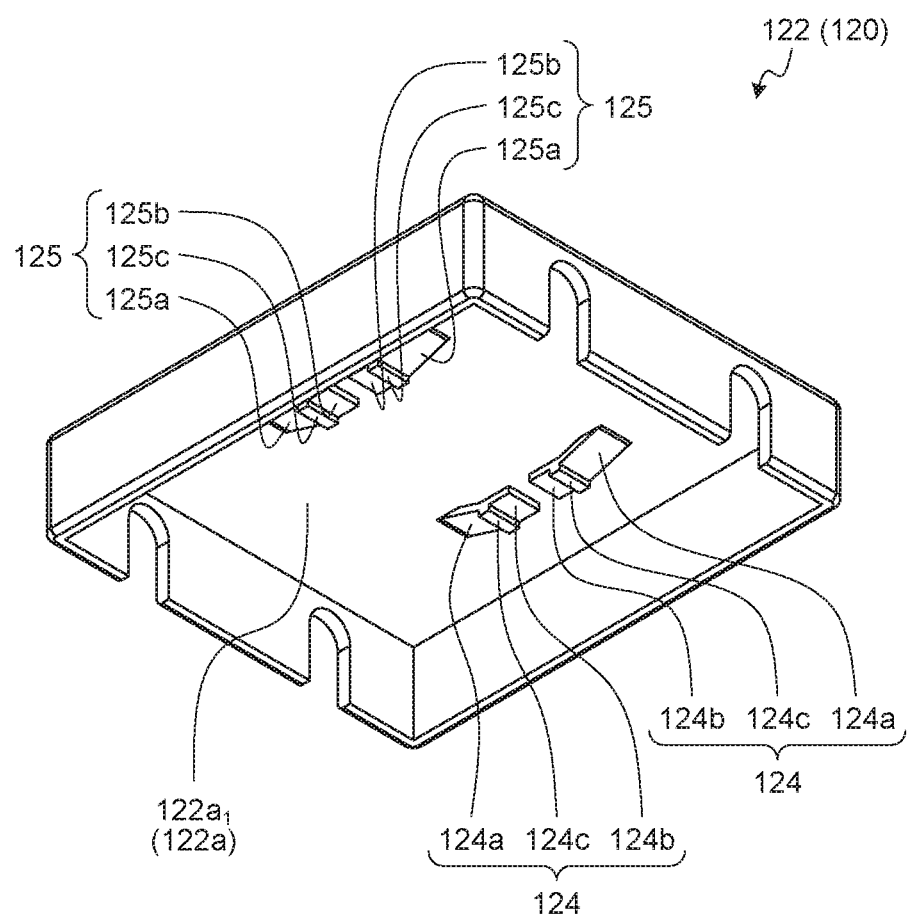
FIG. 10 is a perspective view illustrating a second housing member of the first modification.

In addition to a piece 124a and a pressing portion 124b similar to those of the first clamping body 24 described above, the first clamping body 124 has a locking projection 124c bulged out from the pressing portion 124b (FIG. 8 to FIG. 10). In addition, in addition to a piece 125a and a pressing portion 125b similar to those of the second clamping body 25 described above, the second clamping body 125 has a locking projection 125c bulged out from the pressing portion 125b (FIG. 8 to FIG. 10).

In the noise filter 1B, the first electric wire side connection body 31 is clamped by the pressing portion 124b and the contact portion 32b of each of the two first clamping bodies 124, and the second electric wire side connection body 41 is clamped by the pressing portion 125b and the contact portion 42b of each of the two second clamping bodies 125 (FIG. 8 and FIG. 9). In this instance, the contact portion 32b may be disposed to face only the pressing portion 124b of one of the first clamping bodies 124 in the electric wire clamping direction or disposed to face the respective pressing portions 124b of both the first clamping bodies 124 in the electric wire clamping direction. Similarly thereto, the contact portion 42b may be disposed to face only the pressing portion 125b of one of the second clamping bodies 125 in the electric wire clamping direction or disposed to face the respective pressing portions 125b of both the second clamping bodies 125 in the electric wire clamping direction.

In addition, the locking projection 124c of one of the first clamping bodies 124 is formed to lock one end of the first electric wire side connection body 31 in a tube axis direction in the tube axis direction (FIG. 9). Further, the locking projection 124c of the other one of the first clamping bodies 124 is formed to lock the other end of the first electric wire side connection body 31 in the tube axis direction in the tube axis direction (FIG. 9). That is, in the noise filter 1B, the first electric wire side connection body 31 is clamped from both ends in the tube axis direction using two locking projections 124c. Further, the locking projection 125c of one of the second clamping bodies 125 is formed to lock one end of the second electric wire side connection body 41 in the tube axis direction in the tube axis direction (FIG. 9). Further, the locking projection 125c of the other one of the second clamping bodies 125 is formed to lock the other end of the second electric wire side connection body 41 in the tube axis direction in the tube axis direction (FIG. 9). That is, in the noise filter 1B, the second electric wire side connection body 41 is clamped from both ends in the tube axis direction using two locking projections 125c. In this way, in the noise filter 1B, the first electric wire side connection body 31, the first electric wire WE1, the second electric wire side connection body 41, and the second electric wire WE2 in the accommodation chamber 120a of the housing 120 can be positioned by the two locking projections 124c and the two locking projections 125c. Therefore, the noise filter 1B can further improve the quality of conduction between the first electric wire WE1 and the second electric wire WE2, and the filter circuit 10.

Noise Filter 1C

In addition, the noise filter 1 of the present embodiment may be configured as a noise filter 1C in which a first clamping body 224 and a second clamping body 225 described below are provided in a second housing member 222 in place of the second housing member 22 having the first clamping body 24 and the second clamping body 25 described above (FIG. 11 and FIG. 12). This noise filter 1C can obtain a similar effect to that of the above-mentioned noise filter 1A, and can obtain an effect described later by the first clamping body 224 and the second clamping body 225.

The second housing member 222 is a housing member in which the first clamping body 24 is replaced with the first clamping body 224 and the second clamping body 25 is replaced with the second clamping body 225 in the second housing member 22 described above. The second housing member 222 is included in a housing 220 in which an accommodation chamber 220a is formed inward by being fit to the first housing member 21 described above (FIG. 12). Two first clamping bodies 224 and two second clamping bodies 225 are provided on an inner wall surface 222$a_1$ of a main wall body 222a of the second housing member 222 (FIG. 11 and FIG. 12).

Figure 11:
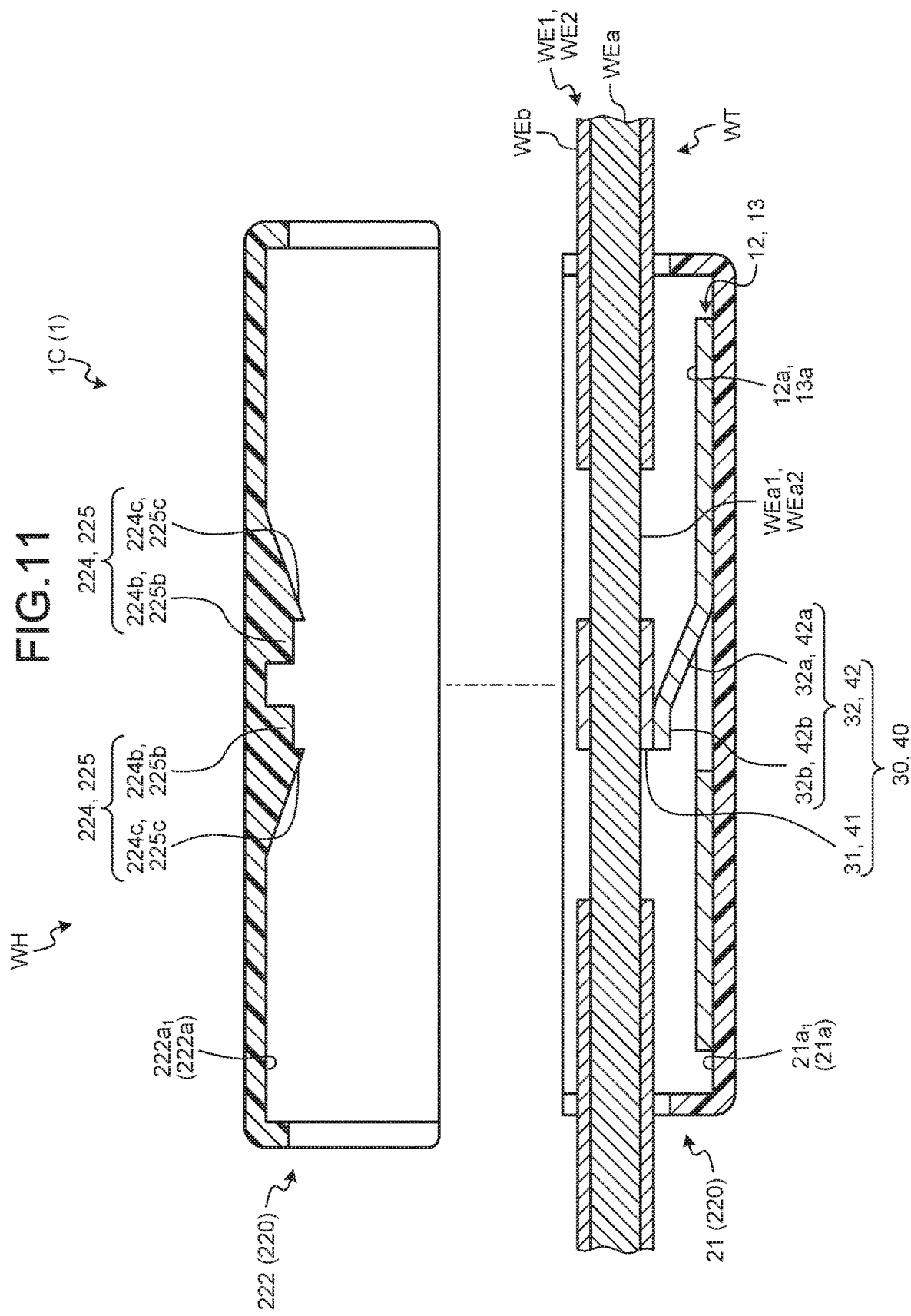
FIG. 11 is an exploded perspective view illustrating a second modification of the noise filter and the wire harness of the embodiment.
Figure 12:
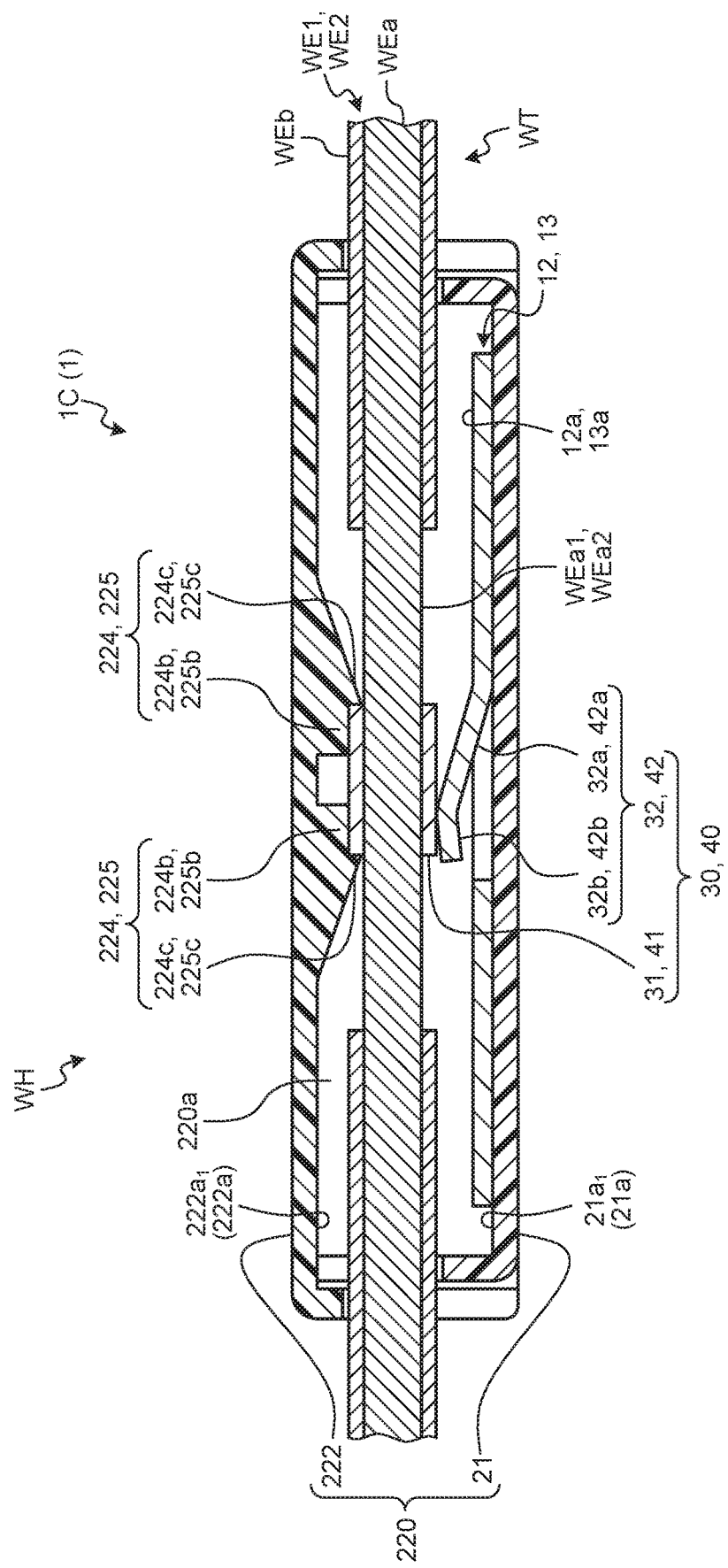
FIG. 12 is a perspective view illustrating the second modification of the noise filter and the wire harness of the embodiment.

The first clamping body 224 has a pressing portion 224b bulged out from the inner wall surface 222$a_1$ of the main wall body 222a to come into contact with and press the first electric wire side connection body 31, and a locking projection 224c bulged out from the inner wall surface 222$a_1$ (FIG. 11 and FIG. 12). In addition, the second clamping body 225 has a pressing portion 225b bulged out from the inner wall surface 222$a_1$ of the main wall body 222a to come into contact with and press the second electric wire side connection body 41, and a locking projection 225c bulged out from the inner wall surface 222$a_1$ (FIG. 11 and FIG. 12).

In the noise filter 1C, the first electric wire side connection body 31 is clamped by the pressing portion 224b and the contact portion 32b of each of the two first clamping bodies 224, and the second electric wire side connection body 41 is clamped by the pressing portion 225b and the contact portion 42b of each of the two second clamping bodies 225. In this instance, the contact portion 32b may be disposed to face only the pressing portion 224b of one of the first clamping bodies 224 in the electric wire clamping direction or disposed to face the respective pressing portions 224b of both the first clamping bodies 224 in the electric wire clamping direction. Similarly thereto, the contact portion 42b may be disposed to face only the pressing portion 225b of one of the second clamping bodies 225 in the electric wire clamping direction or disposed to face the respective pressing portions 225b of both the second clamping bodies 225 in the electric wire clamping direction.

In addition, the locking projection 224c of one of the first clamping bodies 224 is formed to lock one end of the first electric wire side connection body 31 in the tube axis direction in the tube axis direction (FIG. 12). Further, the locking projection 224c of the other one of the first clamping bodies 224 is formed to lock the other end of the first electric wire side connection body 31 in the tube axis direction in the tube axis direction (FIG. 12). That is, in the noise filter 1C, the first electric wire side connection body 31 is clamped from both ends in the tube axis direction using two locking projections 224c. Further, the locking projection 225c of one of the second clamping bodies 225 is formed to lock one end of the second electric wire side connection body 41 in the tube axis direction in the tube axis direction (FIG. 12). Further, the locking projection 225c of the other one of the second clamping bodies 225 is formed to lock the other end of the second electric wire side connection body 41 in the tube axis direction in the tube axis direction (FIG. 12). That is, in the noise filter 1C, the second electric wire side connection body 41 is clamped from both ends in the tube axis direction using two locking projections 225c. In this way, in the noise filter 1C, the first electric wire side connection body 31, the first electric wire WE1, the second electric wire side connection body 41, and the second electric wire WE2 in the accommodation chamber 220a of the housing 220 can be positioned by the two locking projections 224c and the two locking projections 225c. Therefore, the noise filter 1C can further improve the quality of conduction between the first electric wire WE1 and the second electric wire WE2, and the filter circuit 10.

Noise Filter 1D

The noise filter 1 of the present embodiment may be configured as a noise filter 1D in which a first electric connection structure 330 including a first circuit side connection body 332 and a second electric connection structure 340 including a second circuit side connection body 342 described below is provided in place of the first electric connection structure 30 including the first circuit side connection body 32 (12b) and the second electric connection structure 40 including the second circuit side connection body 42 (13b) described above (FIG. 13 and FIG. 14). This noise filter 1D can obtain a similar effect to that of the above-mentioned noise filter 1A, and can obtain an effect described later by the first circuit side connection body 332 and the second circuit side connection body 342.

Figure 13:
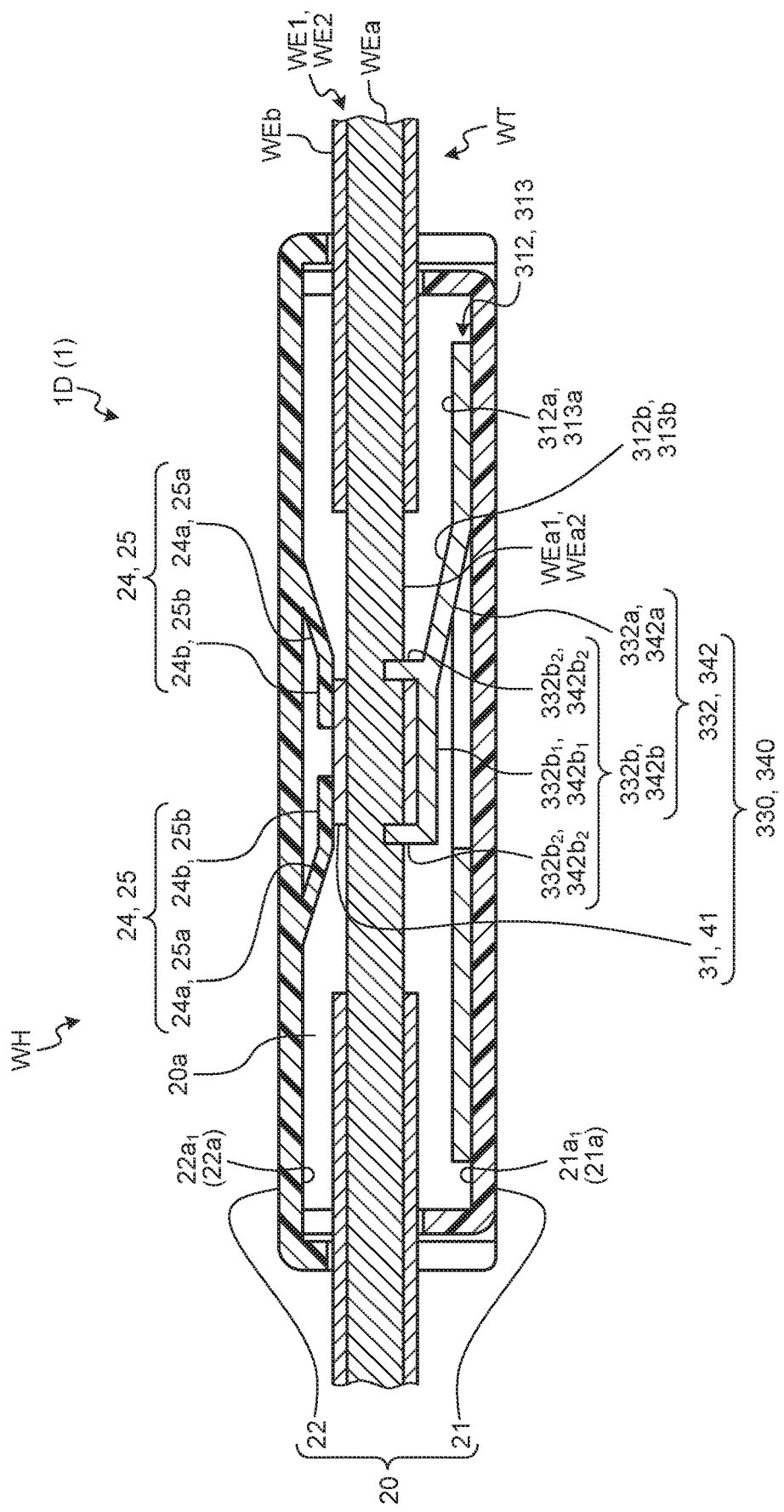
FIG. 13 is a perspective view illustrating a third modification of the noise filter and the wire harness of the embodiment.
Figure 15:
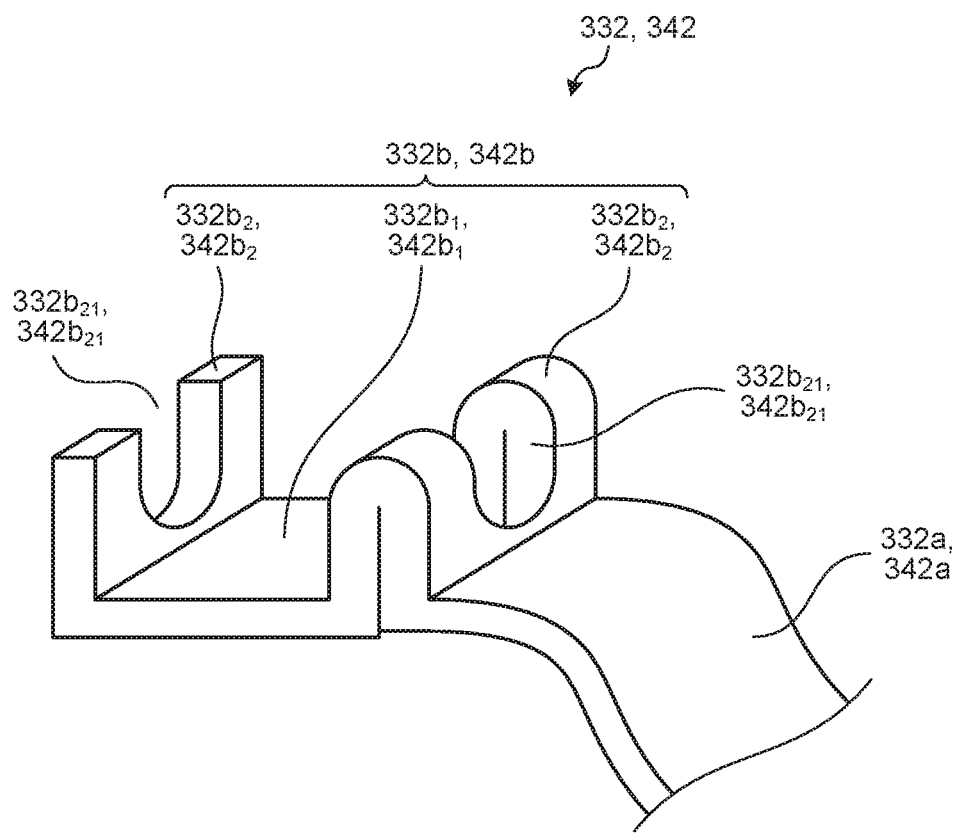
FIG. 15 is a perspective view illustrating first and second circuit connection bodies of the fourth modification.

As in the previous example, the first circuit side connection body 332 is provided on a first circuit connection member 312 including a main body 312a and a first circuit side connection body 312b, and uses the first circuit side connection body 312b (FIG. 13 and FIG. 14). The first circuit side connection body 332 has an elastic piece 332a similar to the first circuit side connection body 32 (12b) described above and has a contact portion 332b provided at a free end of the elastic piece 332a and directly electrically connected to the first electric wire side connection body 31 (FIG. 13 to FIG. 15). The contact portion 332b in this example has a rectangular piece $332b_1$ similar to the contact portion 32b in contact with an outer peripheral surface of the first electric wire side connection body 31, and two locking projections $332b_2$ projected from the piece $332b_1$ to interpose both ends of the first electric wire side connection body 31 in the tube axis direction in the tube axis direction (FIG. 13 to FIG. 15). An arc-shaped notch $332b_{21}$ into which the intermediate connection portion WEa1 of the first electric wire WE1 is inserted is provided in each of the locking projections $332b_2$ in this example (FIG. 15). The first circuit side connection body 332 forms the first electric connection structure 330 as a pair with the first electric wire side connection body 31 described above.

Similarly to the previous example, the second circuit side connection body 342 is provided on a second circuit connection member 313 having a main body 313a and a second circuit side connection body 313b, and uses the second circuit side connection body 313b (FIG. 13 and FIG. 14). The second circuit side connection body 342 has an elastic piece 342a similar to the second circuit side connection body 42 (13b) described above and has a contact portion 342b provided at a free end of the elastic piece 342a and directly electrically connected to the second electric wire side connection body 41 (FIG. 13 to FIG. 15). The contact portion 342b in this example has a rectangular piece $342b_1$ similar to the contact portion 42b in contact with an outer peripheral surface of the second electric wire side connection body 41, and two locking projections $342b_2$ projected from the piece $342b_1$ to interpose both ends of the second electric wire side connection body 41 in the tube axis direction in the tube axis direction (FIG. 13 to FIG. 15). An arc-shaped notch $342b_{21}$ into which the intermediate connection portion WEa2 of the second electric wire WE2 is inserted is provided in each of the locking projections $342b_2$ in this example (FIG. 15). The second circuit side connection body 342 forms the second electric connection structure 340 as a pair with the second electric wire side connection body 41 described above.

The noise filter 1D can position the first electric wire side connection body 31, the first electric wire WE1, the second electric wire side connection body 41, and the second electric wire WE2 in the accommodation chamber 20a of the housing 20 by the two locking projections $332b_2$ and the two locking projections $342b_2$. Therefore, the noise filter 1D can further improve the quality of conduction between the first electric wire WE1 and the second electric wire WE2, and the filter circuit 10.

Modification of Noise Filter 1A

Incidentally, in the noise filter 1A described above, although not illustrated, the respective contact portions 32b and 42b may be formed as terminal portions, and the respective terminal portions (not illustrated) may be provided in the first electric wire side connection body 31 and the second electric wire side connection body 41. Each of the terminal portions has a male or female terminal shape, and for example, a terminal shape described in Japanese Patent Application Laid-open No. 2012-039201 described above may be used. In the noise filter 1A in this case, when the contact portion 32b as a terminal portion and the terminal portion of the first electric wire side connection body 31 are fit to each other, and the contact portion 42b as a terminal portion and the terminal portion of the second electric wire side connection body 41 are fit to each other, mutual electric connection can be ensured, and the first electric wire side connection body 31, the first electric wire WE1, the second electric wire side connection body 41, and the second electric wire WE2 in the accommodation chamber 20a of the housing 20 can be positioned. Therefore, the noise filter 1A can further improve the quality of conduction between the first electric wire WE1 and the second electric wire WE2, and the filter circuit 10.

Noise Filter 1E

The noise filter 1 of the present embodiment may be configured as a noise filter 1E in which a first electric connection structure 430 and a second electric connection structure 440 described below are provided in place of the first electric connection structure 30 and the second electric connection structure 40 described above (FIG. 16). This noise filter 1E can obtain a similar effect to that of the above-mentioned noise filter 1A, and can obtain an effect described later by the first electric connection structure 430 and the second electric connection structure 440.

The first electric connection structure 430 includes the first circuit side connection body 32 without the first electric wire side connection body 31. The first electric connection structure 430 clamps the intermediate connection portion WEa1 of the first electric wire WE1 by the pressing portion 24b and the contact portion 32b of the first circuit side connection body 32 in cooperation with the first clamping body 24 of the second housing member 22.

That is, the first circuit side connection body 32 in this example is formed to be directly electrically connected to the intermediate connection portion WEa1 of the first electric wire WE1. The first circuit side connection body 32 is directly electrically connected to the intermediate connection portion WEa1 of the first electric wire WE1 by an elastic force directly applied to the intermediate connection portion WEa1. Further, the first clamping body 24 in this example is formed to directly clamp the intermediate connection portion WEa1 of the first electric wire WE1 between the first clamping body 24 and the contact portion 32b of the first circuit side connection body 32.

In addition, the second electric connection structure 440 includes the second circuit side connection body 42 without the second electric wire side connection body 41. The second electric connection structure 440 clamps the intermediate connection portion WEa2 of the second electric wire WE2 by the pressing portion 25b and the contact portion 42b of the second circuit side connection body 42 in cooperation with the second clamping body 25 of the second housing member 22.

That is, the second circuit side connection body 42 in this example is formed to be directly electrically connected to the intermediate connection portion WEa2 of the second electric wire WE2. The second circuit side connection body 42 is directly electrically connected to the intermediate connection portion WEa2 of the second electric wire WE2 by an elastic force directly applied to the intermediate connection portion WEa2. Further, the second clamping body 25 in this example is formed to directly clamp the intermediate connection portion WEa2 of the second electric wire WE2 between the second clamping body 25 and the contact portion 42b of the second circuit side connection body 42.

Here, it is desirable to use the noise filter 1E in a case of applying the first electric wire WE1 and the second electric wire WE2 whose core wire WEa is a single wire such as a round conductor. A reason therefor is that in a case in which the core wire WEa is an aggregate obtained by bundling a plurality of strands in each of the intermediate connection portions WEa1 and WEa2, the respective strands may be separated at the time of being clamped by the pressing portions 24b and 25b and the contact portions 32b and 42b, and thus it may not be possible to receive a pushing force from the pressing portions 24b and 25b and an elastic force from the contact portions 32b and 42b. That is, a reason therefor is that in a case in which the core wire WEa is an aggregate of a plurality of strands, an appropriate contact load may not be applied to each of the intermediate connection portions WEa1 and WEa2, and there is a possibility that conduction between each of the intermediate connection portions WEa1 and WEa2 and the filter circuit 10 may not be smoothly performed. However, even when the core wire WEa is an aggregate of a plurality of strands, the first electric wire WE1 and the second electric wire WE2 can be applied to the noise filter 1E without including the first electric wire side connection body 31 or the second electric wire side connection body 41 by welding the plurality of strands in the intermediate connection portions WEa1 and WEa2 using thermo-compression bonding, etc. and fixing the plurality of strands collectively (FIG. 16).

In this way, since the number of parts is reduced in the first electric connection structure 430 and the second electric connection structure 440, the noise filter 1E can attempt weight reduction, improvement in assembling workability, and cost reduction.

Noise Filter 1F

The noise filter 1 of the present embodiment may be configured as a noise filter 1F in which a second housing member 522 having a first clamping body 524 and a second clamping body 525, a first electric connection structure 530, and a second electric connection structure 540 described below are provided in place of the second housing member 22 having the first clamping body 24 and the second clamping body 25, the first electric connection structure 30, and the second electric connection structure 40 described above (FIG. 17 and FIG. 18). This noise filter 1F can obtain a similar effect to that of the above-mentioned noise filter 1A, and can obtain an effect described later by the first clamping body 524, the second clamping body 525, the first electric connection structure 430, and the second electric connection structure 440.

Figure 18:
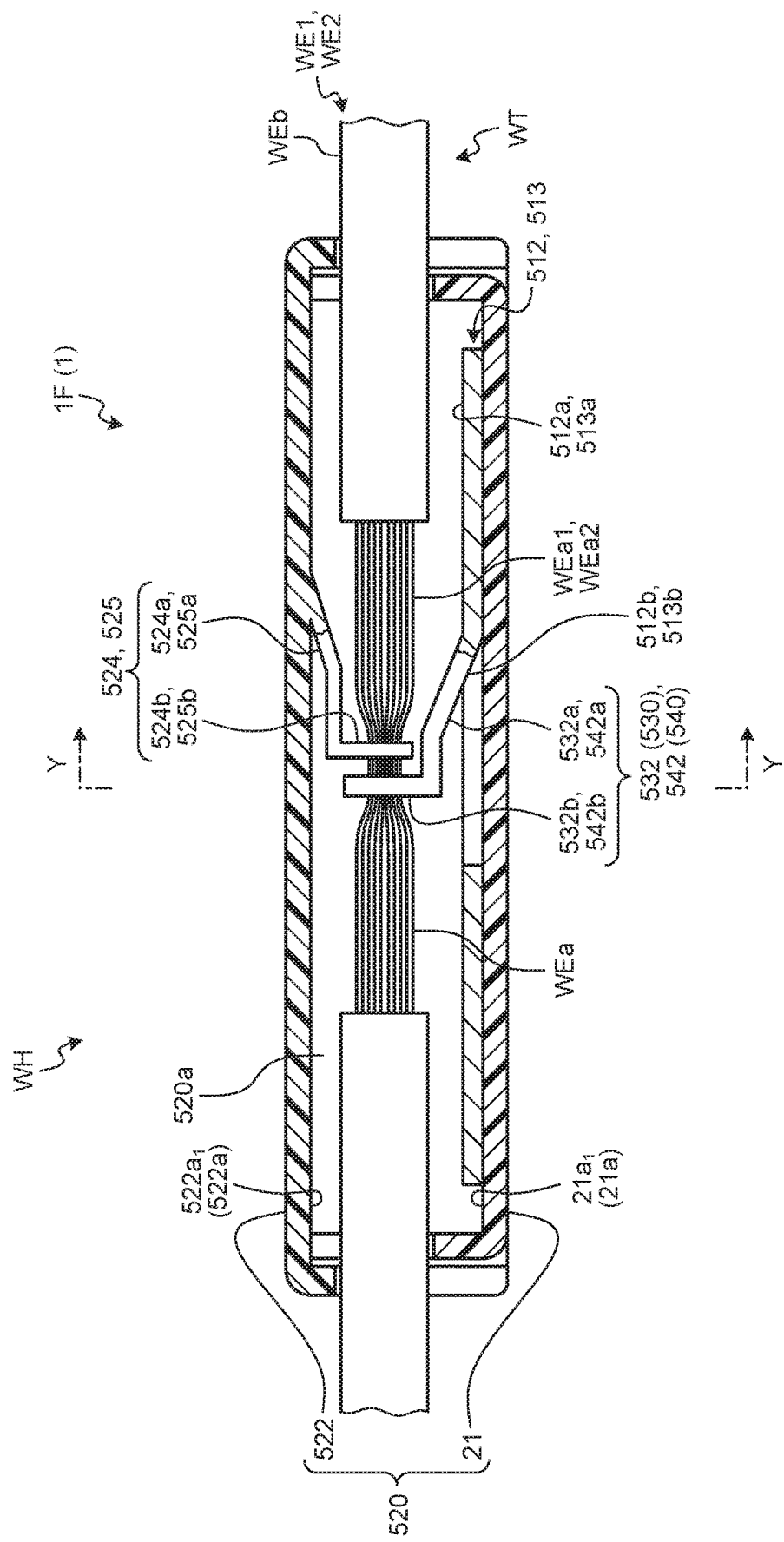
FIG. 18 is a perspective view illustrating the sixth modification of the noise filter and the wire harness of the embodiment.

The second housing member 522 is obtained by replacing the first clamping body 24 with the first clamping body 524 and replacing the second clamping body 25 with the second clamping body 525 in the second housing member 22 described above. The second housing member 522 is included in a housing 520 having an accommodation chamber 520a formed inward by being fit to the first housing member 21 described above (FIG. 18). At least one first clamping body 524 and at least one second clamping body 525 are provided on an inner wall surface $522a_1$ of a main wall body 522a of the second housing member 522 (FIG. 17 and FIG. 18). Here, one first clamping body 524 and one second clamping body 525 are provided.

Figure 19:
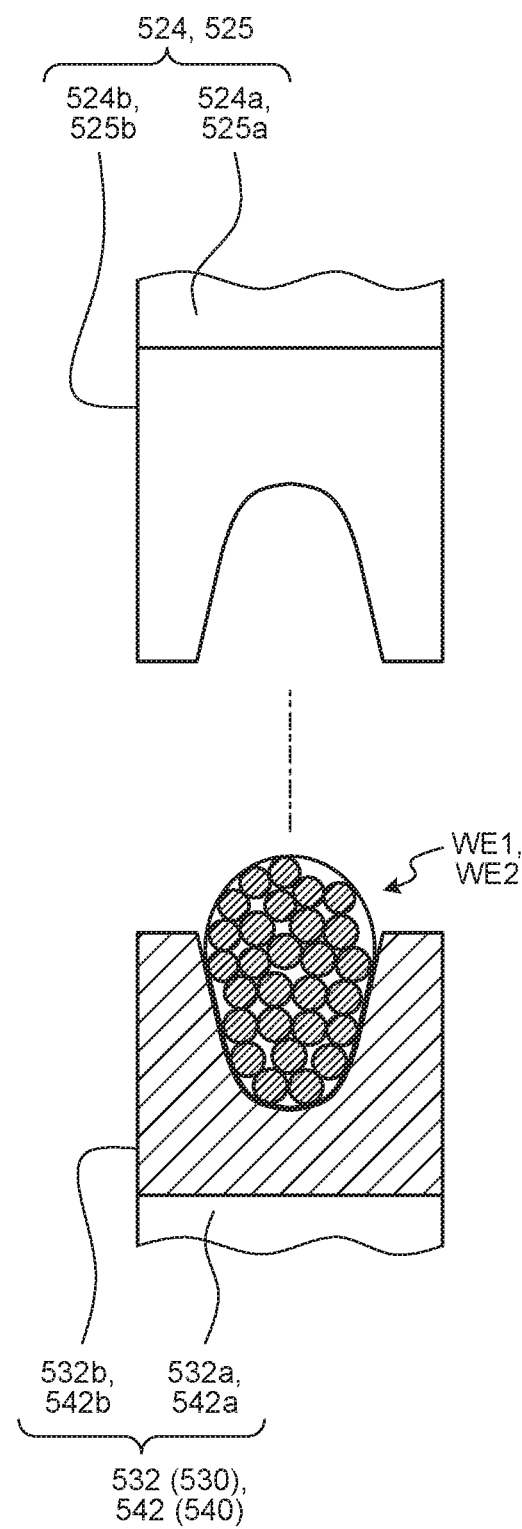
FIG. 19 is a cross-sectional view taken along Y-Y line of FIG. 17.

The first clamping body 524 has a piece 524a similar to that of the first clamping body 24 described above, and has a pressing portion 524b provided at a free end of the piece 524a to come into contact with and press the intermediate connection portion WEa1 of the first electric wire WE1 (FIG. 17 and FIG. 18). The pressing portion 524b is formed in a U-shape. The pressing portion 524b is open to a side of the intermediate connection portion WEa1 of the first electric wire WE1, and inserts the intermediate connection portion WEa1 inward from the opening. In addition, the second clamping body 525 has a piece 525a similar to that of the second clamping body 25 described above, and has a pressing portion 525b provided at a free end of the piece 525a to come into contact with and press the intermediate connection portion WEa2 of the second electric wire WE2 (FIG. 17 and FIG. 18). The pressing portion 525b is formed in a U-shape (FIG. 19). The pressing portion 525b is open to a side of the intermediate connection portion WEa2 of the second electric wire WE2, and inserts the intermediate connection portion WEa2 inward from the opening.

The first electric connection structure 530 includes a first circuit side connection body 532 without having the first electric wire side connection body 31 described above (FIG. 17 and FIG. 18). As in the previous example, the first circuit side connection body 532 is provided on a first circuit connection member 512 having a main body 512a and a first circuit side connection body 512b, and uses the first circuit side connection body 512b (FIG. 17 and FIG. 18). The first circuit side connection body 532 has an elastic piece 532a similar to that of the first circuit side connection body 32 (12b) described above, and has a contact portion 532b provided at a free end of the elastic piece 532a and directly electrically connected to the intermediate connection portion WEa1 of the first electric wire WE1 (FIG. 17 and FIG. 18). The contact portion 532b in this example has a U-shape (FIG. 19). The contact portion 532b is open to a side of the intermediate connection portion WEa1 of the first electric wire WE1, and inserts the intermediate connection portion WEa1 inward from the opening.

In addition, the second electric connection structure 540 includes a second circuit side connection body 542 without having the second electric wire side connection body 41 described above (FIG. 17 and FIG. 18). As in the previous example, the second circuit side connection body 542 is provided on a second circuit connection member 513 having a main body 513a and a second circuit side connection body 513b, and uses the second circuit side connection body 513b (FIG. 17 and FIG. 18). The second circuit side connection body 542 has an elastic piece 542a similar to that of the second circuit side connection body 42 (13b) described above, and has a contact portion 542b provided at a free end of the elastic piece 542a and directly electrically connected to the intermediate connection portion WEa2 of the second electric wire WE2 (FIG. 17 and FIG. 18). The contact portion 542b in this example has a U-shape (FIG. 19). The contact portion 542b is open to a side of the intermediate connection portion WEa2 of the second electric wire WE2, and inserts the intermediate connection portion WEa2 inward from the opening.

That is, the first circuit side connection body 532 in this example is formed to be directly electrically connected to the intermediate connection portion WEa1 of the first electric wire WE1. The first circuit side connection body 532 is directly electrically connected to the intermediate connection portion WEa1 of the first electric wire WE1 by an elastic force directly applied to the intermediate connection portion WEa1. In addition, the first clamping body 524 in this example is formed to directly clamp the intermediate connection portion WEa1 of the first electric wire WE1 between the first clamping body 524 and the contact portion 532b of the first circuit side connection body 532. In addition, the second circuit side connection body 42 in this example is formed to be directly electrically connected to the intermediate connection portion WEa2 of the second electric wire WE2. The second circuit side connection body 42 is directly electrically connected to the intermediate connection portion WEa2 of the second electric wire WE2 by an elastic force directly applied to the intermediate connection portion WEa2. In addition, the second clamping body 25 in this example is formed to directly clamp the intermediate connection portion WEa2 of the second electric wire WE2 between the second clamping body 25 and the contact portion 42b of the second circuit side connection body 42.

Figure 20:
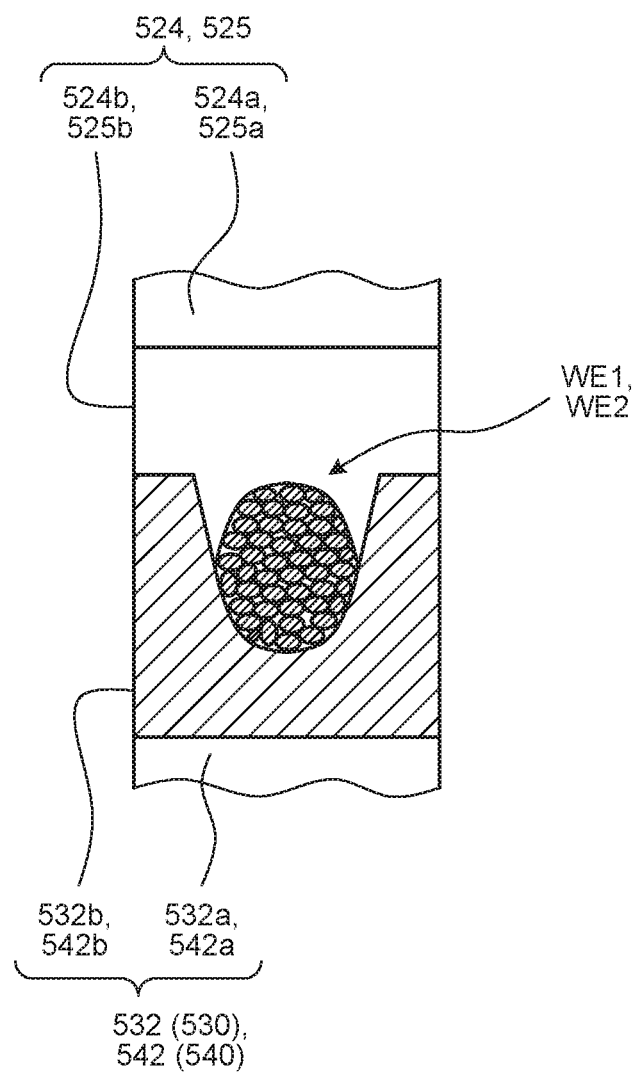
FIG. 20 is a cross-sectional view taken along Y-Y line of FIG. 18.

When the first housing member 21 and the second housing member 22 are fit to each other, the pressing portion 524b and the contact portion 532b insert the intermediate connection portion WEa1 of the first electric wire WE1 into the respective U-shapes inward from the respective openings (FIG. 20), and are disposed to face each other in the axial direction of the intermediate connection portion WEa1 (FIG. 18). The pressing portion 524b and the contact portion 532b are disposed close to each other in the axial direction. In this way, the pressing portion 524b and the contact portion 532b can interpose the intermediate connection portion WEa1 in the electric wire clamping direction by bottom portions of the respective U-shapes, and exert a stable contact load on the intermediate connection portion WEa1. In addition, the pressing portion 524b and the contact portion 532b can surround the intermediate connection portion WEa1 of the first electric wire WE1 on the inner side of the respective U-shapes (FIG. 20). Therefore, in the noise filter 1F, the embodiment can be applied to the first electric wire WE1 in which the core wire WEa is a single wire, and can be applied to the first electric wire WE1 in which the core wire WEa is an aggregate of a plurality of strands since separation of the strands can be suppressed. In addition, the first electric wire WE1 may be obtained by welding and solidifying the plurality of strands in the intermediate connection portion WEa1 described above using thermo-compression bonding, etc.

In addition, when the first housing member 21 and the second housing member 22 are fit to each other, the pressing portion 525b and the contact portion 542b insert the intermediate connection portion WEa2 of the second electric wire WE2 into the respective U-shapes inward from the respective openings (FIG. 20), and are disposed to face each other in the axial direction of the intermediate connection portion WEa2 (FIG. 18). The pressing portion 525b and the contact portion 542b are disposed close to each other in the axial direction. In this way, the pressing portion 525b and the contact portion 542b can interpose the intermediate connection portion WEa2 in the electric wire clamping direction by bottom portions of the respective U-shapes, and exert a stable contact load on the intermediate connection portion WEa2. In addition, the pressing portion 525b and the contact portion 542b can surround the intermediate connection portion WEa2 of the second electric wire WE2 on the inner side of the respective U-shapes (FIG. 20). Therefore, in the noise filter 1F, the embodiment can be applied to the second electric wire WE2 in which the core wire WEa is a single wire, and can be applied to the second electric wire WE2 in which the core wire WEa is an aggregate of a plurality of strands since separation of the strands can be suppressed. In addition, the second electric wire WE2 may be obtained by welding and solidifying the plurality of strands in the intermediate connection portion WEa2 described above using thermo-compression bonding, etc.

In this way, since the number of parts is reduced in the first electric connection structure 530 and the second electric connection structure 540, the noise filter 1F can attempt weight reduction, improvement in assembling workability, and cost reduction.

Modification of Noise Filter 1A

Incidentally, in the noise filter 1A described above, although not illustrated, the respective contact portions 32b and 42b may be formed to have pressure welding blades disposed to face each other at an interval. A slit is formed in the coating WEb of the first electric wire WE1 inserted therebetween, and the pressure welding blade of the contact portion 32b is wedged into the core wire WEa of the first electric wire WE1. Therefore, the contact portion 32b can pressure-weld and fix the first electric wire WE1 in an electrically connected state by each pressure welding blade. In addition, a slit is formed in the coating WEb of the second electric wire WE2 inserted therebetween, and the pressure welding blade of the contact portion 42b is wedged into the core wire WEa of the second electric wire WE2. Therefore, the contact portion 42b can pressure-weld and fix the second electric wire WE2 in an electrically connected state by each pressure welding blade.

In this case, the pieces 32a and 42a of the first and second circuit side connection bodies 32 and 42 may have elasticity or may not have elasticity. Further, in this case, the second housing member 22 may have the first clamping body 24 or the second clamping body 25, and may not have the first clamping body 24 or the second clamping body 25. However, in the noise filter 1A, a pressure-welded and fixed state can be easily maintained by having the first clamping body 24 or the second clamping body 25.

As described above, in the noise filter 1 (1A, 1B, 1C, 1D, 1E, and 1F) of the present embodiment, the filter circuit 10 is interposed between the intermediate connection portion WEa1 of the first electric wire WE1 and the intermediate connection portion WEa2 of the second electric wire WE2 bundled in the trunk line WT of the wire harness WH, and the filter circuit 10 is electrically connected to the respective intermediate connection portions WEa1 and WEa2. Therefore, the noise filter 1 (1A, 1B, 1C, 1D, 1E, and 1F) of the present embodiment becomes a simple noise filter not requiring adjustment of the filter circuit characteristic taking the noise component of the intermediate electric wire into consideration unlike the past. Furthermore, the noise filter 1 (1A, 1B, 1C, 1D, 1E, and 1F) of the present embodiment may not use a ground terminal, and thus can attempt reduction in size or weight of the frame. Further, the noise filter 1 (1A, 1B, 1C, 1D, 1E, and 1F) of the present embodiment uses elasticity for electric connection between the first electric wire WE1 and the second electric wire WE2, and the filter circuit 10, and thus can attempt reduction in size of the frame and suppression of a steep rise in cost and becomes a noise filter having high versatility which can cope with electric wires having various outer diameters (the first electric wire WE1 and the second electric wire WE2). In addition, the noise filter 1 (1A, 1B, 1C, 1D, 1E, and 1F) of the present embodiment can absorb a dimensional variation of each component and exert a stable contact load on the intermediate connection portion WEa1 of the first electric wire WE1 and the intermediate connection portion WEa2 of the second electric wire WE2 by such a connection structure using elasticity, thereby attempting improvement in the conduction quality. In addition, the wire harness WH of the present embodiment includes such a noise filter 1 (1A, 1B, 1C, 1D, 1E, and 1F), and can achieve an effect obtained by this noise filter 1 (1A, 1B, 1C, 1D, 1E, and 1F).

First Modified Example

Figure 21:
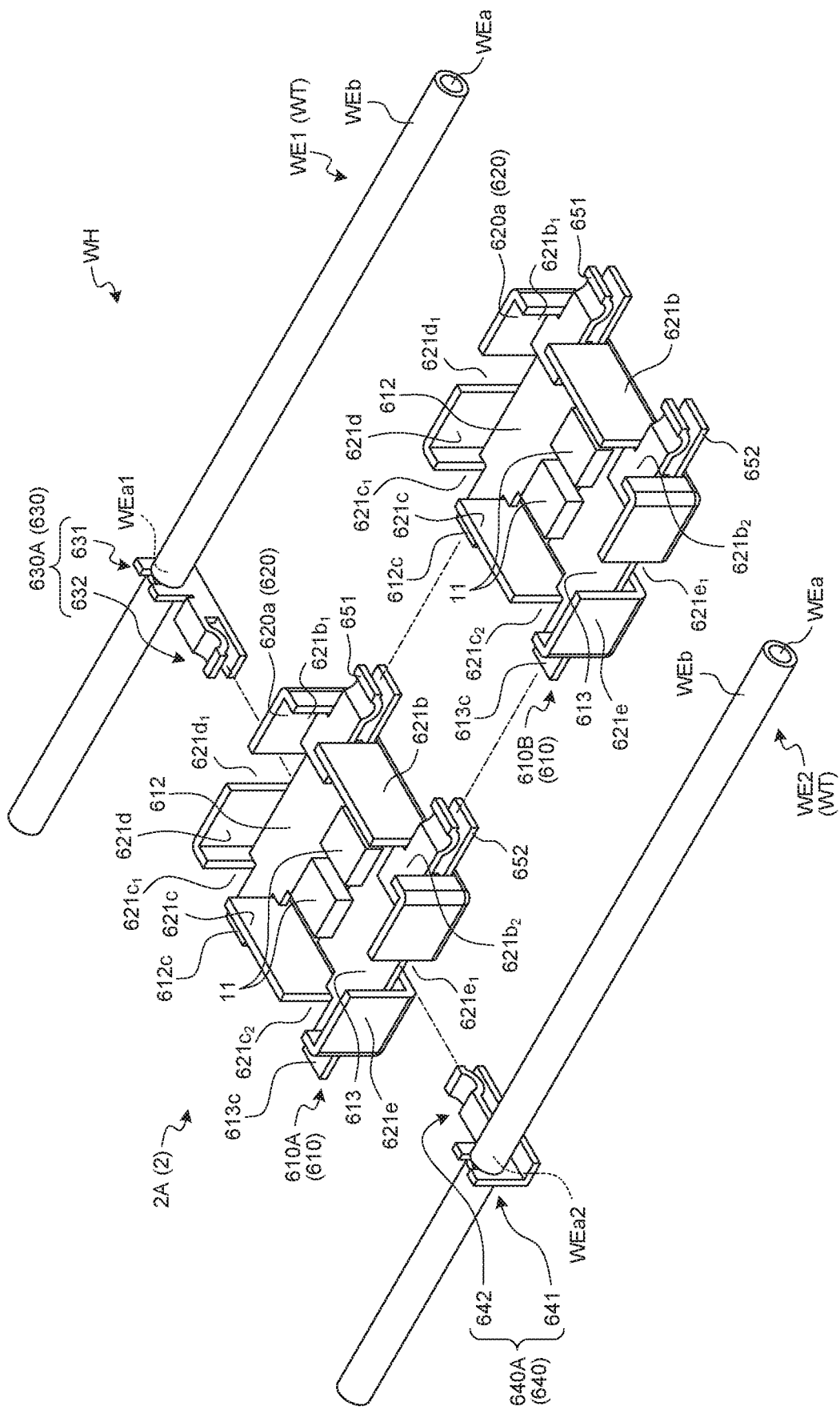
FIG. 21 is an exploded perspective view illustrating a noise filter and a wire harness of a first modified example.
Figure 22:
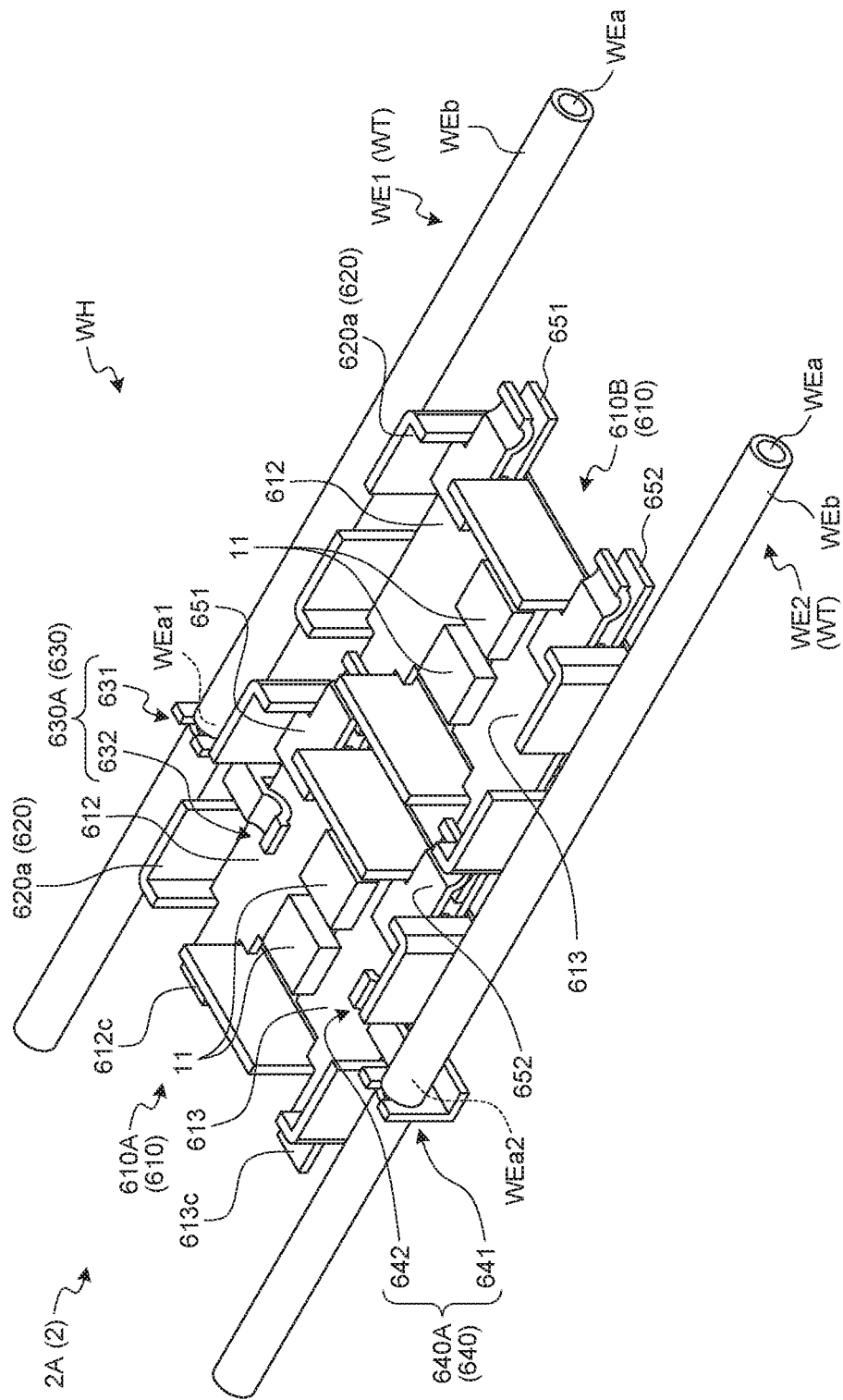
FIG. 22 is a perspective view illustrating the noise filter and the wire harness of the first modified example.

Reference symbol 2 of FIG. 21 and FIG. 22 denotes a noise filter of the present modified example. This noise filter 2 is a noise reduction device in which a plurality of electrically connected filter circuits is provided and the intermediate connection portion WEa1 of the first electric wire WE1 and the intermediate connection portion WEa2 of the second electric wire WE2 are electrically connected to one of the respective filter circuits. The respective filter circuits may have the same filter circuit characteristic, or may correspond to combinations of filter circuits having a plurality of types of filter circuit characteristics.

Noise Filter 2A

Hereinafter, a noise filter 2A will be described as an example of the noise filter 2 (FIG. 21 and FIG. 22).

The noise filter 2A includes a plurality of filter circuits 610 for reducing noise components (FIG. 21 and FIG. 22), electrically connects the respective filter circuits 610 to each other, and electrically connects the intermediate connection portion WEa1 of the first electric wire WE1 and the intermediate connection portion WEa2 of the second electric wire WE2 to one of the filter circuits 610. The plurality of filter circuits 610 are roughly classified into one main filter circuit 610A electrically connected to each of the intermediate connection portions WEa1 and WEa2 and the other remaining sub-filter circuits 610B (see FIG. 21 and FIG. 22). At least one sub-filter circuit 610B is connected to the main filter circuit 610A.

Each of the filter circuits 610 includes at least one noise reduction element 11 for reducing a noise component, a conductive first circuit connection member 612 to which a first element connection portion of the noise reduction element 11 is electrically connected, and a conductive second circuit connection member 613 to which a second element connection portion of the noise reduction element 11 is electrically connected (FIG. 21 and FIG. 22).

The filter circuit 610 in this example includes two capacitors as noise reduction elements 11 and is configured to be able to reduce noise using these two capacitors. Although not illustrated, the two noise reduction elements 11 are covered with an insulating mold body. The mold body may be molded to collectively cover the noise reduction elements 11 of each of the two or more filter circuits 610.

The first circuit connection member 612 and the second circuit connection member 613 are conductive members similar to the first circuit connection member 12 and the second circuit connection member 13 described above, and each of the circuit connection members is molded as a plate-shaped bus bar using a conductive material such as metal. In this example, each of the first circuit connection member 612 and the second circuit connection member 613 is molded in a flat plate shape. In the filter circuit 610, the first circuit connection member 612 and the second circuit connection member 613 are arranged side by side on the same plane. Further, in the filter circuit 610, the first element connection portion of the noise reduction element 11 is physically and electrically connected to the first circuit connection member 612, and the second element connection portion of the noise reduction element 11 is physically and electrically connected to the second circuit connection member 613.

The noise filter 2A includes a housing 620 that accommodates the filter circuit 610 (FIG. 21 and FIG. 22). The housing 620 is molded using an insulating material such as a synthetic resin. The housing 620 is molded in a box shape having a main wall body (not illustrated) on which the filter circuit 610 is installed, and a peripheral wall body 621b to 621e erected from a peripheral edge portion of the main wall body, and an inner space thereof is used as an accommodation chamber 620a of the filter circuit 610 (FIG. 21). The housing 620 in this example has a rectangular flat plate-shaped main wall body, and flat plate-shaped first to fourth peripheral wall bodies 621*b* to 621*e* suspended from four sides of the main wall body, respectively.

Furthermore, the noise filter 2A includes a first electric connection structure 630 for electrically connecting the intermediate connection portion WEa1 of the first electric wire WE1 to the first circuit connection member 612 of the main filter circuit 610A, and a second electric connection structure 640 for electrically connecting the intermediate connection portion WEa2 of the second electric wire WE2 to the second circuit connection member 613 of the main filter circuit 610A (FIG. 21 and FIG. 22).

Figure 23:
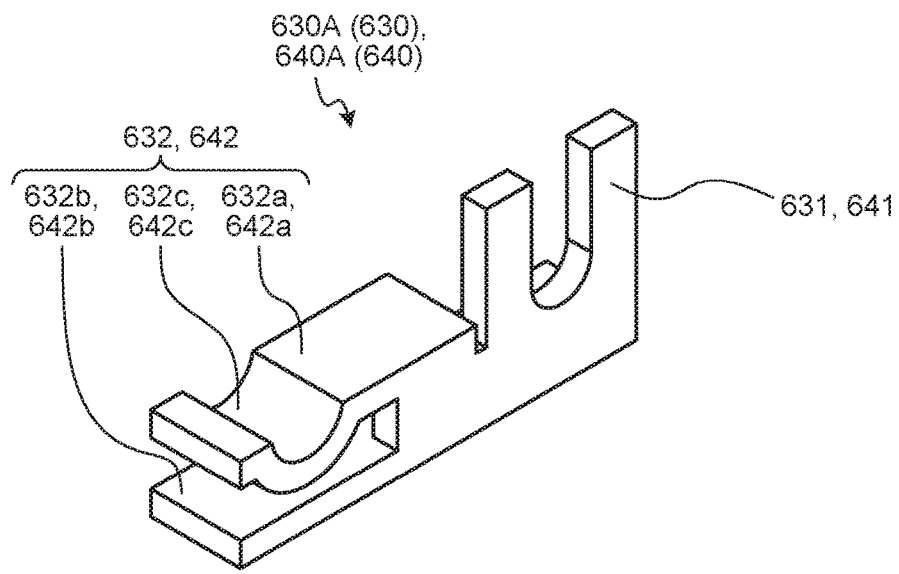
FIG. 23 is a perspective view illustrating a first electric connection member and a second electric connection member of the first modified example.

The first electric connection structure 630 in the present modified example is molded as one connection member (hereinafter, referred to as a "first electric connection member") 630A using a conductive material such as metal. The first electric connection member 630A has a first electric wire side connection portion 631 physically and electrically connected to the intermediate connection portion WEa1 of the first electric wire WE1, and a first circuit side connection portion 632 physically and electrically connected to the first circuit connection member 612 of the main filter circuit 610A (FIG. 21 to FIG. 23).

For example, the first electric wire side connection portion 631 is formed to have pressure welding blades disposed to face each other at an interval. A slit is formed in the coating WEb of the first electric wire WE1 inserted therebetween, and the pressure welding blade of the first electric wire side connection portion 631 is wedged into the core wire WEa of the first electric wire WE1. In this way, the first electric wire WE1 is pressure-welded and fixed in an electrically connected state.

The first circuit side connection portion 632 is formed to have a shape attachable to and detachable from the first circuit connection member 612 of the main filter circuit 610A. For example, the first circuit side connection portion 632 is physically and electrically connected the first circuit connection member 612 by clamping the first circuit connection member 612. The first circuit side connection portion 632 in this example includes a first piece 632*a* and a second piece 632*b* having a single body shape in which planes are disposed to face each other at an interval (FIG. 23). The first piece 632*a* is disposed to face one plane of the first circuit connection member 612. The second piece 632*b* is disposed to face the other plane of the first circuit connection member 612. In the first circuit side connection portion 632, a contact portion 632*c* projected toward the first circuit connection member 612 is provided on at least one of the first piece 632*a* and the second piece 632*b* (FIG. 23). In this example, the contact portion 632*c* is provided on the first piece 632*a*, and the first circuit connection member 612 is clamped by the contact portion 632*c* and the plane of the second piece 632*b*, thereby physically and electrically connecting the first circuit side connection portion 632 to the first circuit connection member 612. In this example, an arc-shaped portion obtained by bending a part of the first piece 632*a* in an arc shape is used as the contact portion 632*c*. However, for example, a bulged portion bulged out in a hemispherical shape from the first piece 632*a* may be used as the contact portion 632*c*.

In the first electric connection member 630A, the first circuit connection member 612 is inserted between the first piece 632*a* and the second piece 632*b* along a direction orthogonal to an arrangement direction of adjacent filter circuits 610. In this way, the first electric connection member 630A causes the first circuit side connection portion 632 to clamp the first circuit connection member 612. In addition, the first electric connection member 630A can remove the first circuit side connection portion 632 from the first circuit connection member 612.

For example, first, the first electric connection member 630A connects the intermediate connection portion WEa1 of the first electric wire WE1 to the first electric wire side connection portion 631, and then interpose the first circuit connection member 612 by the first circuit side connection portion 632.

The first electric connection member 630A in this example is extended along a plane of the first circuit connection member 612 in a state of clamping the first circuit connection member 612, and the first electric wire side connection portion 631 and the first circuit side connection portion 632 are disposed along an extending direction thereof. The first electric wire side connection portion 631 in this example is formed to align an axis line of the first electric wire WE1 in a direction perpendicular to the extending direction and along the plane of the first circuit connection member 612. However, in the first electric connection member 630A, an arc-shaped portion, a bent portion, etc. may be provided and bent between the first electric wire side connection portion 631 and the first circuit side connection portion 632, and the first electric wire side connection portion 631 may be offset with respect to the first circuit connection member 612. In this way, the noise filter 2A and the wire harness WH can take interference measures with respect to a peripheral part in a state of being assembled into the vehicle body.

Here, the first circuit side connection portion 632 in this example clamps the first circuit connection member 612 in the accommodation chamber 620*a* of the housing 620. Therefore, a main wall body or a third peripheral wall body 621*d* of the housing 620 is provided with a notch 621$d_1$ for disposing the first electric wire side connection portion 631 on the outside of the housing 620 and storing the first circuit side connection portion 632 in the accommodation chamber 620*a* (FIG. 21).

The second electric connection structure 640 in the present modified example is molded as one connection member (hereinafter, referred to as a "second electric connection member") 640A using a conductive material such as metal. The second electric connection member 640A has a second electric wire side connection portion 641 physically and electrically connected to the intermediate connection portion WEa2 of the second electric wire WE2, and a second circuit side connection portion 642 physically and electrically connected to the second circuit connection member 613 of the main filter circuit 610A (FIG. 21 to FIG. 23).

For example, similarly to the first electric wire side connection portion 631, the second electric wire side connection portion 641 is formed to have pressure welding blades disposed to face each other at an interval.

The second circuit side connection portion 642 is formed to have a shape attachable to and detachable from the second circuit connection member 613 of the main filter circuit 610A. For example, the second circuit side connection portion 642 is physically and electrically connected the second circuit connection member 613 by clamping the second circuit connection member 613. The second circuit side connection portion 642 in this example includes a first piece 642*a* and a second piece 642*b* having a single body shape in which planes are disposed to face each other at an interval (FIG. 23). The first piece 642*a* is disposed to face one plane of the second circuit connection member 613. The second piece 642*b* is disposed to face the other plane of the second circuit connection member 613. In the second circuit side connection portion 642, a contact portion 642c projected toward the second circuit connection member 613 is provided on at least one of the first piece 642a and the second piece 642b (FIG. 23). In this example, the contact portion 642c is provided on the first piece 642a, and the second circuit connection member 613 is clamped by the contact portion 642c and the plane of the second piece 642b, thereby physically and electrically connecting the second circuit side connection portion 642 to the second circuit connection member 613. In this example, an arc-shaped portion obtained by bending a part of the first piece 642a in an arc shape is used as the contact portion 642c. However, for example, a bulged portion bulged out in a hemispherical shape from the first piece 642a may be used as the contact portion 642c.

In the second electric connection member 640A, the second circuit connection member 613 is inserted between the first piece 642a and the second piece 642b along the direction orthogonal to the arrangement direction of the adjacent filter circuits 610. In this way, the second electric connection member 640A causes the second circuit side connection portion 642 to clamp the second circuit connection member 613. In addition, in the second electric connection member 640A, the second circuit side connection portion 642 may be removed from the second circuit connection member 613.

For example, first, the second electric connection member 640A connects the intermediate connection portion WEa2 of the second electric wire WE2 to the second electric wire side connection portion 641, and then interpose the second circuit connection member 613 by the second circuit side connection portion 642.

The second electric connection member 640A in this example is extended along a plane of the second circuit connection member 613 in a state of clamping the second circuit connection member 613, and the second electric wire side connection portion 641 and the second circuit side connection portion 642 are disposed along an extending direction thereof. The extending direction of the second electric connection member 640A is opposite to the extending direction of the first electric connection member 630A. The second electric wire side connection portion 641 in this example is formed to align an axis line of the second electric wire WE2 in a direction perpendicular to the extending direction and along the plane of the second circuit connection member 613. However, in the second electric connection member 640A, an arc-shaped portion, a bent portion, etc. may be provided and bent between the second electric wire side connection portion 641 and the second circuit side connection portion 642, and the second electric wire side connection portion 641 may be offset with respect to the second circuit connection member 613. In this way, the noise filter 2A and the wire harness WH can take interference measures with respect to a peripheral part in a state of being assembled into the vehicle body.

Here, the second circuit side connection portion 642 in this example clamps the second circuit connection member 613 in the accommodation chamber 620a of the housing 620. Therefore, a main wall body or a fourth peripheral wall body 621e of the housing 620 is provided with a notch 621e$_1$ for disposing the second electric wire side connection portion 641 on the outside of the housing 620 and storing the second circuit side connection portion 642 in the accommodation chamber 620a (FIG. 21).

Each of the first electric connection member 630A and the second electric connection member 640A in this example is formed by press-molding a metal plate and uses the same part.

In the noise filter 2A, the respective filter circuits 610 are connected such that the first circuit connection members 612 and the second circuit connection members 613 of all the filter circuits 610 are disposed on the same plane. In the noise filter 2A in this example, all the filter circuits 610 are arranged in series along the axial direction of each of the first electric wire WE1 and the second electric wire WE2.

The noise filter 2A includes a first coupling body 651 which can physically and electrically connect (that is, directly electrically connect) the first circuit connection members 612 of the adjacent filter circuits 610 to each other and can separate the first circuit connection members 612 of the adjacent filter circuits 610 from each other (FIG. 21 to FIG. 23). Furthermore, the noise filter 2A includes a second coupling body 652 which can physically and electrically connect (that is, directly electrically connect) the second circuit connection members 613 of the adjacent filter circuits 610 and can separate the second circuit connection members 613 of the adjacent filter circuits 610 from each other (FIG. 21 to FIG. 23). The first coupling body 651 and the second coupling body 652 are molded using a conductive material such as metal.

The first coupling body 651 may correspond to one member (first coupling member) molded to be attachable to and detachable from the respective first circuit connection members 612 of the adjacent filter circuits 610. Similarly thereto, the second coupling body 652 may correspond to one member (second coupling member) molded to be attachable to and detachable from the respective two second circuit connection members 613 of the coupling targets. The first coupling body 651 in this example is provided on one of the respective first circuit connection members 612 of the adjacent filter circuits 610 and formed to be electrically connectable to, attachable to, and detachable from the other one. In addition, the second coupling body 652 in this example is provided on one of the respective second circuit connection members 613 of the adjacent filter circuits 610 and formed to be electrically connectable to, attachable to, and detachable from the other one. In the noise filter 2A in this example, the first coupling body 651 is provided on the first circuit connection member 612 of one of the adjacent filter circuits 610, and the second coupling body 652 is provided on the second circuit connection member 613 of the one filter circuit 610.

Figure 24:
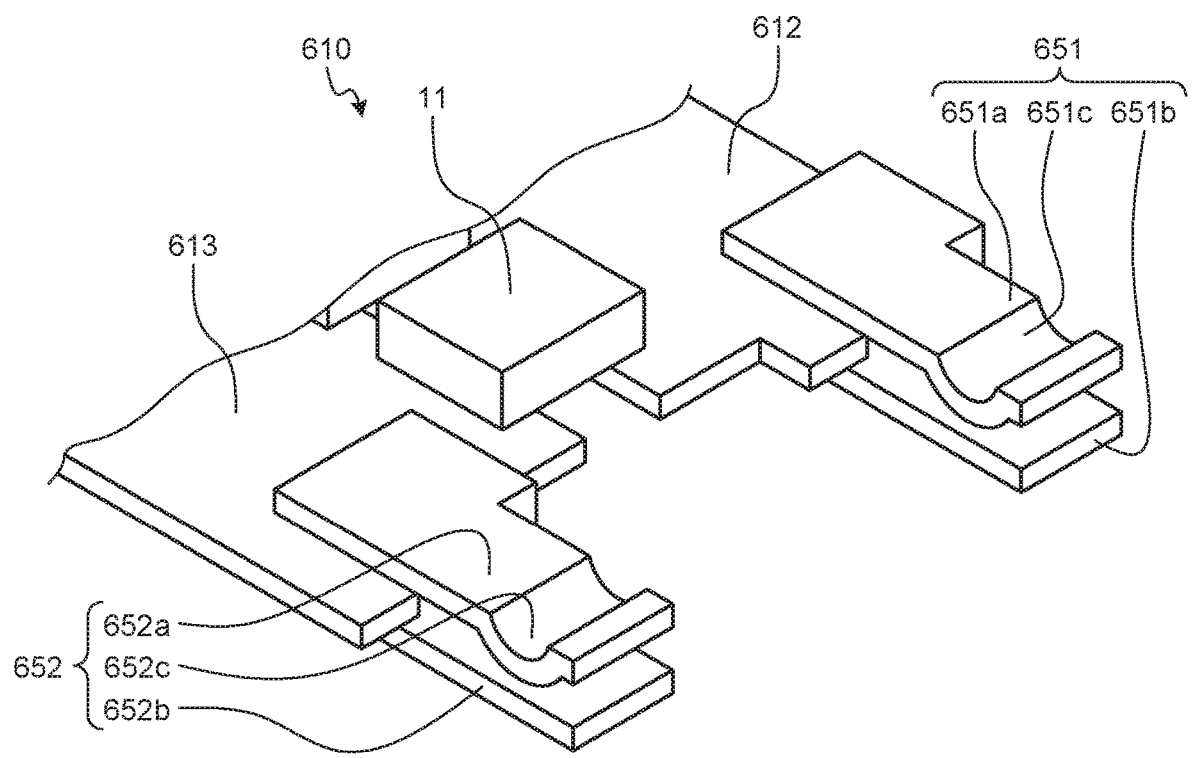
FIG. 24 is a perspective view illustrating a first coupling body and a second coupling body of the first modified example.

The first coupling body 651 includes a first piece 651a and a second piece 651b having a single body shape in which planes are disposed to face each other at an interval (FIG. 24). The first coupling body 651 may be formed by press-molding both the first piece 651a and the second piece 651b integrally with the first circuit connection member 612. Alternatively, the first coupling body 651 may be formed by press-molding one of the first piece 651a and the second piece 651b integrally with the first circuit connection member 612, molding the other one as a separate member, and fixing the other one to the first circuit connection member 612 using welding, etc. In this example, the latter first coupling body 651 is provided on the first circuit connection member 612, one end of the first piece 651a is press-molded integrally with the first circuit connection member 612, and one end of the second piece 651b molded as a separate member is fixed to the first circuit connection member 612 by welding, etc. In this way, one end of the first coupling body 651 is provided integrally with the first circuit connection member 612.

In the first coupling body 651, the other end (the other end of each of the first piece 651a and the second piece 651b) corresponds to a coupling portion electrically connectable to, attachable to, and detachable from the first circuit connection member 612 of the adjacent filter circuit 610. The other end of the first coupling body 651 protrudes from the first circuit connection member 612 provided thereto along an arrangement direction of the adjacent filter circuit 610. The first coupling body 651 interposes the first circuit connection member 612 of the adjacent filter circuit 610 between the respective other ends of the first piece 651a and the second piece 651b, and physically and electrically connects the first piece 651a and the second piece 651b to the adjacent first circuit connection member 612, thereby electrically connecting the adjacent first circuit connection members 612 to each other. In addition, to the first circuit connection member 612 on which this first coupling body 651 is provided, the first coupling body 651 of the adjacent filter circuit 610 disposed on the opposite side from this first coupling body 651 is connected.

On the main wall body or the first peripheral wall body 621b, the housing 620 of the present modified example has a notch $621b_1$ for storing one end of the first coupling body 651 included in the filter circuit 610 accommodated in the accommodation chamber 620a in the accommodation chamber 620a and disposing the other end of this first coupling body 651 on the outside of the accommodation chamber 620a (FIG. 21). Further, on the main wall body or the second peripheral wall body 621c, the housing 620 has a notch $621c_1$ for storing the other end of the first coupling body 651 of the adjacent filter circuit 610 disposed on the opposite side from this first coupling body 651 in the accommodation chamber 620a (FIG. 21). The first circuit connection member 612 of this example includes a piece 612c having a single body shape protruding to the outside of the accommodation chamber 620a from the notch $621c_1$ (FIG. 21 and FIG. 22). The piece 612c functions as a guide portion at the time of coupling the other end of the first coupling body 651 of the adjacent filter circuit 610.

In this first coupling body 651, at least one of the first piece 651a and the second piece 651b is provided with a contact portion 651c protruding to the other piece disposed to face the piece (FIG. 24). In the first coupling body 651 in this example, the contact portion 651c is provided in the first piece 651a, and the first circuit connection member 612 of the adjacent filter circuit 610 is clamped by this contact portion 651c and a plane of the second piece 651b, thereby electrically connecting the adjacent first circuit connection members 612 to each other. In this example, an arc-shaped portion formed by bending a part of the first piece 651a in an arc shape is used as the contact portion 651c. However, a bulged portion bulged out, for example, in a hemispherical shape from the first piece 651a may be used as the contact portion 651c.

In the first coupling body 651, the adjacent first circuit connection member 612 is inserted between the respective other ends of the first piece 651a and the second piece 651b along the arrangement direction of the adjacent filter circuits 610. In this way, the first coupling body 651 causes the respective other ends of the first piece 651a and the second piece 651b to clamp the adjacent first circuit connection member 612. In addition, the first coupling body 651 can remove the other end from the adjacent first circuit connection member 612.

The second coupling body 652 includes a first piece 652a and a second piece 652b having a single body shape in which planes are disposed to face each other at an interval (FIG. 24). The second coupling body 652 may be formed by press-molding both the first piece 652a and the second piece 652b integrally with the second circuit connection member 613. Alternatively, the second coupling body 652 may be formed by press-molding one of the first piece 652a and the second piece 652b integrally with the second circuit connection member 613, molding the other one as a separate member, and fixing the other one to the second circuit connection member 613 using welding, etc. In this example, the latter second coupling body 652 is provided on the second circuit connection member 613, one end of the first piece 652a is press-molded integrally with the second circuit connection member 613, and one end of the second piece 652b molded as a separate member is fixed to the second circuit connection member 613 by welding, etc. In this way, one end of the second coupling body 652 is provided integrally with the second circuit connection member 613.

In the second coupling body 652, the other end (the other end of each of the first piece 652a and the second piece 652b) corresponds to a coupling portion electrically connectable to, attachable to, and detachable from the second circuit connection member 613 of the adjacent filter circuit 610. The other end of the second coupling body 652 protrudes from the second circuit connection member 613 provided thereto along the arrangement direction of the adjacent filter circuit 610. The second coupling body 652 interposes the second circuit connection member 613 of the adjacent filter circuit 610 between the respective other ends of the first piece 652a and the second piece 652b, and physically and electrically connects the first piece 652a and the second piece 652b to the adjacent second circuit connection member 613, thereby electrically connecting the adjacent second circuit connection members 613 to each other. In addition, to the second circuit connection member 613 on which this second coupling body 652 is provided, the second coupling body 652 of the adjacent filter circuit 610 disposed on the opposite side from this second coupling body 652 is connected.

On the main wall body or the first peripheral wall body 621b, the housing 620 of the present modified example has a notch $621b_2$ for storing one end of the second coupling body 652 included in the filter circuit 610 accommodated in the accommodation chamber 620a in the accommodation chamber 620a and disposing the other end of this second coupling body 652 on the outside of the accommodation chamber 620a (FIG. 21). Further, on the main wall body or the second peripheral wall body 621c, the housing 620 has a notch $621c_2$ for storing the other end of the second coupling body 652 of the adjacent filter circuit 610 disposed on the opposite side from this second coupling body 652 in the accommodation chamber 620a (FIG. 21). The second circuit connection member 613 of this example includes a piece 613c having a single body shape protruding to the outside of the accommodation chamber 620a from the notch $621c_2$ (FIG. 21 and FIG. 22). The piece 613c functions as a guide portion at the time of coupling the other end of the second coupling body 652 of the adjacent filter circuit 610.

In this second coupling body 652, at least one of the first piece 652a and the second piece 652b is provided with a contact portion 652c protruding to the other piece disposed to face the piece (FIG. 24). In the second coupling body 652 in this example, the contact portion 652c is provided in the first piece 652a, and the second circuit connection member 613 of the adjacent filter circuit 610 is clamped by this contact portion 652c and a plane of the second piece 652b, thereby electrically connecting the adjacent second circuit connection members 613 to each other. In this example, an arc-shaped portion formed by bending a part of the first piece 652a in an arc shape is used as the contact portion 652c. However, a bulged portion bulged out, for example, in a hemispherical shape from the first piece 652a may be used as the contact portion 652c.

In the second coupling body 652, the adjacent second circuit connection member 613 is inserted between the respective other ends of the first piece 652a and the second piece 652b along the arrangement direction of the adjacent filter circuits 610. In this way, the second coupling body 652 causes the respective other ends of the first piece 652a and the second piece 652b to clamp the adjacent second circuit connection member 613. In addition, the second coupling body 652 can remove the other end from the adjacent second circuit connection member 613.

Here, the first coupling body 651 causes the other end to protrude from the first circuit connection member 612 on which the first coupling body 651 is provided along the arrangement direction of the adjacent filter circuits 610 and to extend along the plane of the first circuit connection member 612. In addition, the second coupling body 652 causes the other end to protrude from the second circuit connection member 613 on which the second coupling body 652 is provided along the arrangement direction of the adjacent filter circuits 610 and to extend along the plane of the second circuit connection member 613. However, in the first coupling body 651 and the second coupling body 652, an arc-shaped portion, a bent portion, etc. may be provided and bent between both ends, and the other end may be offset with respect to one end. In this way, the noise filter 2A and the wire harness WH can take interference measures with respect to a peripheral part in a state of being assembled into the vehicle body.

In the noise filter 2A, for example, after coupling the respective filter circuits 610, all the filter circuits 610 may be wrapped by an adhesive tape, etc. together with the trunk line WT and held on the trunk line WT.

The noise filter 2A of the present modified example described above not only has the effect obtainable by the noise filter 1 of the above-described embodiment, but also can change the number of filter circuits 610 to be coupled by a simple method. Thus, it is possible to easily adjust the filter circuit characteristic according to the required performance of noise reduction. Therefore, the noise filter 2A can easily cope with various filter circuit characteristics.

Figure 25:
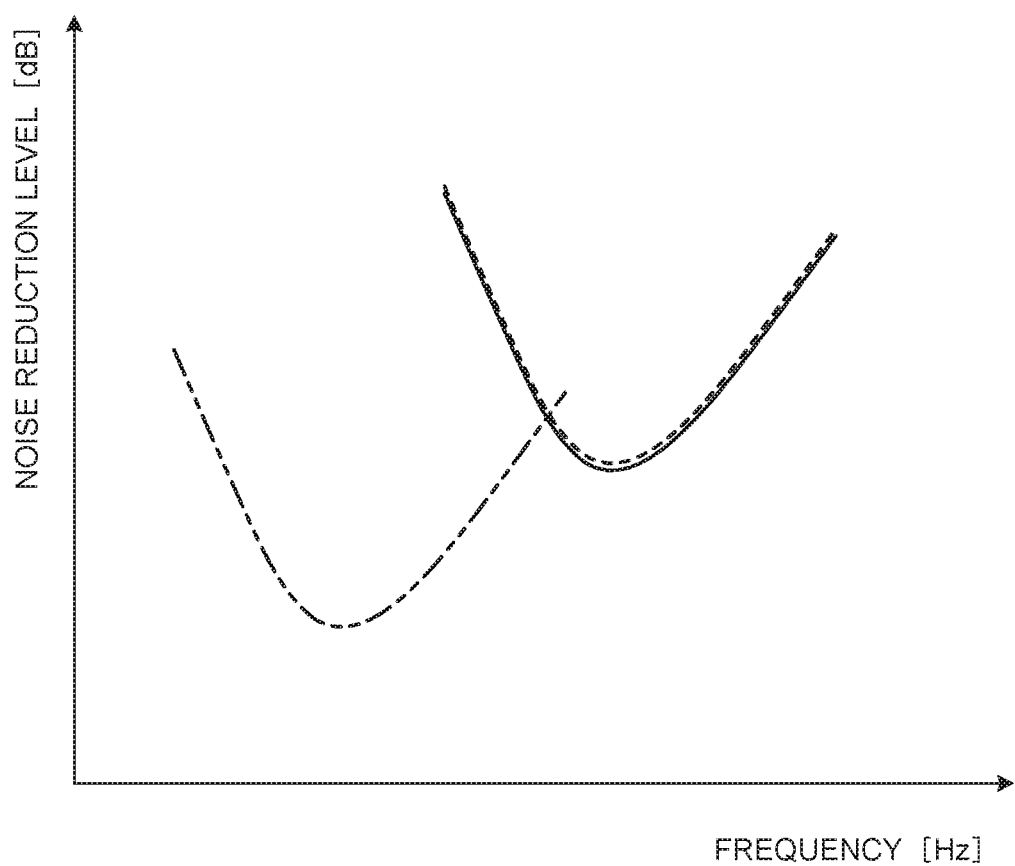
FIG. 25 is a conceptual diagram of a filter circuit characteristic of the noise filter of the first modified example.

FIG. 25 illustrates a conceptual diagram of a filter circuit characteristic in which a horizontal axis depicts a frequency and a vertical axis depicts a noise reduction level. In this figure, the required performance of noise reduction is indicated by a broken line, the filter circuit characteristic of the noise filter 2A of the present modified example is indicated by a solid line, and a filter circuit characteristic of a noise filter having only one filter circuit 610 is indicated by an alternate long and two short dashes line.

In addition, the noise filter 2A of the present modified example can be grounded by connecting the main filter circuit 610A to any one of the first electric wire WE1 and the second electric wire WE2 which are grounded (the second electric wire WE2 in this example). That is, in the noise filter 2A, regardless of the number of filter circuits 610, a ground terminal may not be provided for each filter circuit 610 unlike the conventional noise filter. Therefore, the noise filter 2A can improve assembling workability.

Furthermore, since the noise filter 2A of the present modified example is configured such that the filter circuit 610 side is attachable to and detachable from the first electric wire WE1 side and the second electric wire WE2 side by the first electric connection member 630A (first electric connection structure 630) and the second electric connection member 640A (second electric connection structure 640), attachment/detachment work with respect to the first electric wire WE1 and the second electric wire WE2 is facilitated. Therefore, this noise filter 2A is excellent in assembling workability with respect to the first electric wire WE1 and the second electric wire WE2, and is excellent in the replacement workability. Furthermore, since the noise filter 2A of the present modified example is configured such that the adjacent filter circuits 610 are attachable to and detachable from each other by the first coupling body 651 and the second coupling body 652, only a filter circuit 610 to be replaced can be replaced by specifying the filter circuit 610.

Furthermore, in the noise filter 2A of the present modified example, each of the first circuit connection member 612 and the second circuit connection member 613 is molded in a flat plate shape. Further, in this noise filter 2A, the first circuit side connection portion 632 of the first electric connection member 630A and the first coupling body 651 are formed to be electrically connected by interposing a part between the planes of the first circuit connection member 612 therebetween, and the second circuit side connection portion 642 of the second electric connection member 640A and the second coupling body 652 are formed to be electrically connected by interposing a part between the planes of the second circuit connection member 613 therebetween. Therefore, the noise filter 2A can achieve reduction in size of each connection structure, which can attempt reduction in size of the frame. In addition, the noise filter 2A can simplify each connection structure.

In addition, the wire harness WH of the present modified example includes such a noise filter 2A, and can achieve the effect obtained by the noise filter 2A.

Here, in the present modified example, the housing 620 is included for each filter circuit 610. However, the noise filter 2A of the present modified example may be configured to include a housing in which two or more filter circuits 610 are collectively accommodated instead of such a housing 620.

Noise Filter 2B

Here, the noise filter 2 of the present modified example may be configured as a noise filter 2B in which first and second electric connection structures 730 and 740 and first and second coupling bodies 751 and 752 described below are provided instead of the first and second electric connection structures 630 and 640 and the first and second coupling bodies 651 and 652 described above (FIG. 26 and FIG. 27).

Figure 26:
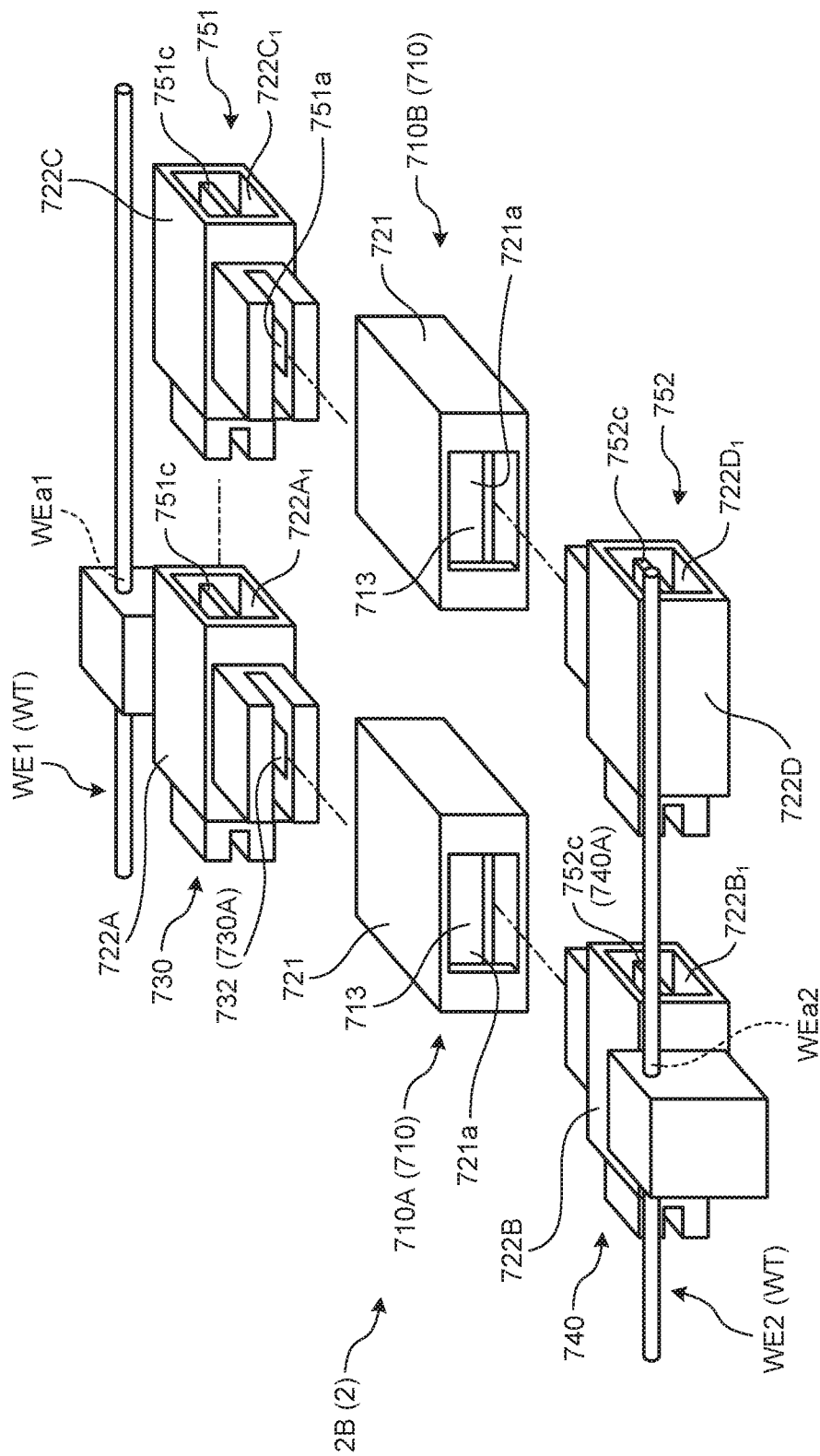
FIG. 26 is an exploded perspective view illustrating a first modification of the noise filter and the wire harness of the first modified example.
Figure 27:
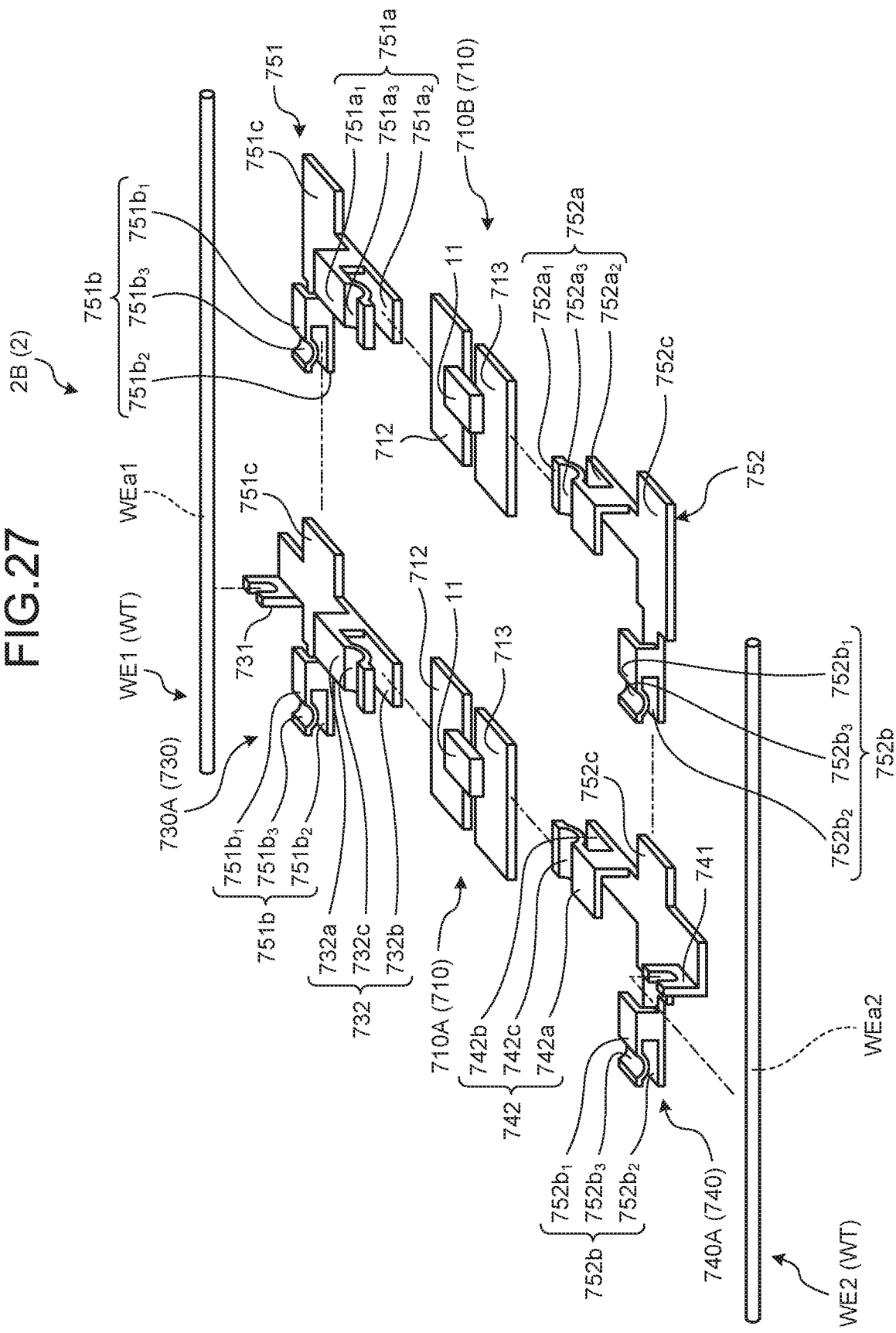
FIG. 27 is a perspective view illustrating an internal structure of the first modification of the noise filter and the wire harness of the first modified example.

Similarly to the noise filter 2A described above, this noise filter 2B includes a plurality of filter circuits 710 for reducing noise components (FIG. 26 and FIG. 27). The plurality of filter circuits 710 is roughly classified into one main filter circuit 710A electrically connected to each of the intermediate connection portions WEa1 and WEa2 and the other remaining sub-filter circuits 710B.

Each of the filter circuits 710 includes at least one noise reduction element 11, a first circuit connection member 712, and a second circuit connection member 713 similar to those of the filter circuit 610 described above (FIG. 27).

The filter circuit 710 in this example includes one capacitor as the noise reduction element 11, and is configured to be able to reduce noise using this one capacitor. The first circuit connection member 712 and the second circuit connection member 713 are conductive members formed similarly to the first circuit connection member 612 and the second circuit connection member 613, and each of the circuit connection members is molded as a plate-shaped bus bar using a conductive material such as metal. However, the first circuit connection member 712 of this example does not include parts corresponding to the first coupling body 651 and the piece 612c provided integrally with the first circuit connection member 612 described above. In addition, the second circuit connection member 713 of this example does not include parts corresponding to the second coupling body 652 and the piece 613c provided integrally with the second circuit connection member 613 described above.

The noise filter 2B includes a housing 721 that accommodates the filter circuit 710 (FIG. 26). The housing 721 is molded using an insulating material such as a synthetic resin. The housing 721 may be provided for each filter circuit 710, or may collectively accommodate two or more filter circuits 710. In addition, the housing 721 may be formed by fitting a plurality of housing members, to which and from which the filter circuits 710 can be attached and detached, to each other or may be molded integrally with the filter circuit 710.

At two positions, this housing 721 has through-holes 721a into which a first circuit side connection portion 732 of a first electric connection member 730A or a first coupling portion 751a of a first coupling body 751 described below is inserted so that the first circuit side connection portion 732 or the first coupling portion 751a can be connected to the first circuit connection member 712, and into which a second circuit side connection portion 742 of a second electric connection member 740A or a second coupling portion 752b of a second coupling body 752 described below is inserted so that the second circuit side connection portion 742 or the second coupling portion 752b can be connected to the second circuit connection member 713 (FIG. 26). The respective through-holes 721a are disposed to face each other along respective planes of the first circuit connection member 712 and the second circuit connection member 713.

Furthermore, the noise filter 2B includes the first electric connection structure 730 that electrically connects the intermediate connection portion WEa1 of the first electric wire WE1 to the first circuit connection member 712 of the main filter circuit 710A, and the second electric connection structure 740 that electrically connects the intermediate connection portion WEa2 of the second electric wire WE2 to the second circuit connection member 713 of the main filter circuit 710A (FIG. 27).

The first electric connection structure 730 is molded as one connection member (hereinafter, referred to as a "first electric connection member") 730A using a conductive material such as metal. The first electric connection member 730A includes a first electric wire side connection portion 731 physically and electrically connected to the intermediate connection portion WEa1 of the first electric wire WE1, and a first circuit side connection portion 732 physically and electrically connected to the first circuit connection member 712 of the main filter circuit 710A (FIG. 27).

For example, the first electric wire side connection portion 731 and the first circuit side connection portion 732 are formed to have the same shapes as those of the first electric wire side connection portion 631 and the first circuit side connection portion 632 of the first electric connection member 630A, respectively. Therefore, the first circuit side connection portion 732 includes a first piece 732a and a second piece 732b having a single body shape in which planes are disposed to face each other at an interval and a contact portion 732c provided on at least one of the first piece 732a and the second piece 732b (FIG. 27). In this example, the contact portion 732c is provided on the first piece 732a, and the first circuit connection member 712 is clamped by the contact portion 732c and a plane of the second piece 732b, thereby physically and electrically connecting the first circuit side connection portion 732 to the first circuit connection member 712. In the first electric connection member 730A, the first circuit connection member 712 is inserted between the first piece 732a and the second piece 732b in the direction orthogonal to the arrangement direction of the adjacent filter circuits 710. In this way, the first electric connection member 730A causes the first circuit side connection portion 732 to clamp the first circuit connection member 712. In addition, the first electric connection member 730A can remove the first circuit side connection portion 732 from the first circuit connection member 712.

The second electric connection structure 740 is molded as one connection member (hereinafter, referred to as a "second electric connection member") 740A using a conductive material such as metal. The second electric connection member 740A includes a second electric wire side connection portion 741 physically and electrically connected to the intermediate connection portion WEa2 of the second electric wire WE2, and a second circuit side connection portion 742 physically and electrically connected to the second circuit connection member 713 of the main filter circuit 710A (FIG. 27).

For example, the second electric wire side connection portion 741 and the second circuit side connection portion 742 are formed to have the same shapes as those of the second electric wire side connection portion 641 and the second circuit side connection portion 642 of the second electric connection member 640A, respectively. Therefore, the second circuit side connection portion 742 includes a first piece 742a and a second piece 742b having a single body shape in which planes are disposed to face each other at an interval and a contact portion 742c provided on at least one of the first piece 742a and the second piece 742b (FIG. 27). In this example, the contact portion 742c is provided on the first piece 742a, and the second circuit connection member 713 is clamped by the contact portion 742c and a plane of the second piece 742b, thereby physically and electrically connecting the second circuit side connection portion 742 to the second circuit connection member 713. In the second electric connection member 740A, the second circuit connection member 713 is inserted between the first piece 742a and the second piece 742b in the direction orthogonal to the arrangement direction of the adjacent filter circuits 710. In this way, the second electric connection member 740A causes the second circuit side connection portion 742 to clamp the second circuit connection member 713. In addition, in the second electric connection member 740A, the second circuit side connection portion 742 can be removed from the second circuit connection member 713.

Furthermore, the noise filter 2B includes a first coupling body 751 which can physically and electrically connect the first circuit connection members 712 of the adjacent filter circuits 710 to each other and can separate the first circuit connection members 712 of the adjacent filter circuits 710 from each other (FIG. 27). Further, the noise filter 2B includes a second coupling body 752 which can physically and electrically connect the second circuit connection members 713 of the adjacent filter circuits 710 to each other and can separate the second circuit connection members 713 of the adjacent filter circuits 710 from each other (FIG. 27). The first coupling body 751 and the second coupling body 752 are molded using a conductive material such as metal. In addition, each of the first coupling body 751 and the second coupling body 752 is provided for each of the plurality of filter circuits 710.

The first coupling body 751 is molded as one coupling member (hereinafter referred to as a "first coupling member") using a conductive material such as metal. The first coupling body 751 includes a first coupling portion 751a physically and electrically connected to, attachable to, and detachable from one of the respective first circuit connection members 712 of the adjacent filter circuits 710, and a second coupling portion 751b physically and electrically connected to, attachable to, and detachable from the adjacent first coupling body 751 connected to the other one (FIG. 27). Further, this first coupling body 751 has a coupled portion 751c to which the second coupling portion 751b of the adjacent first coupling body 751 is physically and electrically connected (FIG. 27).

The first coupling portion 751a of this example is formed in a similar shape to that of the first circuit side connection portion 732 of the first electric connection member 730A. Therefore, the first coupling portion 751a includes a first piece $751a_1$ and a second piece $751a_2$ having a single body shape in which planes are disposed to face each other at an interval and a contact portion $751a_3$ provided on at least one of the first piece $751a_1$ and the second piece $751a_2$ (FIG. 27). In this example, the contact portion $751a_3$ is provided on the first piece $751a_1$, and the first circuit connection member 712 is clamped by the contact portion $751a_3$ and a plane of the second piece $751a_2$, thereby physically and electrically connecting the first coupling portion 751a to the first circuit connection member 712. In the first coupling body 751, the first circuit connection member 712 is inserted between the first piece $751a_1$ and the second piece $751a_2$ in the direction orthogonal to the arrangement direction of the adjacent filter circuits 710. In this way, the first coupling body 751 causes the first coupling portion 751a to clamp the first circuit connection member 712. In addition, the first coupling body 751 can remove the first coupling portion 751a from the first circuit connection member 712.

The second coupling portion 751b of this example is formed in a similar shape to that of the first coupling portion 751a. Therefore, the second coupling portion 751b includes a first piece $751b_1$ and a second piece $751b_2$ having a single body shape in which planes are disposed to face each other at an interval and a contact portion $751b_3$ provided on at least one of the first piece $751b_1$ and the second piece $751b_2$ (FIG. 27). In this example, the contact portion $751b_3$ is provided on the first piece $751b_1$, and the coupled portion 751c of the adjacent first coupling body 751 is clamped by the contact portion $751b_3$ and a plane of the second piece $751b_2$, thereby physically and electrically connecting the second coupling portion 751b to the coupled portion 751c of the adjacent first coupling body 751. In the first coupling body 751, the coupled portion 751c of the adjacent first coupling body 751 is inserted between the first piece $751b_1$ and the second piece $751b_2$ along the arrangement direction of the adjacent filter circuits 710. In this way, the first coupling body 751 causes the second coupling portion 751b to clamp the coupled portion 751c of the adjacent first coupling body 751. In addition, the first coupling body 751 can remove the second coupling portion 751b from the coupled portion 751c of the adjacent first coupling body 751.

The coupled portion 751c is a flat plate-shaped part clamped by the second coupling portion 751b of the adjacent first coupling body 751. In the first coupling body 751, the coupled portion 751c is disposed between the first coupling portion 751a and the second coupling portion 751b. The coupled portion 751c in this example is formed to be disposed on the same plane as that of the first circuit connection member 712, or have a plane offset in a direction orthogonal to a plane of the first circuit connection member 712. In addition, the coupled portion 751c of this example is formed in an L-shaped flat plate shape having two pieces, so that the first coupling portion 751a is disposed on one piece, and the second coupling portion 751b is disposed on the other piece. The coupled portion 751c of this example causes the one piece to extend along the direction orthogonal to the arrangement direction of the adjacent filter circuits 710, and causes the other piece to extend along the arrangement direction of the adjacent filter circuits 710.

Here, the first coupling body 751 is provided to correspond to each of the main filter circuit 710A and the sub-filter circuit 710B. However, in the noise filter 2B of this example, the first circuit side connection portion 732 having a similar function to that of the first coupling portion 751a is formed in the first electric connection member 730A. Therefore, in this noise filter 2B, by assigning a function of at least one of the second coupling portion 751b and the coupled portion 751c to the first electric connection member 730A, the first electric connection member 730A of the main filter circuit 710A and the first coupling body 751 is configured as one component, and the first coupling body 751 is provided as a dedicated component that corresponds only to the sub-filter circuit 710B. The first electric connection member 730A of this example is formed to have the functions of both the second coupling portion 751b and the coupled portion 751c (FIG. 27).

The second coupling body 752 is molded as one coupling member (hereinafter referred to as a "second coupling member") using a conductive material such as metal. The second coupling body 752 includes a first coupling portion 752a physically and electrically connected to, attachable to, and detachable from one of the respective second circuit connection members 713 of the adjacent filter circuits 710, and a second coupling portion 752b physically and electrically connected to, attachable to, and detachable from the adjacent second coupling body 752 connected to the other one (FIG. 27). Further, this second coupling body 752 has a coupled portion 752c to which the second coupling portion 752b of the adjacent second coupling body 752 is physically and electrically connected (FIG. 27).

The first coupling portion 752a of this example is formed in a similar shape to that of the second circuit side connection portion 742 of the second electric connection member 740A. Therefore, the first coupling portion 752a includes a first piece $752a_1$ and a second piece $752a_2$ having a single body shape in which planes are disposed to face each other at an interval and a contact portion $752a_3$ provided on at least one of the first piece $752a_1$ and the second piece $752a_2$ (FIG. 27). In this example, the contact portion $752a_3$ is provided on the first piece $752a_1$, and the second circuit connection member 713 is clamped by the contact portion $752a_3$ and a plane of the second piece $752a_2$, thereby physically and electrically connecting the first coupling portion 752a to the second circuit connection member 713. In the second coupling body 752, the second circuit connection member 713 is inserted between the first piece $752a_1$ and the second piece $752a_2$ in the direction orthogonal to the arrangement direction of the adjacent filter circuits 710. In this way, the second coupling body 752 causes the first coupling portion 752a to clamp the second circuit connection member 713. In addition, the second coupling body 752 can remove the first coupling portion 752a from the second circuit connection member 713.

The second coupling portion 752b of this example is formed in a similar shape to that of the first coupling portion 752a. Therefore, the second coupling portion 752b includes a first piece $752b_1$ and a second piece $752b_2$ having a single body shape in which planes are disposed to face each other at an interval and a contact portion $752b_3$ provided on at least one of the first piece $752b_1$ and the second piece $752b_2$ (FIG. 27). In this example, the contact portion $752b_3$ is provided on the first piece $752b_1$, and the coupled portion 752c of the adjacent second coupling body 752 is clamped by the contact portion $752b_3$ and a plane of the second piece $752b_2$, thereby physically and electrically connecting the second coupling portion 752b to the coupled portion 752c of the adjacent second coupling body 752. In the second coupling body 752, the coupled portion 752c of the adjacent second coupling body 752 is inserted between the first piece $752b_1$ and the second piece $752b_2$ along the arrangement direction of the adjacent filter circuits 710. In this way, the second coupling body 752 causes the second coupling portion 752b to clamp the coupled portion 752c of the adjacent second coupling body 752. In addition, the second coupling body 752 can remove the second coupling portion 752b from the coupled portion 752c of the adjacent second coupling body 752.

The coupled portion 752c is a flat plate-shaped part clamped by the second coupling portion 752b of the adjacent second coupling body 752. In the second coupling body 752, the coupled portion 752c is disposed between the first coupling portion 752a and the second coupling portion 752b. The coupled portion 752c in this example is formed to be disposed on the same plane as that of the second circuit connection member 713, or have a plane offset in a direction orthogonal to a plane of the second circuit connection member 713. In addition, the coupled portion 752c of this example is formed in an L-shaped flat plate shape having two pieces, so that the first coupling portion 752a is disposed on one piece, and the second coupling portion 752b is disposed on the other piece. The coupled portion 752c of this example causes the one piece to extend along the direction orthogonal to the arrangement direction of the adjacent filter circuits 710, and causes the other piece to extend along the arrangement direction of the adjacent filter circuits 710.

Here, the second coupling body 752 is provided to correspond to each of the main filter circuit 710A and the sub-filter circuit 710B. However, in the noise filter 2B of this example, the second circuit side connection portion 742 having a similar function to that of the first coupling portion 752a is formed in the second electric connection member 740A. Therefore, in this noise filter 2B, by assigning a function of at least one of the second coupling portion 752b and the coupled portion 752c to the second electric connection member 740A, the second electric connection member 740A of the main filter circuit 710A and the second coupling body 752 is configured as one component, and the second coupling body 752 is provided as a dedicated component that corresponds only to the sub-filter circuit 710B. The second electric connection member 740A of this example is formed to have the functions of both the second coupling portion 752b and the coupled portion 752c (FIG. 27).

This noise filter 2B includes a first housing 722A accommodating the first electric connection member 730A, a second housing 722B accommodating the second electric connection member 740A, a third housing 722C accommodating the first coupling body 751, and a fourth housing 722D accommodating the second coupling body 752 (FIG. 26). The first to fourth housings 722A, 722B, 722C, and 722D are molded using an insulating material such as a synthetic resin.

The first housing 722A accommodates the intermediate connection portion WEa1 of the first electric wire WE1 in addition to the first electric connection member 730A. The first housing 722A is formed by fitting a plurality of housing members, which can attach and detach at least the first electric wire side connection portion 731 of the first electric connection member 730A and the intermediate connection portion WEa1 of the first electric wire WE1 to and from each other, to each other. The first housing 722A of this example has a through-hole $722A_1$ into which the second coupling portion 751b of the first coupling body 751 accommodated in the adjacent third housing 722C is inserted so that the second coupling portion 751b can be connected to the coupled portion 751c in the first electric connection member 730A (FIG. 26).

The second housing 722B accommodates the intermediate connection portion WEa2 of the second electric wire WE2 in addition to the second electric connection member 740A. The second housing 722B is formed by fitting a plurality of housing members, which can attach and detach at least the second electric wire side connection portion 741 of the second electric connection member 740A and the intermediate connection portion WEa2 of the second electric wire WE2 to and from each other, to each other. The second housing 722B of this example has a through-hole $722B_1$ into which the second coupling portion 752b of the second coupling body 752 accommodated in the adjacent fourth housing 722D is inserted so that the second coupling portion 752b can be connected to the coupled portion 752c in the second electric connection member 740A (FIG. 26).

The third housing 722C may be formed by fitting a plurality of housing members, to and from which the first coupling body 751 can be attached and detached, to each other, or may be molded integrally with the first coupling body 751. The third housing 722C in this example has a through-hole $722C_1$ into which the second coupling portion 751b of the first coupling body 751 accommodated in the adjacent third housing 722C is inserted so that the second coupling portion 751b can be connected to the coupled portion 751c of the first coupling body 751 accommodated therein (FIG. 26).

The fourth housing 722D may be formed by fitting a plurality of housing members, to and from which the second coupling body 752 can be attached and detached, to each other, or may be molded integrally with the second coupling body 752. The fourth housing 722D in this example has a through-hole $722D_1$ into which the second coupling portion 752b of the second coupling body 752 accommodated in the adjacent fourth housing 722D is inserted so that the second coupling portion 752b can be connected to the coupled portion 752c of the second coupling body 752 accommodated therein (FIG. 26).

After coupling all components, all the components may be wrapped by an adhesive tape, etc. together with the trunk line WT to hold the noise filter 2B on the trunk line WT.

Even when the noise filter 2B and the wire harness WH described above are configured in this way, it is possible to obtain a similar effect to that of the noise filter 2A and the wire harness WH described above.

Noise Filter 2C

Here, the noise filter 2 of the present modified example may be configured as a noise filter 2C provided with first and second electric connection structure 830 and 840 instead of the first and second electric connection structures 630 and 640 described above and the first and second coupling bodies 651 and 652 described above (FIG. 28 and FIG. 29).

Figure 29:
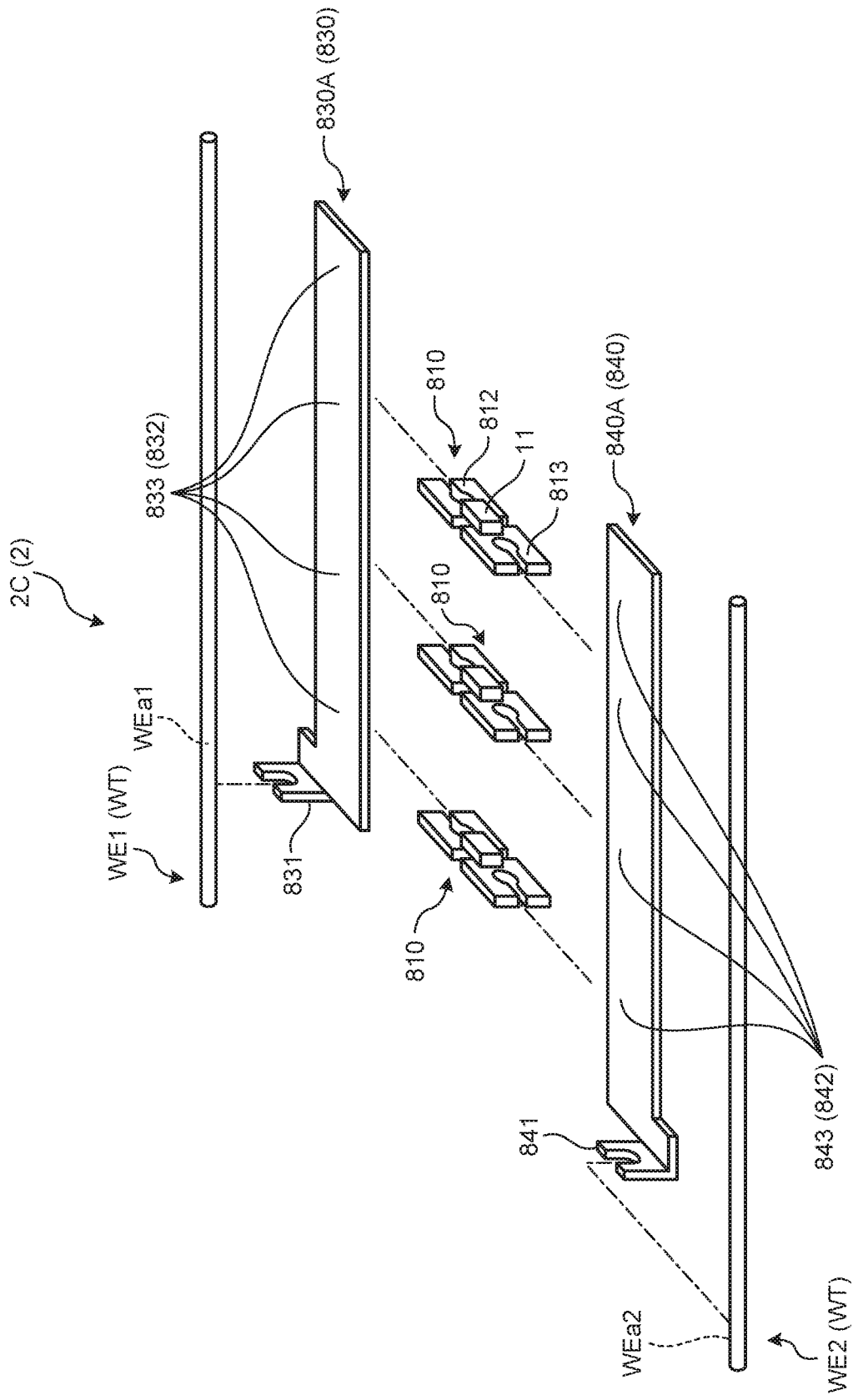
FIG. 29 is a perspective view illustrating an internal structure of the second modification of the noise filter and the wire harness of the first modified example.

Similarly to the noise filter 2A described above, the noise filter 2C includes a plurality of filter circuits 810 for reducing noise components (FIG. 29). Each of the filter circuits 810 includes at least one noise reduction element 11 for reducing a noise component, a conductive first circuit connection member 812 to which the first element connection portion of the noise reduction element 11 is electrically connected, and a conductive second circuit connection member 813 to which the second element connection portion of the noise reduction element 11 is electrically connected (FIG. 29). The filter circuit 810 of this example includes one capacitor as the noise reduction element 11, and is configured to be able to reduce noise using this one capacitor.

The first circuit connection member 812 and the second circuit connection member 813 are conductive members electrically connected to each other via the noise reduction element 11. Each of the first circuit connection member 812 and the second circuit connection member 813 is molded as a flat plate-shaped tuning-fork terminal using a conductive material such as metal (FIG. 29). In the first circuit connection member 812, the first element connection portion of the noise reduction element 11 is physically and electrically connected to a root of a terminal portion. Further, in the second circuit connection member 813, the second element connection portion of the noise reduction element 11 is physically and electrically connected to a root of a terminal portion.

Figure 28:
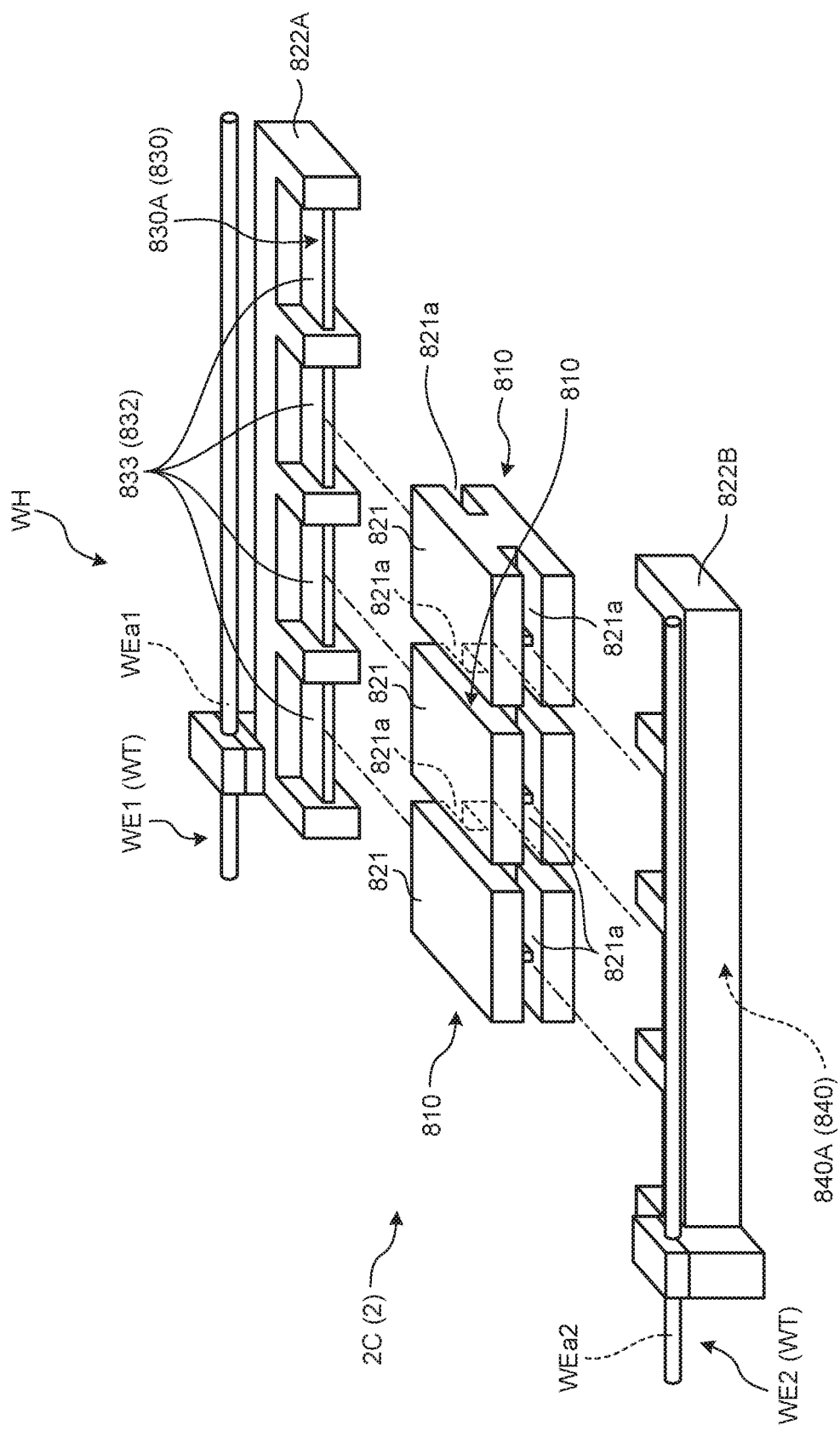
FIG. 28 is an exploded perspective view illustrating a second modification of the noise filter and the wire harness of the first modified example.

The noise filter 2C includes a housing 821 that accommodates the filter circuit 810 (FIG. 28). The housing 821 is molded using an insulating material such as a synthetic resin. The housing 821 may be provided for each filter circuit 810, or may collectively accommodate two or more filter circuits 810. In addition, the housing 821 may be formed by fitting a plurality of housing members, to and from which the filter circuit 810 can be attached and detached, to each other, or may be molded integrally with the filter circuit 810.

The housing 821 accommodates the first circuit connection member 812 and the second circuit connection member 813 so that respective planes of the first circuit connection member 812 and the second circuit connection member 813 correspond to orthogonal planes with respect to an arrangement direction of adjacent filter circuits 810. In addition, the housing 821 accommodates the first circuit connection member 812 and the second circuit connection member 813 so that an opponent insertion port at the terminal portion of the first circuit connection member 812 and an opponent insertion port at the terminal portion of the second circuit connection member 813 face mutually opposite sites. At two positions, this housing 821 has notch portions 821a into which a first connection site 833 of a first electric connection member 830A described below is inserted so that the first connection site 833 can be connected to the first circuit connection member 812, and into which a second connection site 843 of a second electric connection member 840A described below is inserted so that the second connection site 843 can be connected to the second circuit connection member 813 (FIG. 28). Specifically, each of the notch portions 821a is formed as a portion into which a side of a first circuit side connection portion 832 of the first electric connection member 830A described below can be inserted and a side of a second circuit side connection portion 842 of the second electric connection member 840A described below can be inserted. In each notch portion 821a, the corresponding first connection site 833 or second connection site 843 is inserted so that the first connection site 833 is connected to the first circuit connection member 812 and the second connection site 843 is connected to the second circuit connection member 813.

Furthermore, this noise filter 2C includes the first electric connection structure 830 that electrically connects the intermediate connection portion WEa1 of the first electric wire WE1 to the first circuit connection member 812 of one of the plurality of filter circuits 810 (main filter circuit), and the second electric connection structure 840 that electrically connects the intermediate connection portion WEa2 of the second electric wire WE2 to the second circuit connection member 813 of the main filter circuit (FIG. 29). The first electric connection structure 830 of this example electrically connects the intermediate connection portion WEa1 of the first electric wire WE1 to the respective first circuit connection members 812 of the plurality of filter circuits 810. Further, the second electric connection structure 840 of this example electrically connects the intermediate connection portion WEa2 of the second electric wire WE2 to the second circuit connection members 813 of the plurality of filter circuits 810.

The first electric connection structure 830 is molded as one connection member (hereinafter referred to as a "first electric connection member") 830A using a conductive material such as metal (FIG. 29). The first electric connection member 830A includes a first electric wire side connection portion 831 physically and electrically connected to the intermediate connection portion WEa1 of the first electric wire WE1, and a first circuit side connection portion 832 physically and electrically connected to the respective first circuit connection members 812 of the plurality of filter circuits 810 (FIG. 29). The first electric connection member 830A of this example is molded as a plate-shaped bus bar.

For example, the first electric wire side connection portion 831 is formed to have a similar shape to that of the first electric wire side connection portion 631 of the first electric connection member 630A described above.

On the other hand, the first circuit side connection portion 832 is formed in a rectangular flat plate shape, and is formed so that one side is inserted into the respective first circuit connection members 812 of the plurality of filter circuits 810 and clamped by contact portions of the respective first circuit connection members 812. In this first circuit side connection portion 832, sites clamped by the contact portions of the respective first circuit connection members 812 correspond to first connection sites 833 of the first electric connection member 830A. Therefore, by inserting the respective first connection sites 833 into the respective first circuit connection members 812 of the plurality of filter circuits 810, this first circuit side connection portion 832 is physically and electrically connected to the respective first circuit connection members 812. In addition, in the first electric connection member 830A, the first circuit side connection portion 832 can be removed from the respective first circuit connection members 812.

Here, in the first circuit side connection portion 832, between two first connection sites 833 connected to respective first circuit connection members 812 of adjacent filter circuits 810, the respective first circuit connection members 812 are indirectly electrically connected to each other. In addition, by removing the first circuit side connection portion 832 from the respective first circuit connection members 812, the respective first circuit connection members 812 can be disconnected from each other. Therefore, the first circuit side connection portion 832 can use a space between two adjacent first connection sites 833 as the first coupling body 651.

The second electric connection structure 840 is molded as one connection member (hereinafter referred to as a "second electric connection member") 840A using a conductive material such as metal (FIG. 29). The second electric connection member 840A includes a second electric wire side connection portion 841 physically and electrically connected to the intermediate connection portion WEa2 of the second electric wire WE2, and a second circuit side connection portion 842 physically and electrically connected to the respective second circuit connection members 813 of the plurality of filter circuits 810 (FIG. 29). The second electric connection member 840A of this example is molded as a plate-shaped bus bar.

For example, the second electric wire side connection portion 841 is formed to have a similar shape to that of the second electric wire side connection portion 641 of the second electric connection member 640A described above.

On the other hand, the second circuit side connection portion 842 is formed in a rectangular flat plate shape, and is formed so that one side is inserted into the respective second circuit connection members 813 of the plurality of filter circuits 810 and clamped by contact portions of the respective second circuit connection members 813. In this second circuit side connection portion 842, sites clamped by the contact portions of the respective second circuit connection members 813 correspond to second connection sites 843 of the second electric connection member 840A. Therefore, by inserting the respective second connection sites 843 into the respective second circuit connection members 813 of the plurality of filter circuits 810, this second circuit side connection portion 842 is physically and electrically connected to the respective second circuit connection members 813. In addition, in the second electric connection member 840A, the second circuit side connection portion 842 can be removed from the respective second circuit connection members 813.

Here, in the second circuit side connection portion 842, between two second connection sites 843 connected to respective second circuit connection members 813 of adjacent filter circuits 810, the respective second circuit connection members 813 are indirectly electrically connected to each other. In addition, by removing the second circuit side connection portion 842 from the respective second circuit connection members 813, the respective second circuit connection members 813 can be disconnected from each other. Therefore, the second circuit side connection portion 842 can use a space between two adjacent second connection sites 843 as the second coupling body 652.

This noise filter 2C includes a first housing 822A accommodating the first electric connection member 830A and a second housing 822B accommodating the second electric connection member 840A (FIG. 28). The first and second housings 822A and 822B are molded using an insulating material such as a synthetic resin.

The first housing 822A accommodates the intermediate connection portion WEa1 of the first electric wire WE1 in addition to the first electric connection member 830A. The first housing 822A is formed by fitting a plurality of housing members, which can attach and detach at least the first electric wire side connection portion 831 of the first electric connection member 830A and the intermediate connection portion WEa1 of the first electric wire WE1 to and from each other, to each other. The first housing 822A exposes each first connection site 833 of the first circuit side connection portion 832 in the first electric connection member 830A.

The second housing 822B accommodates the intermediate connection portion WEa2 of the second electric wire WE2 in addition to the second electric connection member 840A. The second housing 822B is formed by fitting a plurality of housing members, which can attach and detach at least the second electric wire side connection portion 841 of the second electric connection member 840A and the intermediate connection portion WEa2 of the second electric wire WE2 to and from each other, to each other. The second housing 822B exposes each second connection site 843 of the second circuit side connection portion 842 in the second electric connection member 840A.

After coupling all components, all the components may be wrapped by an adhesive tape, etc. together with the trunk line WT to hold the noise filter 2C on the trunk line WT.

Even when the noise filter 2C and the wire harness WH described above are configured in this way, it is possible to obtain a similar effect to that of the noise filter 2A and the wire harness WH described above.

Second Modified Example

Figure 30:
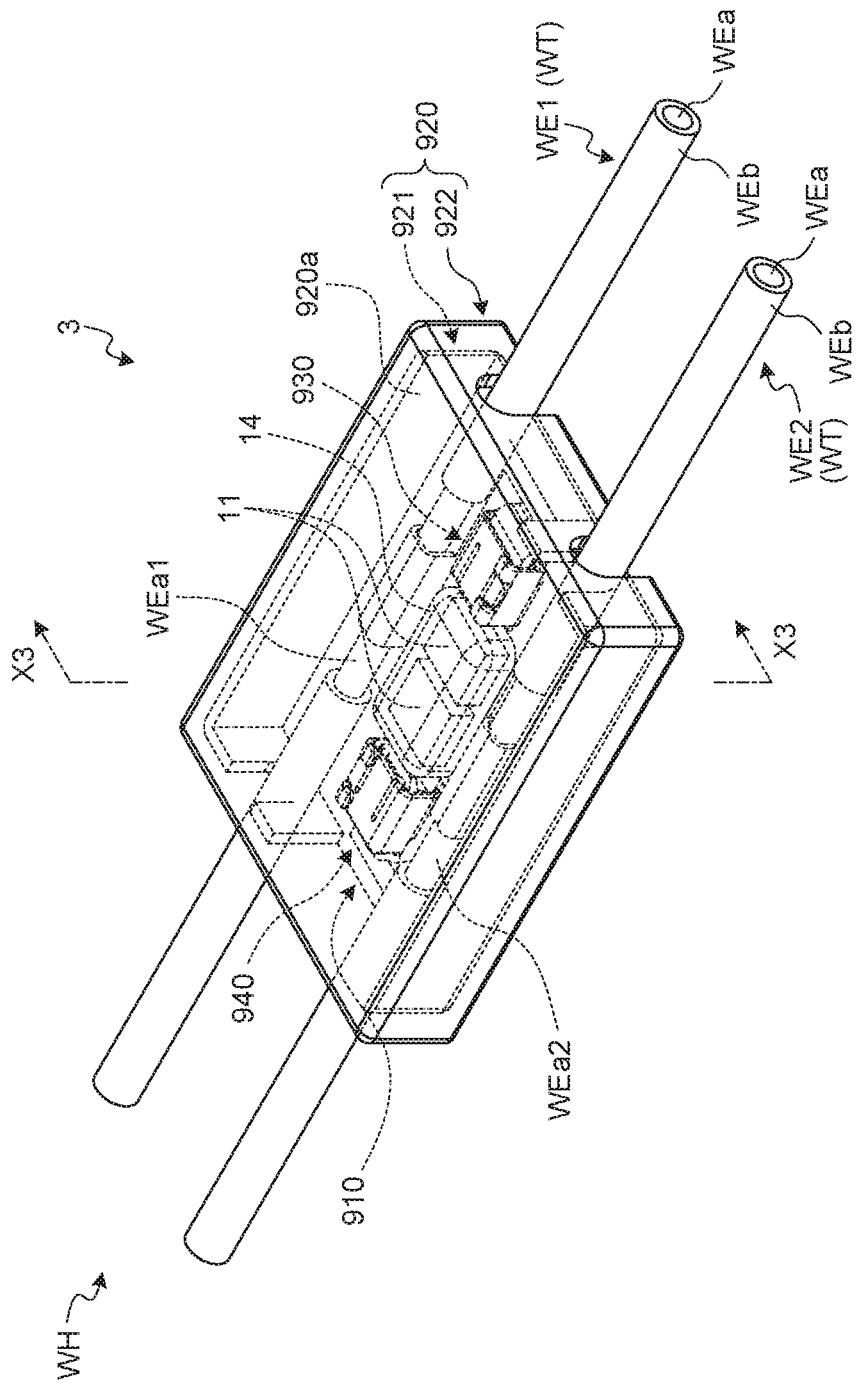
FIG. 30 is a perspective view illustrating a noise filter and a wire harness of a second modified example.
Figure 31:
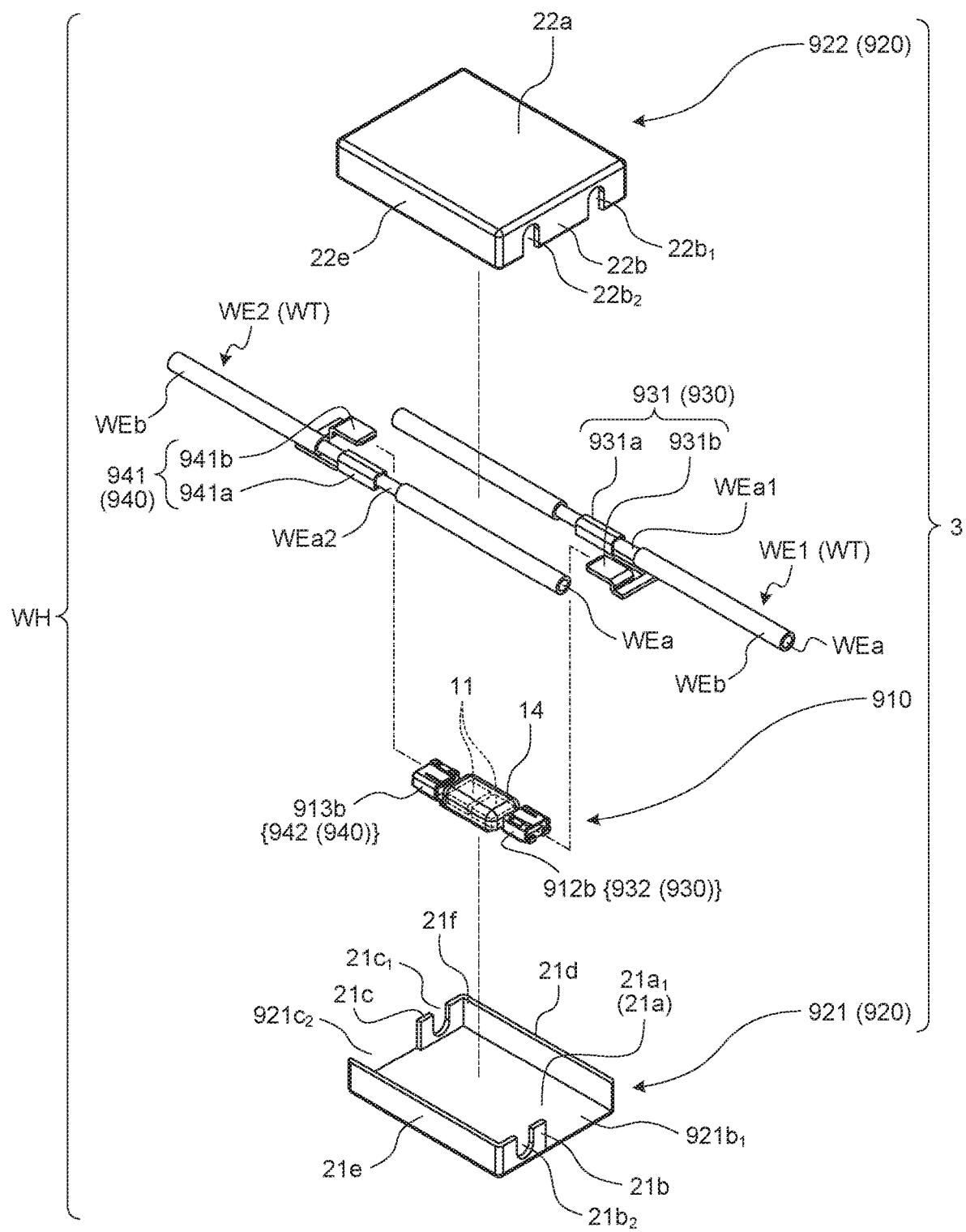
FIG. 31 is an exploded perspective view illustrating the noise filter and the wire harness of the second modified example.
Figure 32:
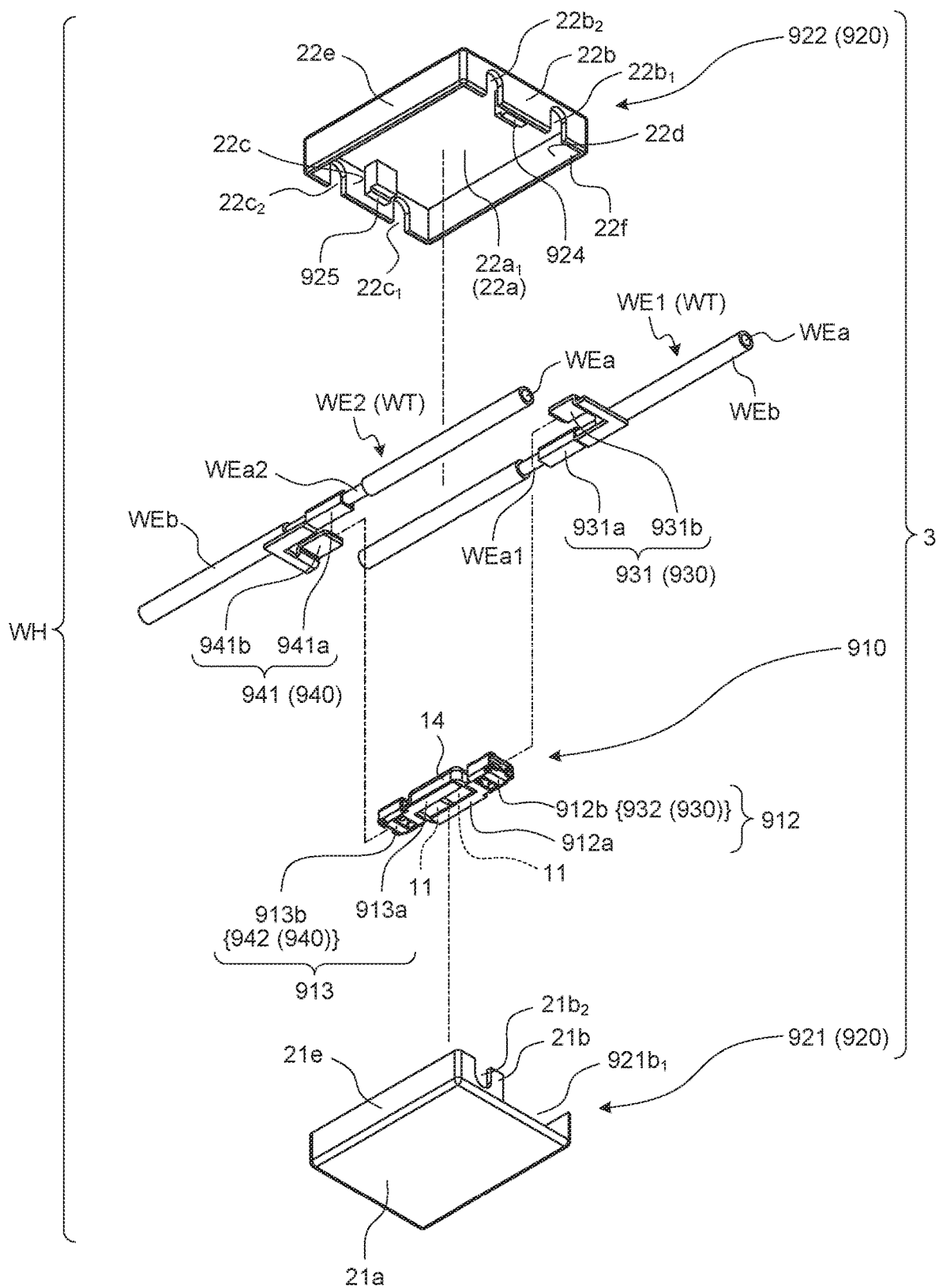
FIG. 32 is an exploded perspective view of the noise filter and the wire harness of the second modified example as viewed from a different angle.

Reference symbol 3 of FIG. 30 to FIG. 32 denotes a noise filter of the present modified example. This noise filter 3 is obtained by configuring the first circuit connection member and the second circuit connection member in the filter circuit, the first electric connection structure, the second electric connection structure, and the housing in the noise filter 1 of the above-described embodiment as below. Therefore, the same reference symbol as that included in the noise filter 1 (1A, etc.) will be assigned to a portion not changed or slightly changed with respect to the noise filter 1 (1A, etc.) of the embodiment, and a description thereof will be omitted.

Figure 33:
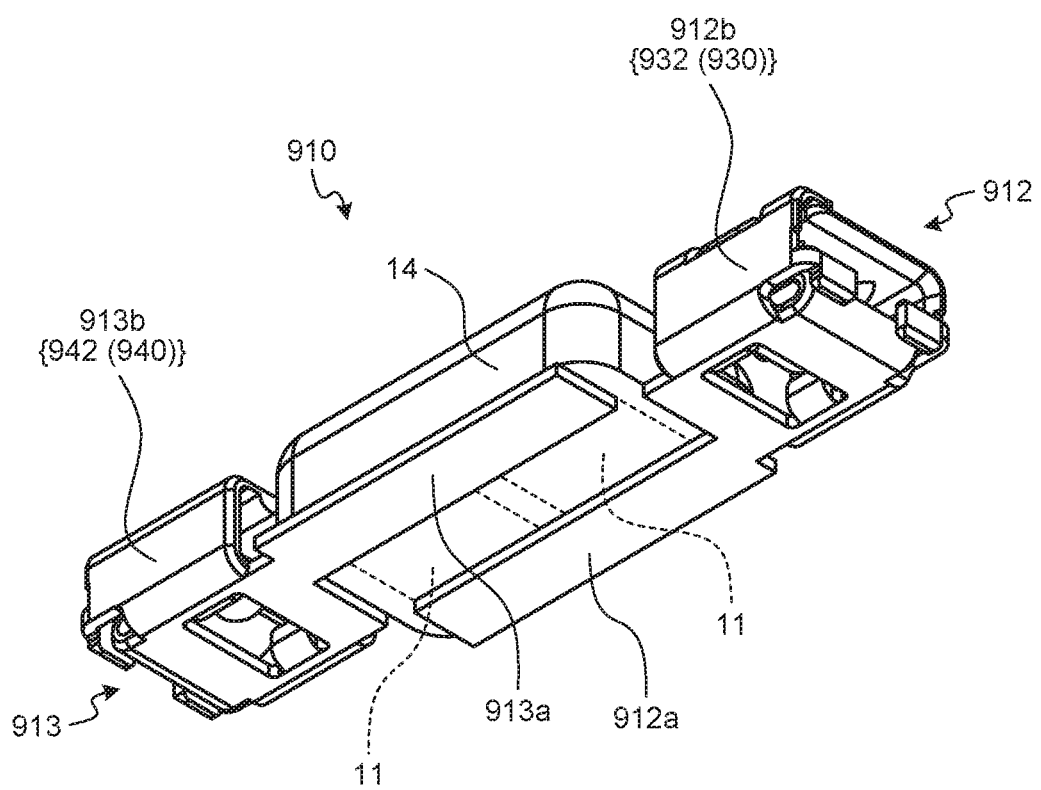
FIG. 33 is a perspective view illustrating a filter circuit of the noise filter of the second modified example.
Figure 34:
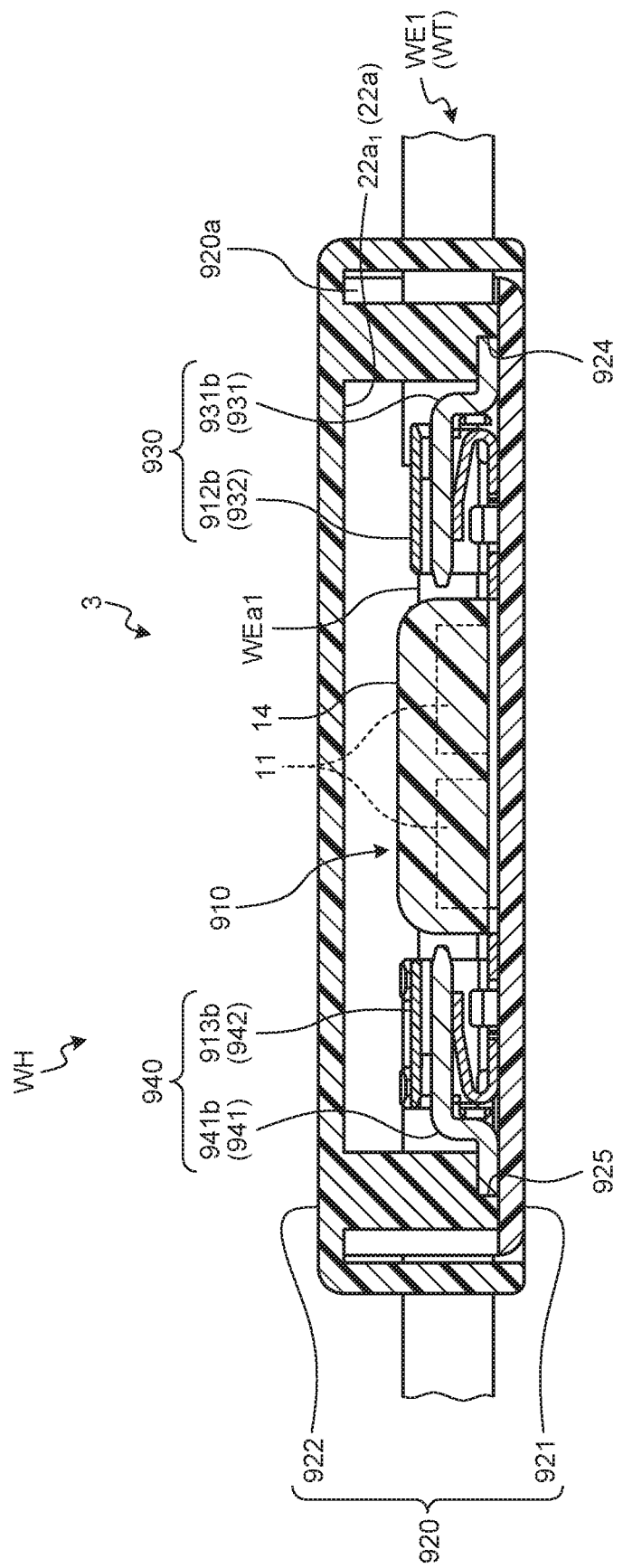
FIG. 34 is a cross-sectional view taken along X3-X3 line of FIG. 30.

A filter circuit 910 of the present modified example includes a noise reduction element 11, a first circuit connection member 912, and a second circuit connection member 913 (FIG. 32 and FIG. 33).

The filter circuit 910 of this example is placed between the first electric wire WE1 and the second electric wire WE2 run parallel to each other, and two noise reduction elements 11 are arranged side by side in the axial direction of the first electric wire WE1 and the second electric wire WE2 (FIG. 30 to FIG. 32).

The first circuit connection member 912 has an element connection portion 912a directly electrically connected to the first element connection portion of the noise reduction element 11, and an electric connection portion 912b indirectly electrically connected to the intermediate connection portion WEa1 of the first electric wire WE1 (FIG. 32 and FIG. 33). The second circuit connection member 913 has an element connection portion 913a directly electrically connected to the second element connection portion of the noise reduction element 11, and an electric connection portion 913b indirectly electrically connected to the intermediate connection portion WEa2 of the second electric wire WE2 (FIG. 32 and FIG. 33). In the filter circuit 910 of this example, the two noise reduction elements 11 are interposed between the electric connection portion 912b and the electric connection portion 913b in the axial direction of the first electric wire WE1 and the second electric wire WE2.

On the other hand, a first electric connection structure 930 of the present modified example includes a first electric wire side connection body 931 and a first circuit side connection body 932 electrically connected to each other by being inserted and fit along the axial direction of the first electric wire WE1 and the second electric wire WE2 run parallel to each other (FIG. 30 to FIG. 32). In addition, a second electric connection structure 940 of the present modified example includes a second electric wire side connection body 941 and a second circuit side connection body 942 electrically connected to each other by being inserted and fit along the axial direction of the first electric wire WE1 and the second electric wire WE2 run parallel to each other (FIG. 30 to FIG. 32).

The first electric wire side connection body 931 includes an electric wire connection portion 931a physically and electrically connected to the intermediate connection portion WEa1 of the first electric wire WE1 and an electric connection portion 931b physically and electrically connected to the first circuit side connection body 932 (FIG. 31 to FIG. 33). For example, the electric wire connection portion 931a is physically and electrically connected to the intermediate connection portion WEa1 by performing caulking while winding two pieces corresponding to U-shaped bodies around the intermediate connection portion WEa1 of the first electric wire WE1.

Here, the first circuit side connection body 932 is provided on the first circuit connection member 912. Here, the electric connection portion 912b of the first circuit connection member 912 is formed as the first circuit side connection body 932 (FIG. 30 to FIG. 32). The electric connection portion 931b of the first electric wire side connection body 931 and the first circuit side connection body 932 (the electric connection portion 912b of the first circuit connection member 912) correspond to male/female terminal connection structure bodies attachable and detachable along the axial direction of the first electric wire WE1 and the second electric wire WE2 run parallel to each other, one of which is formed as a female terminal portion and the other one is formed as a male terminal portion. In this example, the electric connection portion 931b is formed as a rectangular male tab-shaped male terminal portion, and the electric connection portion 912b is formed as a rectangular box-shaped female terminal portion. The electric connection portion 912b includes a square tube-shaped accommodation portion disposed using the axial direction of the first electric wire WE1 and the second electric wire WE2 as a tube axis direction, and an elastic piece disposed inward of the accommodation portion to fit the electric connection portion 931b inserted into the accommodation portion thereto using a holding force associated with an elastic force.

The second electric wire side connection body 941 includes an electric wire connection portion 941a physically and electrically connected to the intermediate connection portion WEa2 of the second electric wire WE2 and an electric connection portion 941b physically and electrically connected to the second circuit side connection body 942 (FIG. 31 to FIG. 33). For example, the electric wire connection portion 941a is physically and electrically connected to the intermediate connection portion WEa2 by performing caulking while winding two pieces corresponding to U-shaped bodies around the intermediate connection portion WEa2 of the second electric wire WE2.

Here, the second circuit side connection body 942 is provided on the second circuit connection member 913. Here, the electric connection portion 913b of the second circuit connection member 913 is formed as the second circuit side connection body 942 (FIG. 30 to FIG. 32). The electric connection portion 941b of the second electric wire side connection body 941 and the second circuit side connection body 942 (the electric connection portion 913b of the second circuit connection member 913) are formed as male/female terminal connection structure bodies similarly to the electric connection portions 912b and 931b of the first electric connection structure 930. In this example, the electric connection portion 941b is formed as a rectangular male tab-shaped male terminal portion, and the electric connection portion 913b is formed as a rectangular box-shaped female terminal portion.

Similarly to the noise filter 1 (1A, etc.) of the embodiment, a housing 920 forms an accommodation chamber 920a in which the filter circuit 910, the intermediate connection portion WEa1 of the first electric wire WE1, and the intermediate connection portion WEa2 of the second electric wire WE2 are accommodated by fitting a first housing member 921 and a second housing member 922 to each other (FIG. 30). The first electric connection structure 930 and the second electric connection structure 940 are accommodated in the accommodation chamber 920a.

The first housing member 921 of the present modified example corresponds to a member in which the first outlet $21b_1$ for drawing out one end side of the first electric wire WE1 to the outside is changed to a first outlet $921b_1$ and the fourth outlet $21c_2$ for drawing out the other end side of the second electric wire WE2 to the outside is changed to a fourth outlet $921c_2$ in the first housing member 21 of the embodiment (FIG. 31). The first outlet $921b_1$ of the present modified example has an opening area for drawing out the one end side of the first electric wire WE1 to the outside and has an opening area for a working space when the electric connection portion 931b on the first electric wire WE1 side is inserted into and fit to the electric connection portion 912b on the filter circuit 910 side. In a similar manner, the fourth outlet $921c_2$ of the present modified example has an opening area for drawing out the other end side of the second electric wire WE2 to the outside and has an opening area for a working space when the electric connection portion 941b on the second electric wire WE2 side is inserted into and fit to the electric connection portion 913b on the filter circuit 910 side.

Here, a first locking projection 924 for suppressing removing of the inserted and fit electric connection portion 931b from the electric connection portion 912b and a second locking projection 925 for suppressing removing of the inserted and fit electric connection portion 941b from the electric connection portion 913b are provided in the second housing member 922 of the present modified example (FIG. 32). Each of the first locking projection 924 and the second locking projection 925 is a protruding body protruding from the inner wall surface $22a_1$ of the main wall body 22a. The first locking projection 924 is disposed on the opposite side from the electric connection portion 912b side in the electric connection portion 931b to face the side in the axial direction of the first electric wire WE1 and the second electric wire WE2 when the first housing member 921 and the second housing member 922 are fit to each other. An interval between the first locking projection 924 and the electric connection portion 931b at this time is set to a size that allows an electrically connected state between the electric connection portions 912b and 931b can be maintained even when the electric connection portion 931b moves in a removal direction with respect to the electric connection portion 912b. The second locking projection 925 is disposed on the opposite side from the electric connection portion 913b side in the electric connection portion 941b to face the side in the axial direction of the first electric wire WE1 and the second electric wire WE2 when the first housing member 921 and the second housing member 922 are fit to each other.

An interval between the second locking projection 925 and the electric connection portion 941b at this time is set to a size that allows an electrically connected state between the electric connection portions 913b and 941b can be maintained even when the electric connection portion 941b moves in a removal direction with respect to the electric connection portion 913b.

As described above, in the noise filter 3 of the present modified example, as in the noise filter 1 of the embodiment, the filter circuit 10 is interposed between the intermediate connection portion WEa1 of the first electric wire WE1 and the intermediate connection portion WEa2 of the second electric wire WE2 bundled in the trunk line WT of the wire harness WH, and the filter circuit 10 is electrically connected to the respective intermediate connection portions WEa1 and WEa2. Therefore, similarly to the noise filter 1 of the embodiment, the noise filter 3 of the present modified example is a simple noise filter not requiring adjustment of a filter circuit characteristic taking a noise component of the intermediate electric wire into consideration unlike the past. Furthermore, similarly to the noise filter 1 of the embodiment, the noise filter 3 of the present modified example may not use a ground terminal, and thus it is possible to attempt reduction in size or reduction in weight of the frame.

Furthermore, in the noise filter 3 of the present modified example, the filter circuit 910 is placed between the first electric wire WE1 and the second electric wire WE2 run parallel to each other, and the first electric connection structure 930 and the second electric connection structure 940 are disposed to interpose the two noise reduction elements 11 arranged side by side in the axial direction of the first electric wire WE1 and the second electric wire WE2 in the axial direction. Further, in the first electric connection structure 930 and the second electric connection structure 940, a fitting direction of the electric connection portions 912b and 931b and a fitting direction of the electric connection portions 913b and 941b are set to the axial direction of the first electric wire WE1 and the second electric wire WE2. Therefore, the noise filter 3 of the present modified example can further attempt reduction in size of the frame in the axial direction of the first electric wire WE1 and the second electric wire WE2 run parallel to each other and the direction orthogonal to the arrangement direction of the first electric wire WE1 and the second electric wire WE2 (here, the fitting direction of the first housing member 921 and the second housing member 922).

Unlike the noise filter 1 of the embodiment using elasticity for electric connection between the first electric wire WE1 and the second electric wire WE2, and the filter circuit 10, the noise filter 3 of the present modified example adopts a terminal connection structure set in the fitting direction as described above for the electric connection. Therefore, the noise filter 3 of the present modified example can improve assembling workability while suppressing an increase in size of the frame.

Furthermore, even when an external force is applied to the first electric wire WE1 or the second electric wire WE2, the noise filter 3 of the present modified example can maintain the electrically connected state between the electric connection portions 912b and 931b and the electrically connected state between the electric connection portions 913b and 941b by the first locking projection 924 and the second locking projection 925. Therefore, the noise filter 3 of the present modified example can attempt improvement in conduction quality.

In addition, the wire harness WH of the present modified example includes such a noise filter 3, and can achieve an effect obtained by this noise filter 3.

Attachment structure of noise filter A description will be given of an attachment structure of the noise filters 1, 2, and 3 of the embodiment and the first and second modified examples with respect to the other side.

Each of the noise filters 1, 2 and 3 includes the housing in which the filter circuit, the first electric connection structure, the second electric connection structure, the intermediate connection portion WEa1 of the first electric wire WE1, and the intermediate connection portion WEa2 of the second electric wire WE2 are accommodated in the inner accommodation chamber and the end side of each of the first electric wire WE1 and the second electric wire WE2 run parallel to each other in the accommodation chamber is drawn out to the outside of the accommodation chamber. Hereinafter, for convenience of description, the housing of each of the noise filters 1, 2 and 3 is referred to as a housing Ca (FIG. 35 to FIG. 38).

Figure 35:
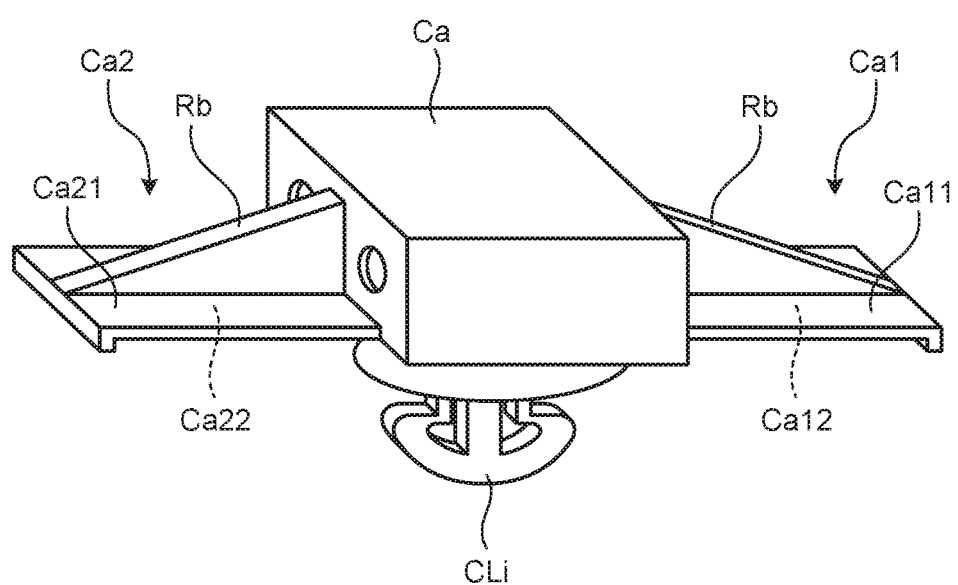
FIG. 35 is a perspective view illustrating an example of an attachment structure of the noise filter.
Figure 36:
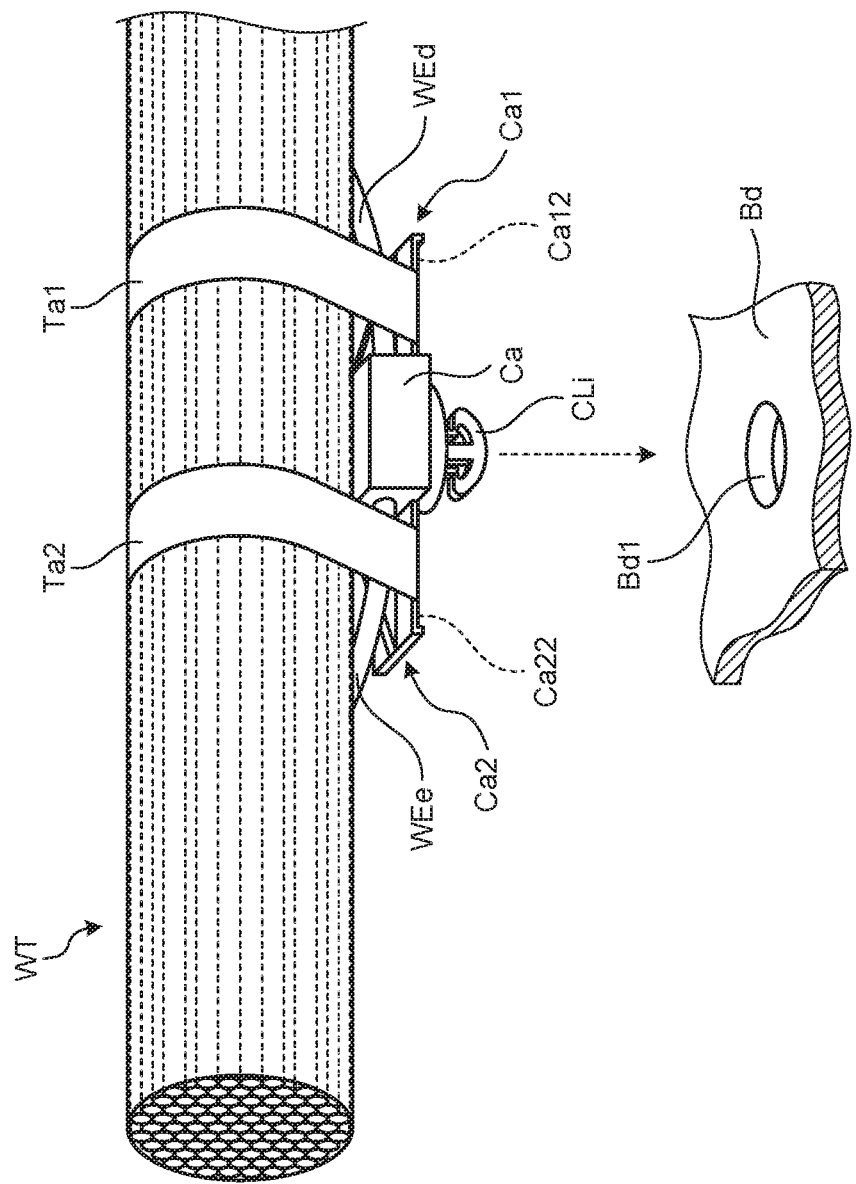
FIG. 36 is a perspective view illustrating an example of an attachment state of the noise filter to a trunk line and a vehicle body.

The housing Ca includes a first protruding holding body Ca1 for holding the housing Ca on the trunk line WT by collectively wrapping a first tape Ta1 with respect to the trunk line WT including the first electric wire WE1 and the second electric wire WE2, and a second protruding holding body Ca2 for holding the housing Ca on the trunk line WT by collectively wrapping a second tape Ta2 with respect to the trunk line WT (FIG. 35 and FIG. 36).

The first protruding holding body Ca1 is a protruding body that protrudes in a first protruding direction corresponding to one direction in the axial direction of the first electric wire WE1 and the second electric wire WE2 outside the accommodation chamber. The first protruding holding body Ca1 has a facing portion Ca11 disposed to face a first branch portion WEd of each of the first electric wire WE1 and the second electric wire WE2 branching from the trunk line WT at one end side of each of the first electric wire WE1 and the second electric wire WE2 drawn out to the outside of the accommodation chamber in the first protruding direction (FIG. 35 and FIG. 36). Furthermore, the first protruding holding body Ca1 has a tape sticking portion Ca12 on which the first tape Ta1 is stuck on the opposite side from each first branch portion WEd (FIG. 35 and FIG. 36). That is, the housing Ca interposes each first branch portion WEd between the first protruding holding body Ca1 and the trunk line WT, and collectively wraps the first protruding holding body Ca1 and the trunk line WT using the first tape Ta1 in a state in which the first protruding holding body Ca1 and the trunk line WT are bundled.

The first protruding holding body Ca1 of this example is formed in a rectangular flat plate shape, one plane of which is used as the facing portion Ca11 and the other plane of which is used as the tape sticking portion Ca12. In addition, to ensure strength, the first protruding holding body Ca1 of this example has a rib Rb suspended from each of an outer wall surface of the housing Ca and the facing portion Ca11 (FIG. 35 and FIG. 36). The rib Rb of this example is interposed between the respective first branch portions WEd.

In addition, the second protruding holding body Ca2 is a protruding body that protrudes in a second protruding direction corresponding to the other direction in the axial direction of the first electric wire WE1 and the second electric wire WE2 outside the accommodation chamber. The second protruding holding body Ca2 has a facing portion Ca21 disposed to face a second branch portion WEe of each of the first electric wire WE1 and the second electric wire WE2 branching from the trunk line WT at the other end side of each of the first electric wire WE1 and the second electric wire WE2 drawn out to the outside of the accommodation chamber in the second protruding direction (FIG. 35 and FIG. 36). Furthermore, the second protruding holding body Ca2 has a tape sticking portion Ca22 on which the second tape Ta2 is stuck on the opposite side from each second branch portion WEe (FIG. 35 and FIG. 36). That is, the housing Ca interposes each second branch portion WEe between the second protruding holding body Ca2 and the trunk line WT, and collectively wraps the second protruding holding body Ca2 and the trunk line WT using the second tape Ta2 in a state in which the second protruding holding body Ca2 and the trunk line WT are bundled.

The second protruding holding body Ca2 of this example is formed in a rectangular flat plate shape, one plane of which is used as the facing portion Ca21 and the other plane of which is used as the tape sticking portion Ca22. In addition, to ensure strength, the second protruding holding body Ca2 of this example has a rib Rb suspended from each of an outer wall surface of the housing Ca and the facing portion Ca21 (FIG. 35 and FIG. 36). The rib Rb of this example is interposed between the respective second branch portions WEe.

The housing Ca has the first protruding holding body Ca1 and the second protruding holding body Ca2, and thus can held on the trunk line WT using the first tape Ta1 and the second tape Ta2 without applying a load to each first branch portion WEd and each second branch portion WEe. That is, the housing Ca can be held on the trunk line WT using the first tape Ta1 and the second tape Ta2 while suppressing transmission of a load to the filter circuit side through each first branch portion WEd and each second branch portion WEe. Therefore, the noise filters 1, 2, and 3 including this housing Ca can attempt improvement in conduction quality. Further, by applying the housing Ca to the noise filters 1, 2, and 3, the wire harness WH can improve the conduction quality similarly to the noise filters 1, 2, and 3.

Here, in the housing Ca, as a holding body for holding with respect to the installation object, a so-called wedge-shaped clip CLi may be provided on an outer wall surface in a protruding state (FIG. 35 and FIG. 36). For example, by inserting the wedge-shaped clip CLi into a through-hole Bd1 of a vehicle body Bd as the installation object and locking the wedge-shaped clip CLi at a peripheral edge portion of the through-hole Bd1, the housing Ca can be held on the vehicle body Bd in a state of being held on the trunk line WT.

Figure 37:
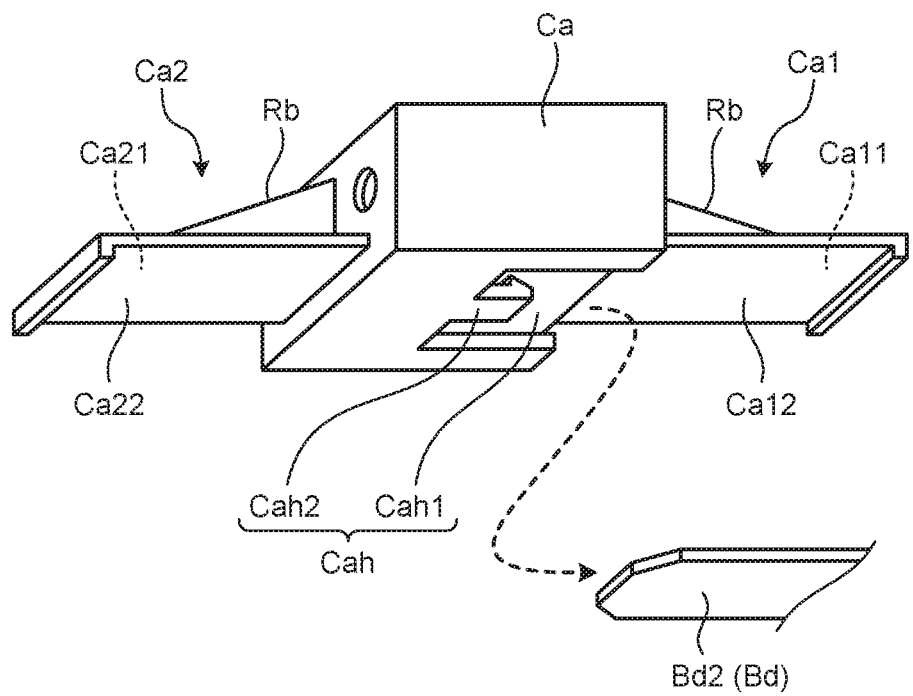
FIG. 37 is a perspective view illustrating another example of the attachment structure of the noise filter to the vehicle body.

In addition, in the housing Ca, as a holding body for holding with respect to the installation object, it is possible to provide a clamping body Cah for clamping a rectangular piece Bd2 of the vehicle body Bd as the installation object (FIG. 37). For example, the clamping body Cah has an outer wall surface Cah1 of the housing Ca, and a cantilevered flexible piece Cah2 disposed to face the outer wall surface Cah1 at an interval. In the clamping body Cah, one plane of the piece Bd2 is disposed to face the outer wall surface Cah1, and the other plane of the piece Bd2 is disposed to face the flexible piece Cah2. The clamping body Cah warps the flexible piece Cah2 in a direction away from the outer wall surface Cah1 by the piece Bd2 inserted between the outer wall surface Cah1 and the flexible piece Cah2, and exerts a reaction force against warping from a claw, etc. on a free end side of the flexible piece Cah2 to the other plane of the piece Bd2. In this way, the clamping body Cah clamps the piece Bd2 between the outer wall surface Cah1 and the flexible piece Cah2. Therefore, the housing Ca can be held on the vehicle body Bd in the state of being held on the trunk line WT.

Figure 38:
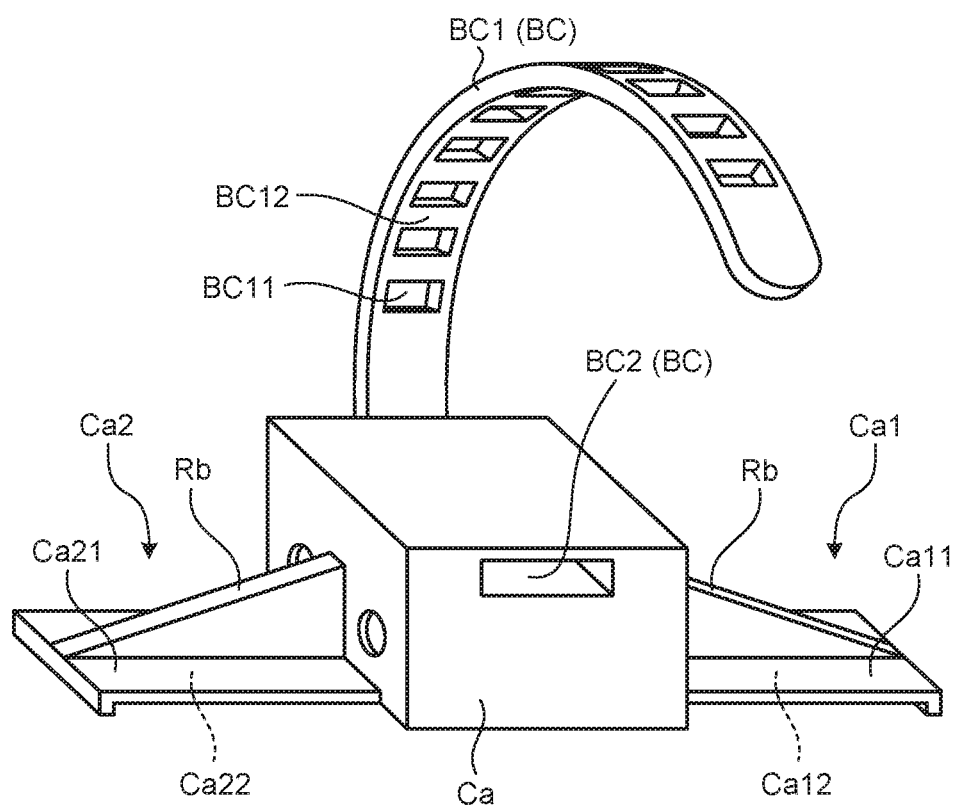
FIG. 38 is a perspective view illustrating another example of the attachment structure of the noise filter to the trunk line.

In addition, the housing Ca may have a band clamp structure BC for holding the housing Ca by being wrapped around the trunk line WT instead of the first protruding holding body Ca1 and the second protruding holding body Ca2 for tape winding (FIG. 38). The band clamp structure BC includes a band portion BC1 wound around the trunk line WT. In the band portion BC1, a plurality of rectangular through-holes BC11 is formed at intervals along a longitudinal direction, and a locking portion BC12 connected to the through-holes BC11 in the longitudinal direction is formed for each of the through-holes BC11. In this band clamp structure BC, the band portion BC1 wound around the trunk line WT is inserted into an insertion portion BC2 on the other side from a distal end, and a projection (not illustrated) provided on the insertion portion BC2 is inserted into the through-hole BC11 of the band portion BC1, thereby locking the projection in the locking portion BC12 of the band portion BC1. In this way, the band clamp structure BC holds the housing Ca on the vehicle body Bd in a state of being held on the trunk line WT.

In the housing Ca, the band clamp structure BC is provided at a position where no load is applied to each first branch portion WEd and each second branch portion WEe at the time of being wound around the trunk line WT. Therefore, the noise filters 1, 2, and 3 including this housing Ca can attempt improvement in conduction quality similarly to the above-described tape winding structure. Further, by applying the housing Ca to the noise filters 1, 2, and 3, the wire harness WH can improve the conduction quality similarly to the noise filters 1, 2, and 3.

In the noise filter according to the embodiment, the filter circuit is interposed between the intermediate connection portion of the first electric wire and the intermediate connection portion of the second electric wire, and the filter circuit is electrically connected to the respective intermediate connection portions. For example, the first electric wire and the second electric wire are bundled in the trunk line of the wire harness. Therefore, this noise filter may not adjust a filter circuit characteristic taking an influence of the branched electric wires (intermediate electric wires) from the trunk line into consideration unlike the past. That is, the noise filter according to the embodiment is not affected by the intermediate electric wires. In addition, the wire harness according to the embodiment includes such a noise filter, and can achieve the effect of obtaining this noise filter.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A noise filter comprising:
    a filter circuit including a noise reduction element that reduces a noise component, a conductive first circuit connection member to which a first connection portion of the noise reduction element is electrically connected, and a conductive second circuit connection member to which a second connection portion of the noise reduction element is electrically connected;
    a first electric connection structure that electrically connects an intermediate connection portion of a core wire of a first electric wire to the first circuit connection member; and a second electric connection structure that electrically connects an intermediate connection portion of a core wire of a second electric wire whose one end is grounded, to the second circuit connection member, wherein the first electric connection structure includes a first electric wire side connection body physically and electrically connected to the intermediate connection portion of the core wire of the first electric wire, and a first circuit side connection body physically and electrically connected to the first electric wire side connection body and the first circuit connection member, and the second electric connection structure includes a second electric wire side connection body physically and electrically connected to the intermediate connection portion of the core wire of the second electric wire, and a second circuit side connection body physically and electrically connected to the second electric wire side connection body and the second circuit connection member.

2. The noise filter according to claim 1, further comprising:

a housing in which the filter circuit, the first electric connection structure, the second electric connection structure, the intermediate connection portion of the core wire of the first electric wire, and the intermediate connection portion of the core wire of the second electric wire are accommodated in an inner accommodation chamber, and an end side of each of the first electric wire and the second electric wire run parallel to each other in the accommodation chamber is drawn out to an outside of the accommodation chamber, wherein the housing has a band clamp structure that holds the housing by winding the housing around a trunk line including the first electric wire and the second electric wire.

3. The noise filter according to claim 1, wherein the first electric connection structure includes a first circuit side connection body provided in the first circuit connection member and indirectly or directly electrically connected to the intermediate connection portion of the core wire of the first electric wire, and the second electric connection structure includes a second circuit side connection body provided in the second circuit connection member and indirectly or directly electrically connected to the intermediate connection portion of the core wire of the second electric wire.

4. The noise filter according to claim 3, further comprising:

a housing in which the filter circuit, the first electric connection structure, the second electric connection structure, the intermediate connection portion of the core wire of the first electric wire, and the intermediate connection portion of the core wire of the second electric wire are accommodated in an inner accommodation chamber, and an end side of each of the first electric wire and the second electric wire run parallel to each other in the accommodation chamber is drawn out to an outside of the accommodation chamber, wherein the housing includes a first protruding holding body that is a protruding body protruding in a first protruding direction corresponding to one direction in the axial direction of the first electric wire and the second electric wire outside the accommodation chamber and is used to hold the housing on a trunk line including the first electric wire and the second electric wire by collectively winding a first tape around the trunk line, and a second protruding holding body that is a protruding body protruding in a second protruding direction corresponding to the other direction in the axial direction of the first electric wire and the second electric wire outside the accommodation chamber and is used to hold the housing on the trunk line by collectively winding a second tape around the trunk line, the first protruding holding body includes a facing portion disposed to face a first branch portion of each of the first electric wire and the second electric wire branching from the trunk line at one end side of each of the first electric wire and the second electric wire drawn out to the outside of the accommodation chamber in the first protruding direction, and a tape sticking portion on which the first tape is stuck on an opposite side from each first branch portion, and the second protruding holding body includes a facing portion disposed to face a second branch portion of each of the first electric wire and the second electric wire branching from the trunk line at the other end side of each of the first electric wire and the second electric wire drawn out to the outside of the accommodation chamber in the second protruding direction, and a tape sticking portion on which the second tape is stuck on an opposite side from each second branch portion.

5. The noise filter according to claim 3, further comprising:

a housing in which the filter circuit, the first electric connection structure, the second electric connection structure, the intermediate connection portion of the core wire of the first electric wire, and the intermediate connection portion of the core wire of the second electric wire are accommodated in an inner accommodation chamber, and an end side of each of the first electric wire and the second electric wire run parallel to each other in the accommodation chamber is drawn out to an outside of the accommodation chamber, wherein the housing has a band clamp structure that holds the housing by winding the housing around a trunk line including the first electric wire and the second electric wire.

6. The noise filter according to claim 1, further comprising:

a housing in which the filter circuit, the first electric connection structure, the second electric connection structure, the intermediate connection portion of the core wire of the first electric wire, and the intermediate connection portion of the core wire of the second electric wire are accommodated in an inner accommodation chamber, and an end side of each of the first electric wire and the second electric wire run parallel to each other in the accommodation chamber is drawn out to an outside of the accommodation chamber, wherein the housing includes a first protruding holding body that is a protruding body protruding in a first protruding direction corresponding to one direction in the axial direction of the first electric wire and the second electric wire outside the accommodation chamber and is used to hold the housing on a trunk line including the first electric wire and the second electric wire by collectively winding a first tape around the trunk line, and a second protruding holding body that is a protruding body protruding in a second protruding direction corresponding to the other direction in the axial direction of the first electric wire and the second electric wire outside the accommodation chamber and is used to hold the housing on the trunk line by collectively winding a second tape around the trunk line, the first protruding holding body includes a facing portion disposed to face a first branch portion of each of the first electric wire and the second electric wire branching from the trunk line at one end side of each of the first electric wire and the second electric wire drawn out to the outside of the accommodation chamber in the first protruding direction, and a tape sticking portion on which the first tape is stuck on an opposite side from each first branch portion, and the second protruding holding body includes a facing portion disposed to face a second branch portion of each of the first electric wire and the second electric wire branching from the trunk line at the other end side of each of the first electric wire and the second electric wire drawn out to the outside of the accommodation chamber in the second protruding direction, and a tape sticking portion on which the second tape is stuck on an opposite side from each second branch portion.

7. A wire harness comprising:

a trunk line including a first electric wire and a second electric wire; and a noise filter that reduces a noise component, wherein the noise filter includes a filter circuit including a noise reduction element that reduces the noise component, a conductive first circuit connection member to which a first connection portion of the noise reduction element is electrically connected, and a conductive second circuit connection member to which a second connection portion of the noise reduction element is electrically connected, a first electric connection structure that electrically connects an intermediate connection portion of a core wire of the first electric wire to the first circuit connection member, and a second electric connection structure that electrically connects an intermediate connection portion of a core wire of the second electric wire whose one end is grounded, to the second circuit connection member, wherein the first electric connection structure includes a first electric wire side connection body physically and electrically connected to the intermediate connection portion of the core wire of the first electric wire, and a first circuit side connection body physically and electrically connected to the first electric wire side connection body and the first circuit connection member, and the second electric connection structure includes a second electric wire side connection body physically and electrically connected to the intermediate connection portion of the core wire of the second electric wire, and a second circuit side connection body physically and electrically connected to the second electric wire side connection body and the second circuit connection member.

* * * * *